(12) United States Patent
Moon et al.

(10) Patent No.: US 11,812,076 B2
(45) Date of Patent: *Nov. 7, 2023

(54) APPARATUS FOR TRANSMITTING BROADCAST SIGNALS, APPARATUS FOR RECEIVING BROADCAST SIGNALS, METHOD FOR TRANSMITTING BROADCAST SIGNALS AND METHOD FOR RECEIVING BROADCAST SIGNALS

(71) Applicant: LG ELECTRONICS INC., Seoul (KR)

(72) Inventors: Sangchul Moon, Seoul (KR); Woosuk Ko, Seoul (KR); Sungryong Hong, Seoul (KR); Jinwoo Kim, Seoul (KR); Jongwoong Shin, Seoul (KR)

(73) Assignee: LG ELECTRONICS INC., Seoul (KR)

(*) Notice: Subject to any disclaimer, the term of this patent is extended or adjusted under 35 U.S.C. 154(b) by 0 days.

This patent is subject to a terminal disclaimer.

(21) Appl. No.: 17/876,249

(22) Filed: Jul. 28, 2022

(65) Prior Publication Data
US 2023/0171445 A1  Jun. 1, 2023

Related U.S. Application Data

(63) Continuation of application No. 17/196,706, filed on Mar. 9, 2021, which is a continuation of application (Continued)

(51) Int. Cl.
*H04L 27/26* (2006.01)
*H04N 21/2362* (2011.01)
(Continued)

(52) U.S. Cl.
CPC .... *H04N 21/2362* (2013.01); *H03M 13/1148* (2013.01); *H03M 13/2792* (2013.01);
(Continued)

(58) Field of Classification Search
None
See application file for complete search history.

(56) References Cited

U.S. PATENT DOCUMENTS 8,837,618 B2   9/2014  Petrov
9,484,957 B2  11/2016  Jeong et al.
(Continued)

FOREIGN PATENT DOCUMENTS

CN   102783050 A  11/2012
CN   103181085 A   6/2013
(Continued)

OTHER PUBLICATIONS

U.S. Appl. No. 17/196,706, filed Mar. 9, 2021.
(Continued)

*Primary Examiner* — Kodzovi Acolatse
(74) *Attorney, Agent, or Firm* — Bryan Cave Leighton Paisner LLP

(57) ABSTRACT

The present invention provides an apparatus of transmitting broadcast signals, the apparatus including, an encoder for encoding service data, a frame builder for building at least one signal frame by mapping the encoded service data, a modulator for modulating data in the built at least one signal frame by an Orthogonal Frequency Division Multiplexing, OFDM, scheme and a transmitter for transmitting the broadcast signals having the modulated data.

3 Claims, 40 Drawing Sheets

Related U.S. Application Data

No. 16/526,506, filed on Jul. 30, 2019, now Pat. No. 11,019,377, which is a continuation of application No. 15/842,278, filed on Dec. 14, 2017, now Pat. No. 10,555,013, which is a continuation of application No. 14/904,892, filed as application No. PCT/KR2014/007116 on Aug. 1, 2014, now Pat. No. 9,930,383.

(60) Provisional application No. 61/883,957, filed on Sep. 27, 2013, provisional application No. 61/882,013, filed on Sep. 25, 2013, provisional application No. 61/881,418, filed on Sep. 23, 2013, provisional application No. 61/876,713, filed on Sep. 11, 2013, provisional application No. 61/861,384, filed on Aug. 1, 2013.

(51) Int. Cl.

| | | |
|---|---|---|
| *H04L 1/00* | (2006.01) | |
| *H04N 21/236* | (2011.01) | |
| *H04N 21/2381* | (2011.01) | |
| *H04N 21/2383* | (2011.01) | |
| *H04N 21/414* | (2011.01) | |
| *H04N 21/434* | (2011.01) | |
| *H04N 21/438* | (2011.01) | |
| *H04N 21/61* | (2011.01) | |
| *H03M 13/11* | (2006.01) | |
| *H03M 13/27* | (2006.01) | |
| *H03M 13/00* | (2006.01) | |
| *H04B 7/0456* | (2017.01) | |
| *H04L 5/00* | (2006.01) | |

(52) U.S. Cl.
CPC ........ *H03M 13/616* (2013.01); *H04B 7/0456* (2013.01); *H04L 1/0041* (2013.01); *H04L 1/0045* (2013.01); *H04L 1/0057* (2013.01); *H04L 1/0058* (2013.01); *H04L 1/0061* (2013.01); *H04L 1/0071* (2013.01); *H04L 5/0007* (2013.01); *H04L 27/2601* (2013.01); *H04L 27/2627* (2013.01); *H04L 27/2649* (2013.01); *H04N 21/2381* (2013.01); *H04N 21/2383* (2013.01); *H04N 21/23614* (2013.01); *H04N 21/41407* (2013.01); *H04N 21/4345* (2013.01); *H04N 21/4381* (2013.01); *H04N 21/4382* (2013.01); *H04N 21/6131* (2013.01)

(56) References Cited

U.S. PATENT DOCUMENTS

| | | | |
|---|---|---|---|
| 9,602,137 | B2 | 3/2017 | Kim et al. |
| 9,634,692 | B2 | 4/2017 | Kim et al. |
| 9,648,361 | B2 | 5/2017 | Moon et al. |
| 9,692,453 | B2 | 6/2017 | Jeong et al. |
| 9,929,785 | B2 | 3/2018 | Moon et al. |
| 9,930,383 | B2 | 3/2018 | Moon et al. |
| 2006/0274844 | A1* | 12/2006 | Walton ................ H04L 27/2647 375/260 |
| 2007/0011570 | A1 | 1/2007 | Jeong et al. |
| 2008/0256425 | A1* | 10/2008 | Oh ..................... H03M 13/1185 714/801 |
| 2010/0246719 | A1 | 9/2010 | Ko et al. |
| 2010/0290561 | A1* | 11/2010 | Ko ........................ H04L 1/0042 375/295 |
| 2010/0325512 | A1 | 12/2010 | Yokokawa et al. |
| 2012/0051460 | A1 | 3/2012 | Jeong et al. |
| 2012/0327879 | A1* | 12/2012 | Stadelmeier ......... H04B 7/0689 370/329 |
| 2013/0064314 | A1 | 3/2013 | Ko et al. |
| 2013/0216001 | A1 | 8/2013 | Petrov |
| 2014/0047295 | A1* | 2/2014 | Shinohara .......... H03M 13/1148 714/752 |
| 2014/0372826 | A1 | 12/2014 | Myung et al. |
| 2015/0039973 | A1 | 2/2015 | Jeong et al. |
| 2015/0095744 | A1 | 4/2015 | Jeong et al. |
| 2015/0237175 | A1 | 8/2015 | Michael |
| 2016/0156370 | A1 | 6/2016 | Ikegaya et al. |
| 2016/0164628 | A1 | 6/2016 | Moon et al. |
| 2016/0164630 | A1 | 6/2016 | Moon et al. |
| 2016/0164634 | A1 | 6/2016 | Moon et al. |
| 2016/0204967 | A1 | 7/2016 | Choi et al. |
| 2016/0261288 | A1 | 9/2016 | Shinohara et al. |
| 2017/0155473 | A1 | 6/2017 | Jeong et al. |

FOREIGN PATENT DOCUMENTS

| | | | |
|---|---|---|---|
| EP | 2541920 | A2 | 1/2013 |
| EP | 2560310 | A1 | 2/2013 |
| KR | 10-2007-0058480 | A | 6/2007 |
| KR | 2011/096721 | A2 | 8/2011 |
| KR | 10-2011-0114204 | A | 10/2011 |
| KR | 10-2013-0044258 | A | 5/2013 |
| WO | 2004/006443 | A1 | 1/2004 |
| WO | 2012/067362 | A2 | 5/2012 |
| WO | 2014/175606 | A1 | 10/2014 |

OTHER PUBLICATIONS

U.S. Appl. No. 16/526,506, filed Jul. 30, 2019.
U.S. Appl. No. 16/525,107, filed Jul. 29, 2019.
U.S. Appl. No. 16/523,166, filed Jul. 26, 2019.
U.S. Appl. No. 16/522,284, filed Jul. 25, 2019.
U.S. Appl. No. 16/521,274, filed Jan. 24, 2019.
U.S. Appl. No. 15/842,278, filed Dec. 14, 2017.
U.S. Appl. No. 14/904,892, filed Jan. 13, 2016.
Jokela, Tero; "Deliverable D2.3 Report on Advanced Component Techniques DVB-NGH"; Nov. 13, 2012.

* cited by examiner

| Content | Bits |
|---|---|
| PHY_PROFILE | 3 |
| FFT_SIZE | 2 |
| GI_FRACTION | 3 |
| EAC_FLAG | 1 |
| PILOT_MODE | 1 |
| PAPR_FLAG | 1 |
| FRU_CONFIGURE | 3 |
| RESERVED | 7 |

FIG. 13

| Content | Bits |
|---|---|
| PREAMBLE_DATA<br>NUM_FRAME_FRU<br>PAYLOAD_TYPE<br>NUM_FSS<br>SYSTEM_VERSION | 20<br>2<br>3<br>2<br>8 |
| CELL_ID<br>NETWORK_ID<br>SYSTEM_ID | 16<br>16<br>16 |
| for i = 0:3<br>    FRU_PHY_PROFILE<br>    FRU_FRAME_LENGTH<br>    FRU_GI_FRACTION<br>    RESERVED<br>end | <br>3<br>2<br>3<br>4 |
| PLS2_FEC_TYPE<br>PLS2_MOD<br>PLS2_SIZE_CELL<br>PLS2_STAT_SIZE_BIT<br>PLS2_SYN_SIZE_BIT<br>PLS2_REP_FLAG<br>PLS2_REP_SIZE_CELL<br>PLS2_NEXT_FEC_TYPE<br>PLS2_NEXT_MODE<br>PLS2_NEXT_REP_FLAG<br>PLS2_NEXT_REP_SIZE_CELL<br>PLS2_NEXT_REP_STAT_SIZE_BIT<br>PLS2_NEXT_REP_DYN_SIZE_BIT<br>PLS2_AP_MODE<br>PLS2_AP_SIZE_CELL<br>PLS2_NEXT_AP_MODE<br>PLS2_NEXT_AP_SIZE_CELL | 2<br>3<br>15<br>14<br>14<br>1<br>15<br>2<br>3<br>1<br>15<br>14<br>14<br>2<br>15<br>2<br>15 |
| RESERVED<br>CRC 32 | 32<br>32 |

FIG. 14

| Content | Bits |
|---|---|
| FIC_FLAG | 1 |
| AUX_FLAG | 1 |
| NUM_DP | 6 |
| for i = 1: NUM_DP | |
|     DP_ID | 6 |
|     DP_TYPE | 3 |
|     DP_GROUP_ID | 8 |
|     BASE_DP_ID | 6 |
|     DP_FEC_TYPE | 2 |
|     DP_COD | 4 |
|     DP_MOD | 4 |
|     DP_SSD_FLAG | 1 |
|     if PHY_PROFILE = '010' | |
|         DP_MIMO | 3 |
|     end | |
|     DP_TI_TYPE | 1 |
|     DP_TI_LENGTH | 2 |
|     DP_TI_BYPASS | 1 |
|     DP_FRAME_INTERVAL | 2 |
|     DP_FIRST_FRAME_IDX | 5 |
|     DP_NUM_BLOCK_MAX | 10 |
|     DP_PAYLOAD_TYPE | 2 |
|     DP_INBAND_MODE | 2 |
|     DP_PROTOCOL_TYPE | 2 |
|     DP_CRC_MODE | 2 |
|     if DP_PAYLOAD_TYPE == TS('00') | |
|         DNP_MODE | 2 |
|         ISSY_MODE | 2 |
|         HC_MODE_TS | 2 |
|         if HC_MODE_TS == '01' or '10' | |
|             PID | 13 |
|         end | |
|     if DP_PAYLOAD_TYPE == IP('01') | |
|         HC_MODE_IP | 2 |
|     end | |
|     RESERVED | 8 |
| end | |
| if FIC_FLAG == 1 | |
|     FIC_VERSION | 8 |
|     FIC_LENGTH_BYTE | 13 |
|     RESERVED | 8 |
| end | |
| if AUX_FLAG == 1 | |
|     NUM_AUX | 4 |
|     AUX_CONFIG_RFU | 8 |
|     for -1: NUM_AUX | |
|         AUX_STREAM_TYPE | 4 |
|         AUX_PRIVATE_CONF | 28 |
|     end | |
| end | |

| Content | | Bit |
|---|---|---|
| FRAME_INDEX | | 5 |
| PLS_CHANGE_COUNTER | | 4 |
| FIC_CHANGE_COUNTER | | 4 |
| RESERVED | | 16 |
| for i = 1: NUM_DP | | |
| | DP_ID | 6 |
| | DP_START | 15 (or13) |
| | DP_NUM_BLOCK | 10 |
| end | RESERVED | 8 |
| EAC_FLAG | | 1 |
| EAS_WAKE_UP_VERSION_NUM | | 8 |
| if EAC_FLAG == 1 | | |
| | EAC_LENGTH_BYTE | 12 |
| else | | |
| | EAC_COUNTER | 12 |
| end | | |
| for i=1:NUM_AUX | | |
| | AUX_PRIVATE_DYN | 48 |
| end | | |
| CRC 32 | | 32 |

Table B.5 Code rate 9/15, N_ldpc=16200

[Figure 44]

Table B.7 Code rate 11/15, N_ldpc=16200

[Figure 47]
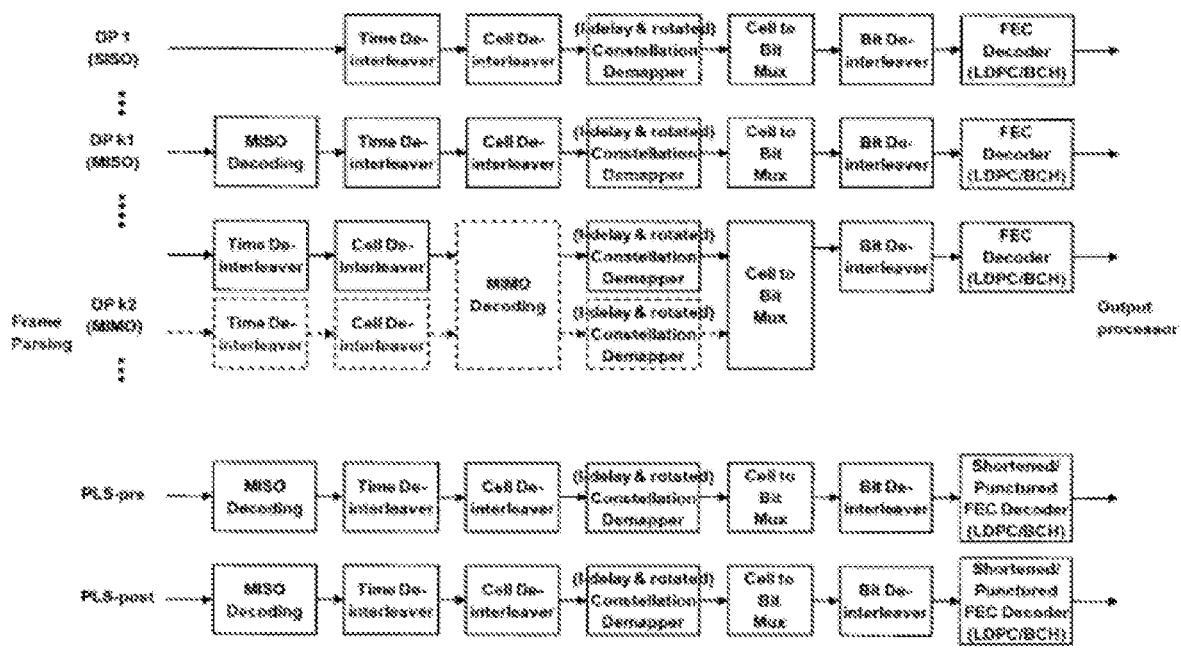
[Figure 48]
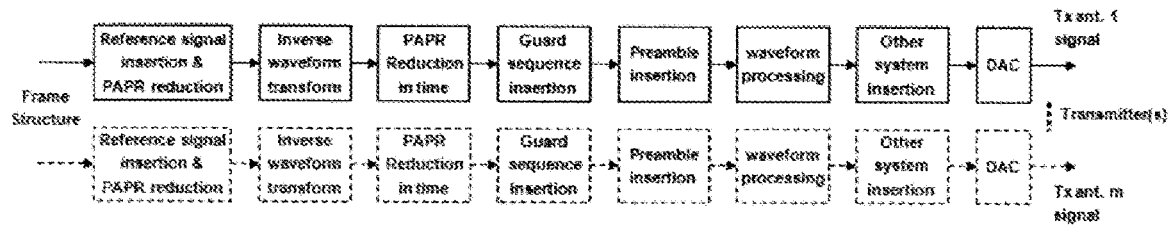

APPARATUS FOR TRANSMITTING BROADCAST SIGNALS, APPARATUS FOR RECEIVING BROADCAST SIGNALS, METHOD FOR TRANSMITTING BROADCAST SIGNALS AND METHOD FOR RECEIVING BROADCAST SIGNALS

This is a Continuation Application of U.S. patent application Ser. No. 17/196,706, filed Mar. 9, 2021, which is a Continuation Application of U.S. patent application Ser. No. 16/526,506, filed Jul. 30, 2019, which us a Continuation Application of U.S. patent application Ser. No. 16/525,107, filed Jul. 29, 2019, which is a Continuation Application of U.S. patent application Ser. No. 16/523,166, filed Jul. 26, 219, now issued as U.S. Pat. No. 10,848,799, which is a Continuation Application of U.S. patent application Ser. No. 16/522,284, Jul. 25, 2019, which is a Continuation Application of U.S. patent application Ser. No. 16/521,274, filed Jul. 24, 2019, now issued as U.S. Pat. No. 10,841,631, which is a Continuation Application of U.S. patent application Ser. No. 15/842,278, filed on Dec. 14, 2017, now issued as U.S. Pat. No. 10,555,013, which is a continuation of U.S. patent application Ser. No. 14/904,892, filed on Jan. 13, 2016, now issued as U.S. Pat. No. 9,930,383, which is a National Stage entry of International Application No. PCT/KR2014/007116, filed on Aug. 1, 2014, and claims priority to U.S. Provisional Application No. 61/861,384, filed on Aug. 1, 2013, U.S. Provisional Application No. 61/876,713, filed on Sep. 11, 2013, U.S. Provisional Application No. 61/881,418, filed on Sep. 23, 2013, U.S. Provisional Application Nos. 61/882,013, filed on Sep. 25, 2013, and U.S. Provisional Application No. 61/883,957, filed on Sep. 27, 2013, all of which are incorporated by reference in their entirety herein.

TECHNICAL FIELD

The present invention relates to an apparatus for transmitting broadcast signals, an apparatus for receiving broadcast signals and methods for transmitting and receiving broadcast signals.

BACKGROUND ART

As analog broadcast signal transmission comes to an end, various technologies for transmitting/receiving digital broadcast signals are being developed. A digital broadcast signal may include a larger amount of video/audio data than an analog broadcast signal and further include various types of additional data in addition to the video/audio data.

That is, a digital broadcast system can provide HD (high definition) images, multi-channel audio and various additional services. However, data transmission efficiency for transmission of large amounts of data, robustness of transmission/reception networks and network flexibility in consideration of mobile reception equipment need to be improved for digital broadcast.

DISCLOSURE

Technical Problem

*4An object of the present invention is to provide an apparatus and method for transmitting broadcast signals to multiplex data of a broadcast transmission/reception system providing two or more different broadcast services in a time domain and transmit the multiplexed data through the same RF signal bandwidth and an apparatus and method for receiving broadcast signals corresponding thereto.

Another object of the present invention is to provide an apparatus for transmitting broadcast signals, an apparatus for receiving broadcast signals and methods for transmitting and receiving broadcast signals to classify data corresponding to services by components, transmit data corresponding to each component as a data pipe, receive and process the data Still another object of the present invention is to provide an apparatus for transmitting broadcast signals, an apparatus for receiving broadcast signals and methods for transmitting and receiving broadcast signals to signal signaling information necessary to provide broadcast signals.

Technical Solution

To achieve the object and other advantages and in accordance with the purpose of the invention, as embodied and broadly described herein, the present invention provides an apparatus of transmitting broadcast signals, the apparatus including, an encoder for encoding service data, a frame builder for building at least one signal frame by mapping the encoded service data, a modulator for modulating data in the built at least one signal frame by an Orthogonal Frequency Division Multiplexing, OFDM, scheme and a transmitter for transmitting the broadcast signals having the modulated data.

Advantageous Effects

The present invention can process data according to service characteristics to control QoS (Quality of Services) for each service or service component, thereby providing various broadcast services.

The present invention can achieve transmission flexibility by transmitting various broadcast services through the same RF signal bandwidth.

The present invention can improve data transmission efficiency and increase robustness of transmission/reception of broadcast signals using a MIMO system.

According to the present invention, it is possible to provide broadcast signal transmission and reception methods and apparatus capable of receiving digital broadcast signals without error even with mobile reception equipment or in an indoor environment.

DESCRIPTION OF DRAWINGS

The accompanying drawings, which are included to provide a further understanding of the invention and are incorporated in and constitute a part of this application, illustrate embodiment(s) of the invention and together with the description serve to explain the principle of the invention. In the drawings:

FIG. 13 illustrates PLS1 data according to an embodiment of the present invention.

FIG. 14 illustrates PLS2 data according to an embodiment of the present invention.

FIG. 29 is a table showing addresses of parity check matrix according to an embodiment of the present invention.

FIG. 30 is a table showing addresses of parity check matrix according to another embodiment of the present invention.

FIG. 38 illustrates interlaved XFECBLOCKs from each interleaving array according to an embodiment of the present invention.

FIG. 40 is a table showing addresses of parity check matrix according to another embodiment of the present invention.

FIG. 41 is a table showing addresses of parity check matrix according to another embodiment of the present invention.

FIG. 42 is a table showing addresses of parity check matrix according to another embodiment of the present invention.

FIG. 43 is a table showing addresses of parity check matrix according to another embodiment of the present invention.

FIG. 44 is a table showing addresses of parity check matrix according to another embodiment of the present invention.

FIG. 45 is a table showing addresses of parity check matrix according to another embodiment of the present invention.

FIG. 46 is a table showing addresses of parity check matrix according to another embodiment of the present invention.

FIG. 47 is a block diagram of the demapping and decoding of the receiver according to another embodiments of the present invention.

FIG. 48 is a waveform generation block according to another embodiments of the present invention.

BEST MODE

Figure 1:
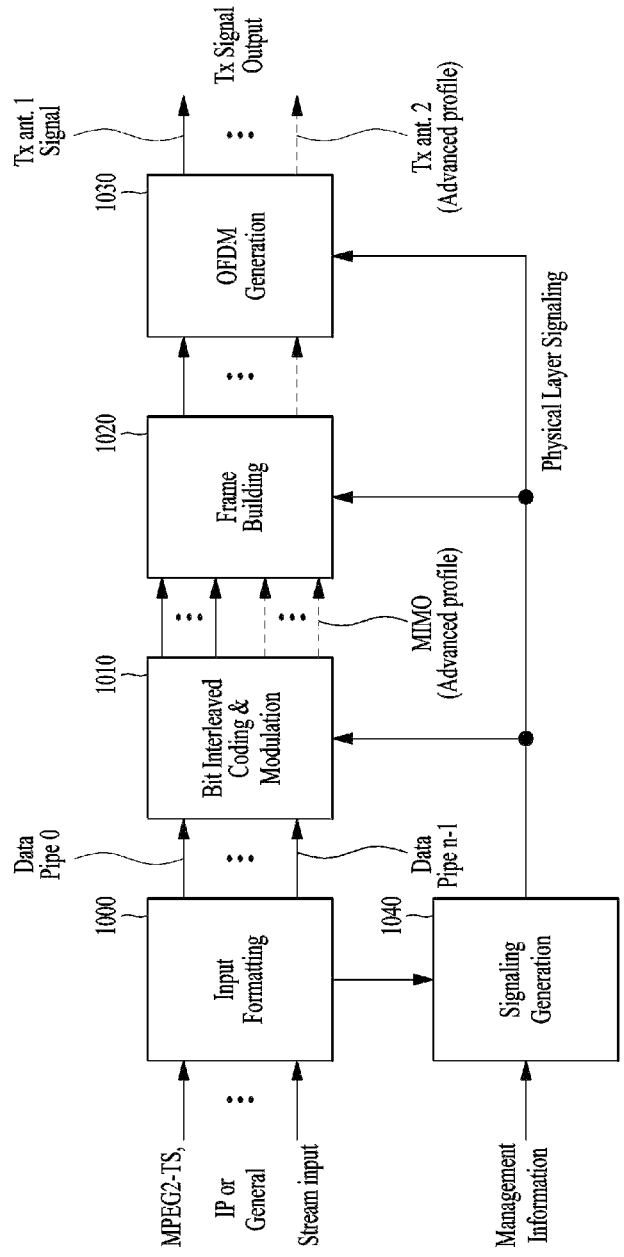
FIG. 1 illustrates a structure of an apparatus for transmitting broadcast signals for future broadcast services according to an embodiment of the present invention.

Reference will now be made in detail to the preferred embodiments of the present invention, examples of which are illustrated in the accompanying drawings. The detailed description, which will be given below with reference to the accompanying drawings, is intended to explain exemplary embodiments of the present invention, rather than to show the only embodiments that can be implemented according to the present invention. The following detailed description includes specific details in order to provide a thorough understanding of the present invention. However, it will be apparent to those skilled in the art that the present invention may be practiced without such specific details.

Although most terms used in the present invention have been selected from general ones widely used in the art, some terms have been arbitrarily selected by the applicant and their meanings are explained in detail in the following description as needed. Thus, the present invention should be understood based upon the intended meanings of the terms rather than their simple names or meanings.

The present invention provides apparatuses and methods for transmitting and receiving broadcast signals for future broadcast services. Future broadcast services according to an embodiment of the present invention include a terrestrial broadcast service, a mobile broadcast service, a UHDTV service, etc. The present invention may process broadcast signals for the future broadcast services through non-MIMO (Multiple Input Multiple Output) or MIMO according to one embodiment. A non-MIMO scheme according to an embodiment of the present invention may include a MISO (Multiple Input Single Output) scheme, a SISO (Single Input Single Output) scheme, etc.

While MISO or MIMO uses two antennas in the following for convenience of description, the present invention is applicable to systems using two or more antennas.

The present invention may defines three physical layer (PL) profiles (base, handheld and advanced profiles) each optimized to minimize receiver complexity while attaining the performance required for a particular use case. The physical layer (PHY) profiles are subsets of all configurations that a corresponding receiver should implement.

The three PHY profiles share most of the functional blocks but differ slightly in specific blocks and/or parameters. Additional PHY profiles can be defined in the future. For the system evolution, future profiles can also be multiplexed with the existing profiles in a single RF channel through a future extension frame (FEF). The details of each PHY profile are described below.

1. Base Profile

The base profile represents a main use case for fixed receiving devices that are usually connected to a roof-top antenna. The base profile also includes portable devices that could be transported to a place but belong to a relatively stationary reception category. Use of the base profile could be extended to handheld devices or even vehicular by some improved implementations, but those use cases are not expected for the base profile receiver operation.

Target SNR range of reception is from approximately 10 to 20 dB, which includes the 15 dB SNR reception capability of the existing broadcast system (e.g. ATSC A/53). The receiver complexity and power consumption is not as critical as in the battery-operated handheld devices, which will use the handheld profile. Key system parameters for the base profile are listed in below table 1.

TABLE 1

| | |
|---|---|
| LDPC codeword length | 16K, 64K faits |
| Constellation size | 4~10 bpcu (bits per channel use) |
| Time de-interleaving memory size | ≤$2^{19}$ data cells |
| Pilot patterns | Pilot pattern for fixed reception |
| FFT size | 16K, 32K points |

2. Handheld Profile

The handheld profile is designed for use in handheld and vehicular devices that operate with battery power. The devices can be moving with pedestrian or vehicle speed. The power consumption as well as the receiver complexity is very important for the implementation of the devices of the handheld profile. The target SNR range of the handheld profile is approximately 0 to 10 dB, but can be configured to reach below 0 dB when intended for deeper indoor reception.

In addition to low SNR capability, resilience to the Doppler Effect caused by receiver mobility is the most important performance attribute of the handheld profile. Key system parameters for the handheld profile are listed in the below table 2.

TABLE 2

| | |
|---|---|
| LDPC codeword length | 16K bits |
| Constellation size | 2~8 bpcu |
| Time de-interleaving memory size | ≤$2^{18}$ data cells |

TABLE 2-continued

| | |
|---|---|
| Pilot patterns | Pilot patterns for mobile and indoor reception |
| FFT size | 8K, 16K points |

3. Advanced Profile

The advanced profile provides highest channel capacity at the cost of more implementation complexity. This profile requires using MIMO transmission and reception, and UHDTV service is a target use case for which this profile is specifically designed. The increased capacity can also be used to allow an increased number of services in a given bandwidth, e.g., multiple SDTV or HDTV services.

The target SNR range of the advanced profile is approximately 20 to 30 dB. MIMO transmission may initially use existing elliptically-polarized transmission equipment, with extension to full-power cross-polarized transmission in the future. Key system parameters for the advanced profile are listed in below table 3.

TABLE 3

| | |
|---|---|
| LDPC codeword length | 16K, 64K bits |
| Constellation size | 8~12 bpcu |
| Time de-interleaving memory size | ≤$2^{19}$ data cells |
| Pilot patterns | Pilot pattern for fixed reception |
| FFT size | 16K, 32K points |

In this case, the base profile can be used as a profile for both the terrestrial broadcast service and the mobile broadcast service. That is, the base profile can be used to define a concept of a profile which includes the mobile profile. Also, the advanced profile can be divided advanced profile for a base profile with MIMO and advanced profile for a handheld profile with MIMO. Moreover, the three profiles can be changed according to intention of the designer.

The following terms and definitions may apply to the present invention. The following terms and definitions can be changed according to design.

auxiliary stream: sequence of cells carrying data of as yet undefined modulation and coding, which may be used for future extensions or as required by broadcasters or network operators base data pipe: data pipe that carries service signaling data baseband frame (or BBFRAME): set of Kbch bits which form the input to one FEC encoding process (BCH and LDPC encoding)

cell: modulation value that is carried by one carrier of the OFDM transmission coded block: LDPC-encoded block of PLS1 data or one of the LDPC-encoded blocks of PLS2 data data pipe: logical channel in the physical layer that carries service data or related metadata, which may carry one or multiple service(s) or service component(s).

data pipe unit: a basic unit for allocating data cells to a DP in a frame.

data symbol: OFDM symbol in a frame which is not a preamble symbol (the frame signaling symbol and frame edge symbol is included in the data symbol)

DP_ID: this 8 bit field identifies uniquely a DP within the system identified by the SYSTEM_ID dummy cell: cell carrying a pseudo random value used to fill the remaining capacity not used for PLS signaling, DPs or auxiliary streams emergency alert channel: part of a frame that carries EAS information data frame: physical layer time slot that starts with a preamble and ends with a frame edge symbol frame repetition unit: a set of frames belonging to same or different physical layer profile including a FEF, which is repeated eight times in a super-frame fast information channel: a logical channel in a frame that carries the mapping information between a service and the corresponding base DP FECBLOCK: set of LDPC-encoded bits of a DP data FFT size: nominal FFT size used for a particular mode, equal to the active symbol period Ts expressed in cycles of the elementary period T frame signaling symbol: OFDM symbol with higher pilot density used at the start of a frame in certain combinations of FFT size, guard interval and scattered pilot pattern, which carries a part of the PLS data frame edge symbol: OFDM symbol with higher pilot density used at the end of a frame in certain combinations of FFT size, guard interval and scattered pilot pattern frame-group: the set of all the frames having the same PHY profile type in a super-frame.

future extension frame: physical layer time slot within the super-frame that could be used for future extension, which starts with a preamble Futurecast UTB system: proposed physical layer broadcasting system, of which the input is one or more MPEG2-TS or IP or general stream(s) and of which the output is an RF signal input stream: A stream of data for an ensemble of services delivered to the end users by the system.

normal data symbol: data symbol excluding the frame signaling symbol and the frame edge symbol PHY profile: subset of all configurations that a corresponding receiver should implement PLS: physical layer signaling data consisting of PLS1 and PLS2

PLS1: a first set of PLS data carried in the FSS symbols having a fixed size, coding and modulation, which carries basic information about the system as well as the parameters needed to decode the PLS2

NOTE: PLS1 data remains constant for the duration of a frame-group.

PLS2: a second set of PLS data transmitted in the FSS symbol, which carries more detailed PLS data about the system and the DPs PLS2 dynamic data: PLS2 data that may dynamically change frame-by-frame PLS2 static data: PLS2 data that remains static for the duration of a frame-group preamble signaling data: signaling data carried by the preamble symbol and used to identify the basic mode of the system preamble symbol: fixed-length pilot symbol that carries basic PLS data and is located in the beginning of a frame NOTE: The preamble symbol is mainly used for fast initial band scan to detect the system signal, its timing, frequency offset, and FFT size.

reserved for future use: not defined by the present document but may be defined in future super frame: set of eight frame repetition units time interleaving block (TI block): set of cells within which time interleaving is carried out, corresponding to one use of the time interleaver memory TI group: unit over which dynamic capacity allocation for a particular DP is carried out, made up of an integer, dynamically varying number of XFECBLOCKs NOTE: The TI group may be mapped directly to one frame or may be mapped to multiple frames. It may contain one or more TI blocks.

Type 1 DP: DP of a frame where all DPs are mapped into the frame in TDM fashion

Type 2 DP: DP of a frame where all DPs are mapped into the frame in FDM fashion

XFECBLOCK: set of Ncells cells carrying all the bits of one LDPC FECBLOCK

FIG. 1 illustrates a structure of an apparatus for transmitting broadcast signals for future broadcast services according to an embodiment of the present invention.

The apparatus for transmitting broadcast signals for future broadcast services according to an embodiment of the present invention can include an input formatting block 1000, a BICM (Bit interleaved coding & modulation) block 1010, a frame structure block 1020, an OFDM (Orthogonal Frequency Division Multiplexing) generation block 1030 and a signaling generation block 1040. A description will be given of the operation of each module of the apparatus for transmitting broadcast signals.

IP stream/packets and MPEG2-TS are the main input formats, other stream types are handled as General Streams. In addition to these data inputs, Management Information is input to control the scheduling and allocation of the corresponding bandwidth for each input stream. One or multiple TS stream(s), IP stream(s) and/or General Stream(s) inputs are simultaneously allowed.

The input formatting block 1000 can demultiplex each input stream into one or multiple data pipe(s), to each of which an independent coding and modulation is applied. The data pipe (DP) is the basic unit for robustness control, thereby affecting quality-of-service (QoS). One or multiple service(s) or service component(s) can be carried by a single DP. Details of operations of the input formatting block 1000 will be described later.

The data pipe is a logical channel in the physical layer that carries service data or related metadata, which may carry one or multiple service(s) or service component(s).

Also, the data pipe unit: a basic unit for allocating data cells to a DP in a frame.

In the BICM block 1010, parity data is added for error correction and the encoded bit streams are mapped to complex-value constellation symbols. The symbols are interleaved across a specific interleaving depth that is used for the corresponding DP. For the advanced profile, MIMO encoding is performed in the BICM block 1010 and the additional data path is added at the output for MIMO transmission. Details of operations of the BICM block 1010 will be described later.

The Frame Building block 1020 can map the data cells of the input DPs into the OFDM symbols within a frame. After mapping, the frequency interleaving is used for frequency-domain diversity, especially to combat frequency-selective fading channels. Details of operations of the Frame Building block 1020 will be described later.

After inserting a preamble at the beginning of each frame, the OFDM Generation block 1030 can apply conventional OFDM modulation having a cyclic prefix as guard interval. For antenna space diversity, a distributed MISO scheme is applied across the transmitters. In addition, a Peak-to-Average Power Reduction (PAPR) scheme is performed in the time domain. For flexible network planning, this proposal provides a set of various FFT sizes, guard interval lengths and corresponding pilot patterns. Details of operations of the OFDM Generation block 1030 will be described later.

The Signaling Generation block 1040 can create physical layer signaling information used for the operation of each functional block. This signaling information is also transmitted so that the services of interest are properly recovered at the receiver side. Details of operations of the Signaling Generation block 1040 will be described later.

Figure 2:
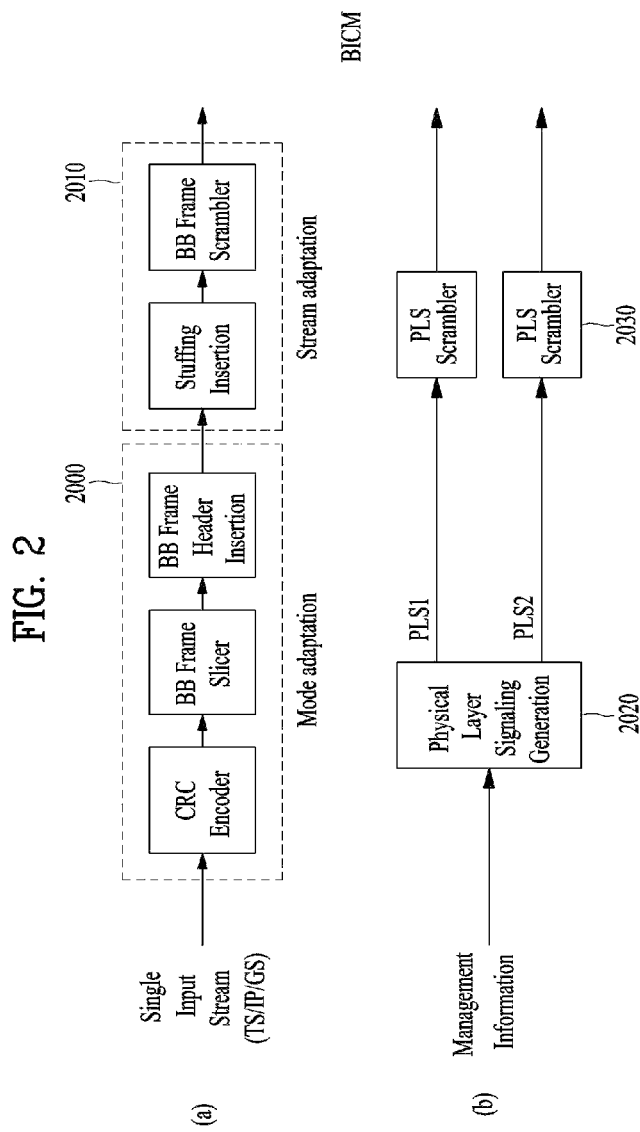
FIG. 2 illustrates an input formatting block according to one embodiment of the present invention.
Figure 3:
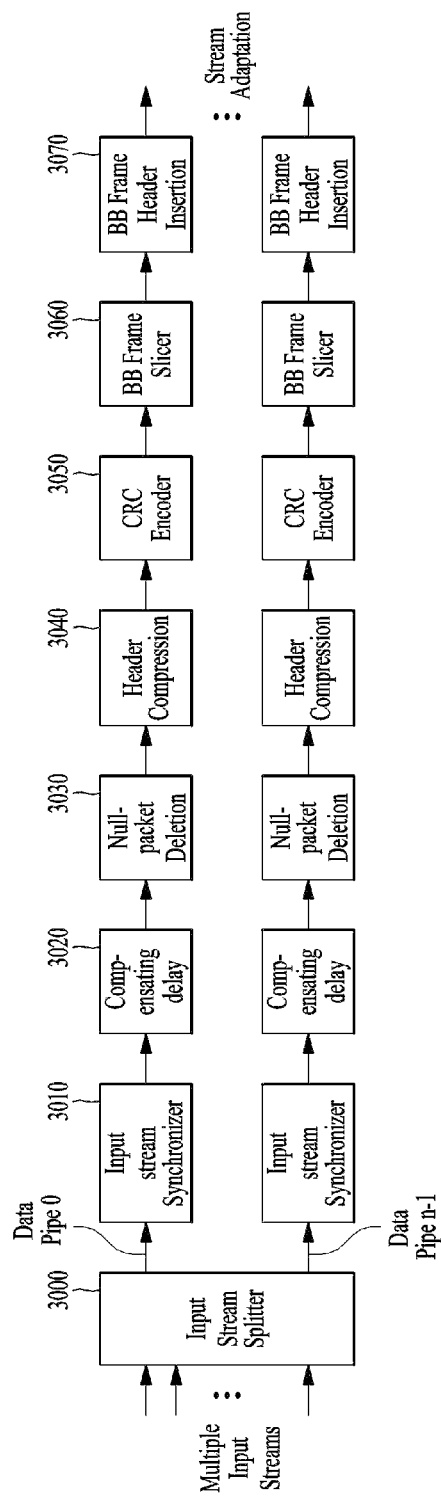
FIG. 3 illustrates an input formatting block according to another embodiment of the present invention.
Figure 4:
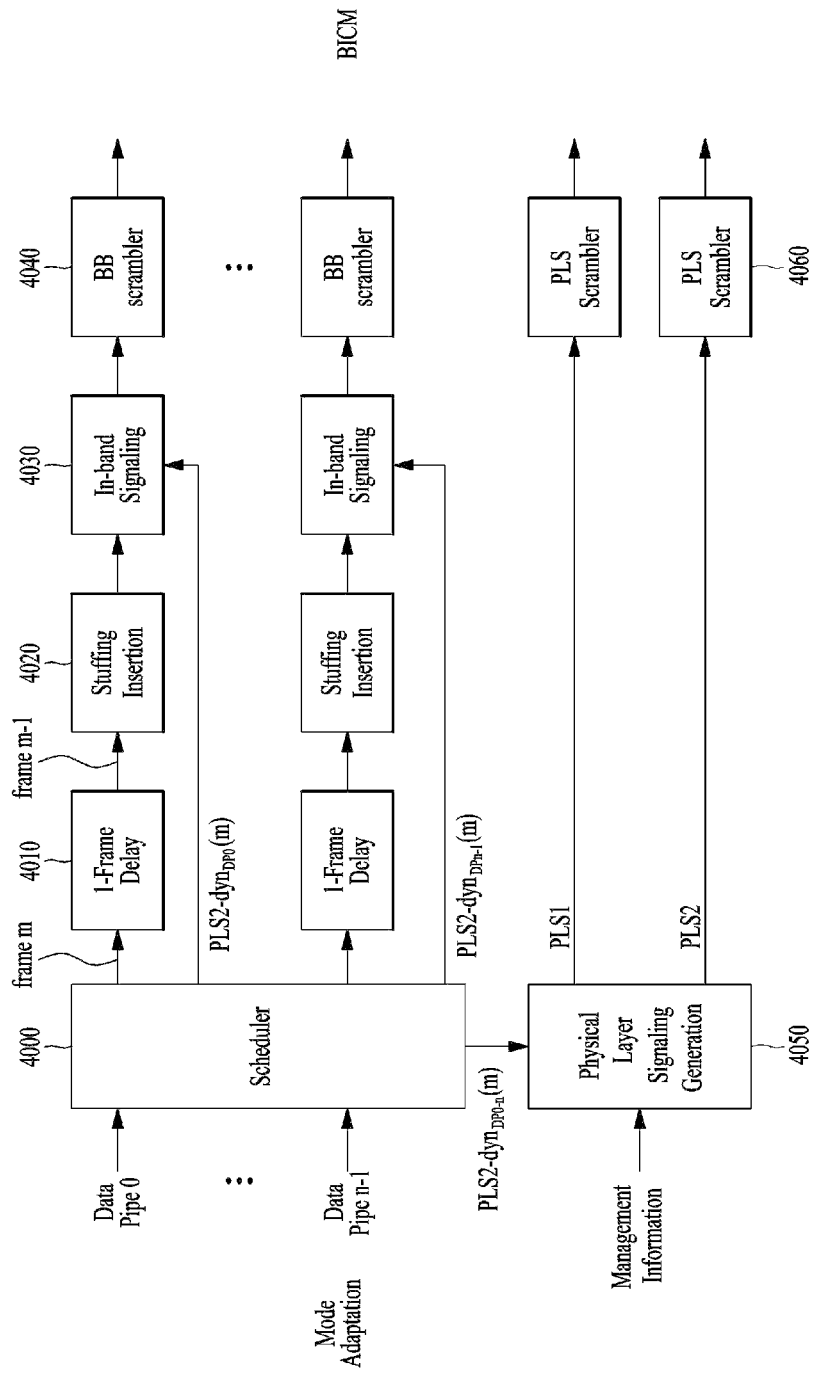
FIG. 4 illustrates an input formatting block according to another embodiment of the present invention.

FIGS. 2, 3 and 4 illustrate the input formatting block 1000 according to embodiments of the present invention. A description will be given of each figure.

FIG. 2 illustrates an input formatting block according to one embodiment of the present invention. FIG. 2 shows an input formatting module when the input signal is a single input stream.

The input formatting block illustrated in FIG. 2 corresponds to an embodiment of the input formatting block 1000 described with reference to FIG. 1.

The input to the physical layer may be composed of one or multiple data streams. Each data stream is carried by one DP. The mode adaptation modules slice the incoming data stream into data fields of the baseband frame (BBF). The system supports three types of input data streams: MPEG2-TS, Internet protocol (IP) and Generic stream (GS). MPEG2-TS is characterized by fixed length (188 byte) packets with the first byte being a sync-byte (0x47). An IP stream is composed of variable length IP datagram packets, as signaled within IP packet headers. The system supports both IPv4 and IPv6 for the IP stream. GS may be composed of variable length packets or constant length packets, signaled within encapsulation packet headers.

(a) shows a mode adaptation block 2000 and a stream adaptation 2010 for signal DP and (b) shows a PLS generation block 2020 and a PLS scrambler 2030 for generating and processing PLS data. A description will be given of the operation of each block.

The Input Stream Splitter splits the input TS, IP, GS streams into multiple service or service component (audio, video, etc.) streams. The mode adaptation module 2010 is comprised of a CRC Encoder, BB (baseband) Frame Slicer, and BB Frame Header Insertion block.

The CRC Encoder provides three kinds of CRC encoding for error detection at the user packet (UP) level, i.e., CRC-8, CRC-16, and CRC-32. The computed CRC bytes are appended after the UP. CRC-8 is used for TS stream and CRC-32 for IP stream. If the GS stream doesn't provide the CRC encoding, the proposed CRC encoding should be applied.

BB Frame Slicer maps the input into an internal logical-bit format. The first received bit is defined to be the MSB. The BB Frame Slicer allocates a number of input bits equal to the available data field capacity. To allocate a number of input bits equal to the BBF payload, the UP packet stream is sliced to fit the data field of BBF.

BB Frame Header Insertion block can insert fixed length BBF header of 2 bytes is inserted in front of the BB Frame. The BBF header is composed of STUFFI (1 bit), SYNCD (13 bits), and RFU (2 bits). In addition to the fixed 2-Byte BBF header, BBF can have an extension field (1 or 3 bytes) at the end of the 2-byte BBF header.

The stream adaptation 2010 is comprised of stuffing insertion block and BB scrambler.

The stuffing insertion block can insert stuffing field into a payload of a BB frame. If the input data to the stream adaptation is sufficient to fill a BB-Frame, STUFFI is set to '0' and the BBF has no stuffing field. Otherwise STUFFI is set to '1' and the stuffing field is inserted immediately after the BBF header. The stuffing field comprises two bytes of the stuffing field header and a variable size of stuffing data.

The BB scrambler scrambles complete BBF for energy dispersal. The scrambling sequence is synchronous with the BBF. The scrambling sequence is generated by the feedback shift register.

The PLS generation block 2020 can generate physical layer signaling (PLS) data. The PLS provides the receiver with a means to access physical layer DPs. The PLS data consists of PLS1 data and PLS2 data.

The PLS1 data is a first set of PLS data carried in the FSS symbols in the frame having a fixed size, coding and modulation, which carries basic information about the system as well as the parameters needed to decode the PLS2 data. The PLS1 data provides basic transmission parameters including parameters required to enable the reception and decoding of the PLS2 data. Also, the PLS1 data remains constant for the duration of a frame-group.

The PLS2 data is a second set of PLS data transmitted in the FSS symbol, which carries more detailed PLS data about the system and the DPs. The PLS2 contains parameters that provide sufficient information for the receiver to decode the desired DP. The PLS2 signaling further consists of two types of parameters, PLS2 Static data (PLS2-STAT data) and PLS2 dynamic data (PLS2-DYN data). The PLS2 Static data is PLS2 data that remains static for the duration of a frame-group and the PLS2 dynamic data is PLS2 data that may dynamically change frame-by-frame.

Details of the PLS data will be described later.

The PLS scrambler 2030 can scramble the generated PLS data for energy dispersal.

The above-described blocks may be omitted or replaced by blocks having similar or identical functions.

FIG. 3 illustrates an input formatting block according to another embodiment of the present invention.

The input formatting block illustrated in FIG. 3 corresponds to an embodiment of the input formatting block 1000 described with reference to FIG. 1.

FIG. 3 shows a mode adaptation block of the input formatting block when the input signal corresponds to multiple input streams.

The mode adaptation block of the input formatting block for processing the multiple input streams can independently process the multiple input streams.

Referring to FIG. 3, the mode adaptation block for respectively processing the multiple input streams can include an input stream splitter 3000, an input stream synchronizer 3010, a compensating delay block 3020, a null packet deletion block 3030, a head compression block 3040, a CRC encoder 3050, a BB frame slicer 3060 and a BB header insertion block 3070. Description will be given of each block of the mode adaptation block.

Operations of the CRC encoder 3050, BB frame slicer 3060 and BB header insertion block 3070 correspond to those of the CRC encoder, BB frame slicer and BB header insertion block described with reference to FIG. 2 and thus description thereof is omitted.

The input stream splitter 3000 can split the input TS, IP, GS streams into multiple service or service component (audio, video, etc.) streams.

The input stream synchronizer 3010 may be referred as ISSY. The ISSY can provide suitable means to guarantee Constant Bit Rate (CBR) and constant end-to-end transmission delay for any input data format. The ISSY is always used for the case of multiple DPs carrying TS, and optionally used for multiple DPs carrying GS streams.

The compensating delay block 3020 can delay the split TS packet stream following the insertion of ISSY information to allow a TS packet recombining mechanism without requiring additional memory in the receiver.

The null packet deletion block 3030, is used only for the TS input stream case. Some TS input streams or split TS streams may have a large number of null-packets present in order to accommodate VBR (variable bit-rate) services in a CBR TS stream. In this case, in order to avoid unnecessary transmission overhead, null-packets can be identified and not transmitted. In the receiver, removed null-packets can be re-inserted in the exact place where they were originally by reference to a deleted null-packet (DNP) counter that is inserted in the transmission, thus guaranteeing constant bit-rate and avoiding the need for time-stamp (PCR) updating.

The head compression block 3040 can provide packet header compression to increase transmission efficiency for TS or IP input streams. Because the receiver can have a priori information on certain parts of the header, this known information can be deleted in the transmitter.

For Transport Stream, the receiver has a-priori information about the sync-byte configuration (0x47) and the packet length (188 Byte). If the input TS stream carries content that has only one PID, i.e., for only one service component (video, audio, etc.) or service sub-component (SVC base layer, SVC enhancement layer, MVC base view or MVC dependent views), TS packet header compression can be applied (optionally) to the Transport Stream. IP packet header compression is used optionally if the input steam is an IP stream.

The above-described blocks may be omitted or replaced by blocks having similar or identical functions.

FIG. 4 illustrates an input formatting block according to another embodiment of the present invention.

The input formatting block illustrated in FIG. 4 corresponds to an embodiment of the input formatting block 1000 described with reference to FIG. 1.

FIG. 4 illustrates a stream adaptation block of the input formatting module when the input signal corresponds to multiple input streams.

Referring to FIG. 4, the mode adaptation block for respectively processing the multiple input streams can include a scheduler 4000, an 1-Frame delay block 4010, a stuffing insertion block 4020, an in-band signaling 4030, a BB Frame scrambler 4040, a PLS generation block 4050 and a PLS scrambler 4060. Description will be given of each block of the stream adaptation block.

Operations of the stuffing insertion block 4020, the BB Frame scrambler 4040, the PLS generation block 4050 and the PLS scrambler 4060 correspond to those of the stuffing insertion block, BB scrambler, PLS generation block and the PLS scrambler described with reference to FIG. 2 and thus description thereof is omitted.

The scheduler 4000 can determine the overall cell allocation across the entire frame from the amount of FECBLOCKs of each DP. Including the allocation for PLS, EAC and FIC, the scheduler generate the values of PLS2-DYN data, which is transmitted as in-band signaling or PLS cell in FSS of the frame. Details of FECBLOCK, EAC and FIC will be described later.

The 1-Frame delay block 4010 can delay the input data by one transmission frame such that scheduling information about the next frame can be transmitted through the current frame for in-band signaling information to be inserted into the DPs.

The in-band signaling 4030 can insert un-delayed part of the PLS2 data into a DP of a frame.

The above-described blocks may be omitted or replaced by blocks having similar or identical functions.

Figure 5:
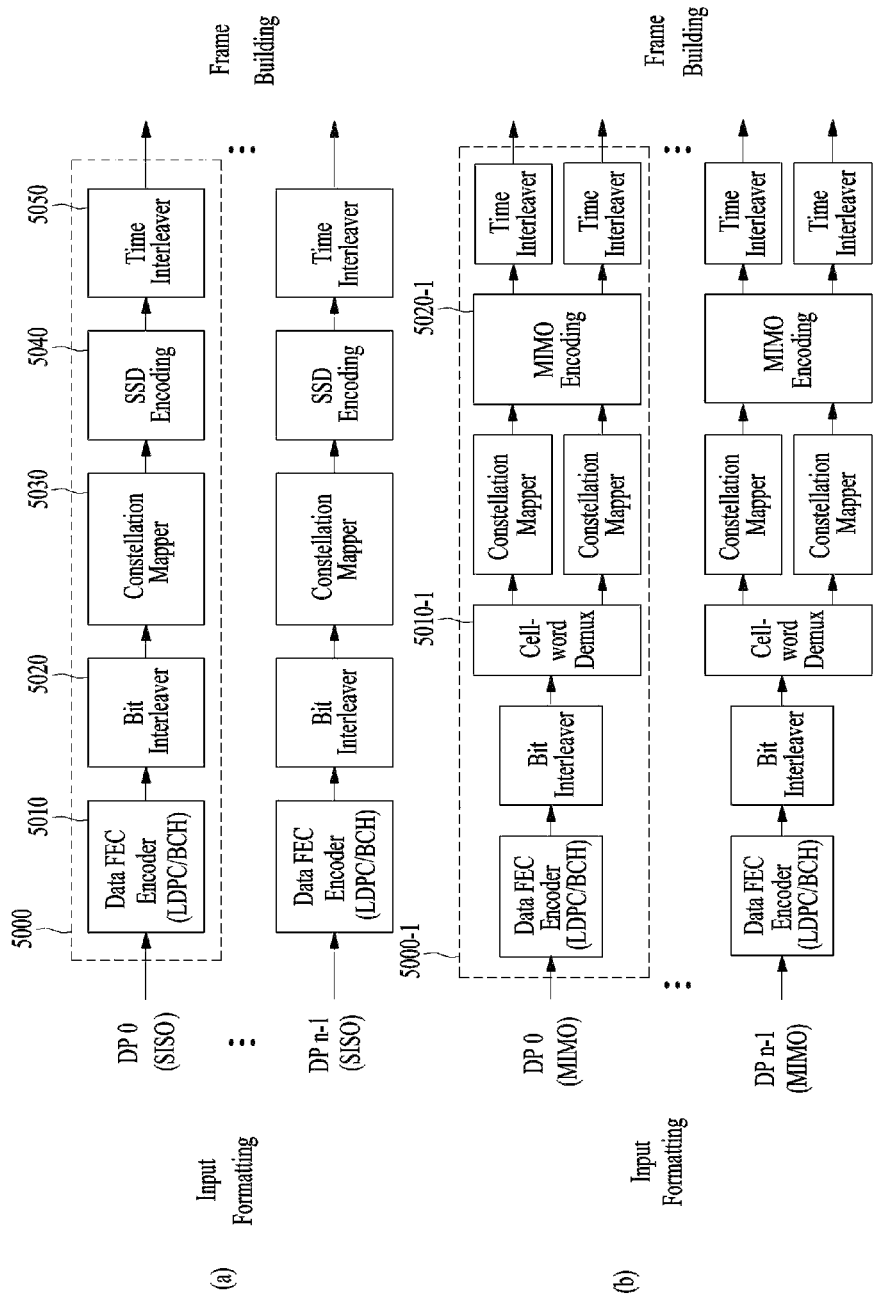
FIG. 5 illustrates a BICM block according to an embodiment of the present invention.

FIG. 5 illustrates a BICM block according to an embodiment of the present invention.

The BICM block illustrated in FIG. 5 corresponds to an embodiment of the BICM block 1010 described with reference to FIG. 1.

As described above, the apparatus for transmitting broadcast signals for future broadcast services according to an embodiment of the present invention can provide a terrestrial broadcast service, mobile broadcast service, UHDTV service, etc.

Since QoS (quality of service) depends on characteristics of a service provided by the apparatus for transmitting broadcast signals for future broadcast services according to an embodiment of the present invention, data corresponding to respective services needs to be processed through different schemes. Accordingly, the a BICM block according to an embodiment of the present invention can independently process DPs input thereto by independently applying SISO, MISO and MIMO schemes to the data pipes respectively corresponding to data paths. Consequently, the apparatus for transmitting broadcast signals for future broadcast services according to an embodiment of the present invention can control QoS for each service or service component transmitted through each DP.

(a) shows the BICM block shared by the base profile and the handheld profile and (b) shows the BICM block of the advanced profile.

The BICM block shared by the base profile and the handheld profile and the BICM block of the advanced profile can include plural processing blocks for processing each DP.

A description will be given of each processing block of the BICM block for the base profile and the handheld profile and the BICM block for the advanced profile.

A processing block 5000 of the BICM block for the base profile and the handheld profile can include a Data FEC encoder 5010, a bit interleaver 5020, a constellation mapper 5030, an SSD (Signal Space Diversity) encoding block 5040 and a time interleaver 5050.

The Data FEC encoder 5010 can perform the FEC encoding on the input BBF to generate FECBLOCK procedure using outer coding (BCH), and inner coding (LDPC). The outer coding (BCH) is optional coding method. Details of operations of the Data FEC encoder 5010 will be described later.

The bit interleaver 5020 can interleave outputs of the Data FEC encoder 5010 to achieve optimized performance with combination of the LDPC codes and modulation scheme while providing an efficiently implementable structure. Details of operations of the bit interleaver 5020 will be described later.

The constellation mapper 5030 can modulate each cell word from the bit interleaver 5020 in the base and the handheld profiles, or cell word from the Cell-word demultiplexer 5010-1 in the advanced profile using either QPSK, QAM-16, non-uniform QAM (NUQ-64, NUQ-256, NUQ-1024) or non-uniform constellation (NUC-16, NUC-64, NUC-256, NUC-1024) to give a power-normalized constellation point, e1. This constellation mapping is applied only for DPs. Observe that QAM-16 and NUQs are square shaped, while NUCs have arbitrary shape. When each constellation is rotated by any multiple of 90 degrees, the rotated constellation exactly overlaps with its original one. This "rotation-sense" symmetric property makes the capacities and the average powers of the real and imaginary components equal to each other. Both NUQs and NUCs are defined specifically for each code rate and the particular one used is signaled by the parameter DP_MOD filed in PLS2 data.

The SSD encoding block 5040 can precode cells in two (2D), three (3D), and four (4D) dimensions to increase the reception robustness under difficult fading conditions.

The time interleaver 5050 can operates at the DP level. The parameters of time interleaving (TI) may be set differently for each DP. Details of operations of the time interleaver 5050 will be described later.

A processing block 5000-1 of the BICM block for the advanced profile can include the Data FEC encoder, bit interleaver, constellation mapper, and time interleaver. However, the processing block 5000-1 is distinguished from the processing block 5000 further includes a cell-word demultiplexer 5010-1 and a MIMO encoding block 5020-1.

Also, the operations of the Data FEC encoder, bit interleaver, constellation mapper, and time interleaver in the processing block 5000-1 correspond to those of the Data FEC encoder 5010, bit interleaver 5020, constellation mapper 5030, and time interleaver 5050 described and thus description thereof is omitted.

The cell-word demultiplexer 5010-1 is used for the DP of the advanced profile to divide the single cell-word stream into dual cell-word streams for MIMO processing. Details of operations of the cell-word demultiplexer 5010-1 will be described later.

The MIMO encoding block 5020-1 can processing the output of the cell-word demultiplexer 5010-1 using MIMO encoding scheme. The MIMO encoding scheme was optimized for broadcasting signal transmission. The MIMO technology is a promising way to get a capacity increase but it depends on channel characteristics. Especially for broadcasting, the strong LOS component of the channel or a difference in the received signal power between two antennas caused by different signal propagation characteristics makes it difficult to get capacity gain from MIMO. The proposed MIMO encoding scheme overcomes this problem using a rotation-based pre-coding and phase randomization of one of the MIMO output signals.

MIMO encoding is intended for a 2×2 MIMO system requiring at least two antennas at both the transmitter and the receiver. Two MIMO encoding modes are defined in this proposal; full-rate spatial multiplexing (FR-SM) and full-rate full-diversity spatial multiplexing (FRFD-SM). The FR-SM encoding provides capacity increase with relatively small complexity increase at the receiver side while the FRFD-SM encoding provides capacity increase and additional diversity gain with a great complexity increase at the receiver side. The proposed MIMO encoding scheme has no restriction on the antenna polarity configuration.

MIMO processing is required for the advanced profile frame, which means all DPs in the advanced profile frame are processed by the MIMO encoder. MIMO processing is applied at DP level. Pairs of the Constellation Mapper outputs NUQ (e1,i and e2,i) are fed to the input of the MIMO Encoder. Paired MIMO Encoder output (g1,i and g2,i) is transmitted by the same carrier k and OFDM symbol l of their respective TX antennas.

The above-described blocks may be omitted or replaced by blocks having similar or identical functions.

Figure 6:
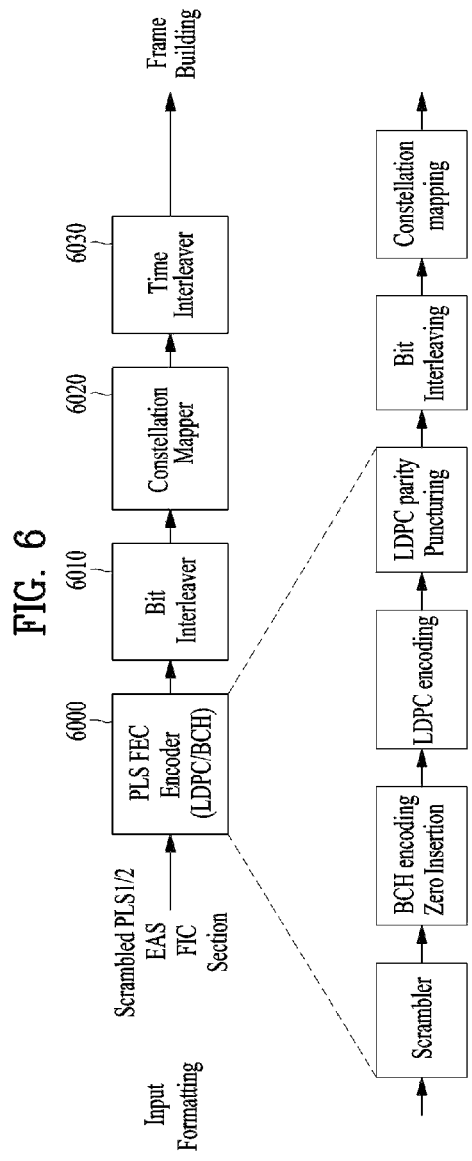
FIG. 6 illustrates a BICM block according to another embodiment of the present invention.

FIG. 6 illustrates a BICM block according to another embodiment of the present invention.

The BICM block illustrated in FIG. 6 corresponds to an embodiment of the BICM block 1010 described with reference to FIG. 1.

FIG. 6 illustrates a BICM block for protection of physical layer signaling (PLS), emergency alert channel (EAC) and fast information channel (FIC). EAC is a part of a frame that carries EAS information data and FIC is a logical channel in a frame that carries the mapping information between a service and the corresponding base DP. Details of the EAC and FIC will be described later.

Referring to FIG. 6, the BICM block for protection of PLS, EAC and FIC can include a PLS FEC encoder 6000, a bit interleaver 6010, a constellation mapper 6020 and time interleaver 6030.

Also, the PLS FEC encoder 6000 can include a scrambler, BCH encoding/zero insertion block, LDPC encoding block and LDPC parity puncturing block. Description will be given of each block of the BICM block.

The PLS FEC encoder 6000 can encode the scrambled PLS ½ data, EAC and FIC section.

The scrambler can scramble PLS1 data and PLS2 data before BCH encoding and shortened and punctured LDPC encoding.

The BCH encoding/zero insertion block can perform outer encoding on the scrambled PLS ½ data using the shortened BCH code for PLS protection and insert zero bits after the BCH encoding. For PLS1 data only, the output bits of the zero insertion may be permutted before LDPC encoding.

The LDPC encoding block can encode the output of the BCH encoding/zero insertion block using LDPC code. To generate a complete coded block, $C_{ldpc}$, parity bits, Pldpc are encoded systematically from each zero-inserted PLS information block, $I_{ldpc}$ and appended after it.

$$C_{ldpc}=[I_{ldpc}P_{ldpc}]=[i_0,i_1, \ldots ,i_{K_{ldpc}-1},p_0, p_1, \ldots ,p_{N_{ldpc}-K_{ldpc}-1}] \quad \text{[Math Figure 1]}$$

The LDPC code parameters for PLS1 and PLS2 are as following table 4.

TABLE 4

| Signaling Type | $K_{sig}$ | $K_{bch}$ | $N_{bch\_parity}$ | $K_{ldpc}$ (=$N_{bch}$) | $N_{ldpc}$ | $N_{ldpc\_parity}$ | code rate | $Q_{ldpc}$ |
|---|---|---|---|---|---|---|---|---|
| PLS1 | 342 | 1020 | 60 | 1080 | 4320 | 3240 | 1/4 | 36 |
| PLS2 | <1021 | | | | | | | |
| | >1020 | 2100 | | 2160 | 7200 | 5040 | 3/10 | 56 |

The LDPC parity puncturing block can perform puncturing on the PLS1 data and PLS 2 data.

When shortening is applied to the PLS1 data protection, some LDPC parity bits are punctured after LDPC encoding. Also, for the PLS2 data protection, the LDPC parity bits of PLS2 are punctured after LDPC encoding. These punctured bits are not transmitted.

The bit interleaver 6010 can interleave the each shortened and punctured PLS1 data and PLS2 data.

The constellation mapper 6020 can map the bit interleaved PLS1 data and PLS2 data onto constellations.

The time interleaver 6030 can interleave the mapped PLS1 data and PLS2 data.

The above-described blocks may be omitted or replaced by blocks having similar or identical functions.

Figure 7:
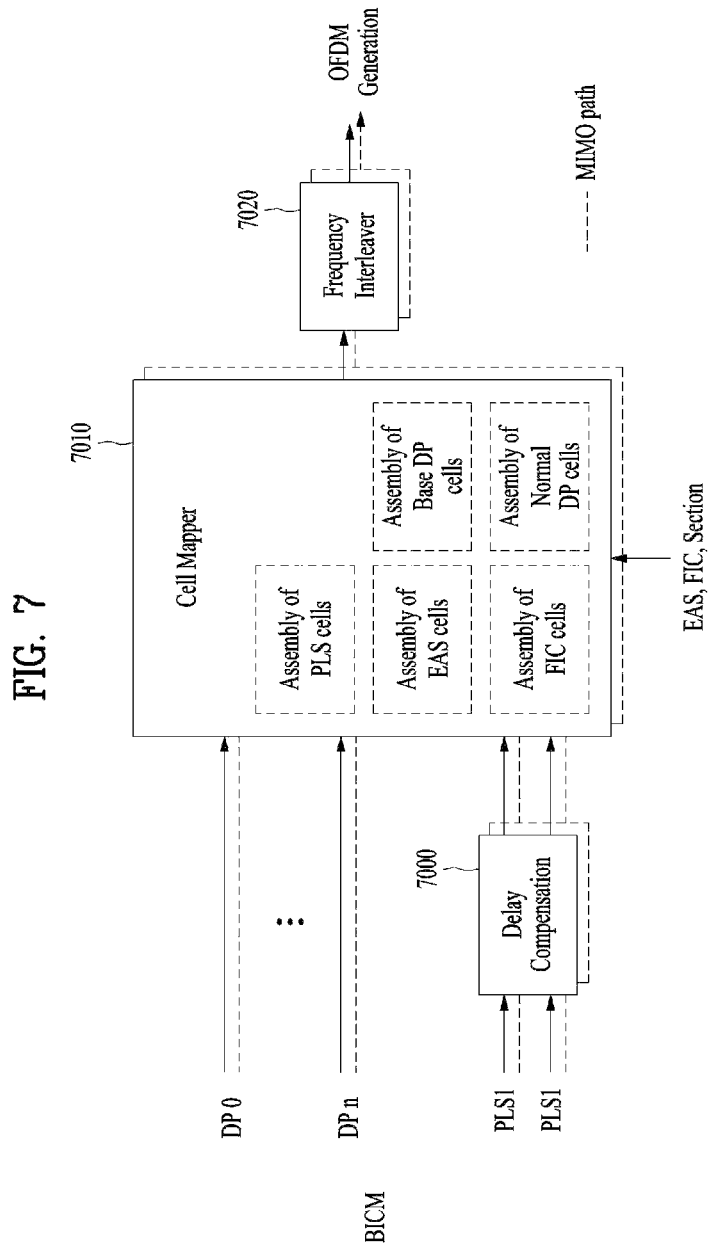
FIG. 7 illustrates a frame building block according to one embodiment of the present invention.

FIG. 7 illustrates a frame building block according to one embodiment of the present invention.

The frame building block illustrated in FIG. 7 corresponds to an embodiment of the frame building block 1020 described with reference to FIG. 1.

Referring to FIG. 7, the frame building block can include a delay compensation block 7000, a cell mapper 7010 and a frequency interleaver 7020. Description will be given of each block of the frame building block.

The delay compensation block 7000 can adjust the timing between the data pipes and the corresponding PLS data to ensure that they are co-timed at the transmitter end. The PLS data is delayed by the same amount as data pipes are by addressing the delays of data pipes caused by the Input Formatting block and BICM block. The delay of the BICM block is mainly due to the time interleaver 5050. In-band signaling data carries information of the next TI group so that they are carried one frame ahead of the DPs to be signaled. The Delay Compensating block delays in-band signaling data accordingly.

The cell mapper 7010 can map PLS, EAC, FIC, DPs, auxiliary streams and dummy cells into the active carriers of the OFDM symbols in the frame. The basic function of the cell mapper 7010 is to map data cells produced by the TIs for each of the DPs, PLS cells, and EAC/FIC cells, if any, into arrays of active OFDM cells corresponding to each of the OFDM symbols within a frame. Service signaling data (such as PSI(program specific information)/SI) can be separately gathered and sent by a data pipe. The Cell Mapper operates according to the dynamic information produced by the scheduler and the configuration of the frame structure. Details of the frame will be described later.

The frequency interleaver 7020 can randomly interleave data cells received from the cell mapper 7010 to provide frequency diversity. Also, the frequency interleaver 7020 can operate on very OFDM symbol pair comprised of two sequential OFDM symbols using a different interleaving-seed order to get maximum interleaving gain in a single frame. Details of operations of the frequency interleaver 7020 will be described later.

The above-described blocks may be omitted or replaced by blocks having similar or identical functions.

Figure 8:
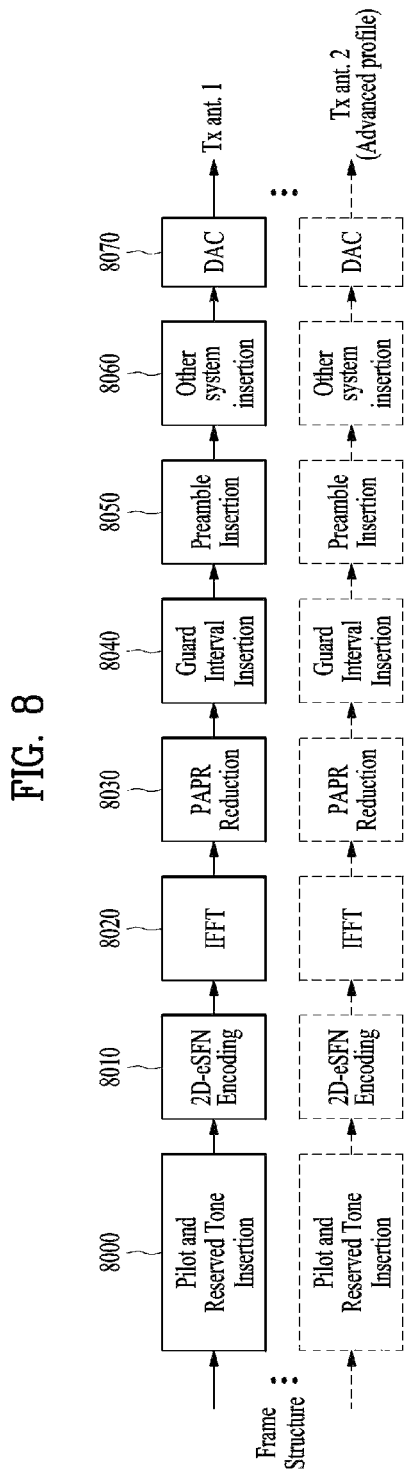
FIG. 8 illustrates an OFMD generation block according to an embodiment of the present invention.

FIG. 8 illustrates an OFMD generation block according to an embodiment of the present invention.

The OFMD generation block illustrated in FIG. 8 corresponds to an embodiment of the OFMD generation block 1030 described with reference to FIG. 1.

The OFDM generation block modulates the OFDM carriers by the cells produced by the Frame Building block, inserts the pilots, and produces the time domain signal for transmission. Also, this block subsequently inserts guard intervals, and applies PAPR (Peak-to-Average Power Radio) reduction processing to produce the final RF signal.

Referring to FIG. 8, the frame building block can include a pilot and reserved tone insertion block 8000, a 2D-eSFN encoding block 8010, an IFFT (Inverse Fast Fourier Transform) block 8020, a PAPR reduction block 8030, a guard interval insertion block 8040, a preamble insertion block 8050, other system insertion block 8060 and a DAC block 8070. Description will be given of each block of the frame building block.

The pilot and reserved tone insertion block 8000 can insert pilots and the reserved tone.

Various cells within the OFDM symbol are modulated with reference information, known as pilots, which have transmitted values known a priori in the receiver. The information of pilot cells is made up of scattered pilots, continual pilots, edge pilots, FSS (frame signaling symbol) pilots and FES (frame edge symbol) pilots. Each pilot is transmitted at a particular boosted power level according to pilot type and pilot pattern. The value of the pilot information is derived from a reference sequence, which is a series of values, one for each transmitted carrier on any given symbol. The pilots can be used for frame synchronization, frequency synchronization, time synchronization, channel estimation, and transmission mode identification, and also can be used to follow the phase noise.

Reference information, taken from the reference sequence, is transmitted in scattered pilot cells in every symbol except the preamble, FSS and FES of the frame. Continual pilots are inserted in every symbol of the frame. The number and location of continual pilots depends on both the FFT size and the scattered pilot pattern. The edge carriers are edge pilots in every symbol except for the preamble symbol. They are inserted in order to allow frequency interpolation up to the edge of the spectrum. FSS pilots are inserted in FSS(s) and FES pilots are inserted in FES. They are inserted in order to allow time interpolation up to the edge of the frame.

The system according to an embodiment of the present invention supports the SFN network, where distributed MISO scheme is optionally used to support very robust transmission mode. The 2D-eSFN is a distributed MISO scheme that uses multiple TX antennas, each of which is located in the different transmitter site in the SFN network.

The 2D-eSFN encoding block 8010 can process a 2D-eSFN processing to distorts the phase of the signals transmitted from multiple transmitters, in order to create both time and frequency diversity in the SFN configuration. Hence, burst errors due to low flat fading or deep-fading for a long time can be mitigated.

The IFFT block 8020 can modulate the output from the 2D-eSFN encoding block 8010 using OFDM modulation scheme. Any cell in the data symbols which has not been designated as a pilot (or as a reserved tone) carries one of the data cells from the frequency interleaver. The cells are mapped to OFDM carriers.

The PAPR reduction block 8030 can perform a PAPR reduction on input signal using various PAPR reduction algorithm in the time domain.

The guard interval insertion block 8040 can insert guard intervals and the preamble insertion block 8050 can insert preamble in front of the signal. Details of a structure of the preamble will be described later. The other system insertion block 8060 can multiplex signals of a plurality of broadcast transmission/reception systems in the time domain such that data of two or more different broadcast transmission/reception systems providing broadcast services can be simultaneously transmitted in the same RF signal bandwidth. In this case, the two or more different broadcast transmission/reception systems refer to systems providing different broadcast services. The different broadcast services may refer to a terrestrial broadcast service, mobile broadcast service, etc. Data related to respective broadcast services can be transmitted through different frames.

The DAC block 8070 can convert an input digital signal into an analog signal and output the analog signal. The signal output from the DAC block 7800 can be transmitted through multiple output antennas according to the physical layer profiles. A Tx antenna according to an embodiment of the present invention can have vertical or horizontal polarity.

The above-described blocks may be omitted or replaced by blocks having similar or identical functions according to design.

Figure 9:
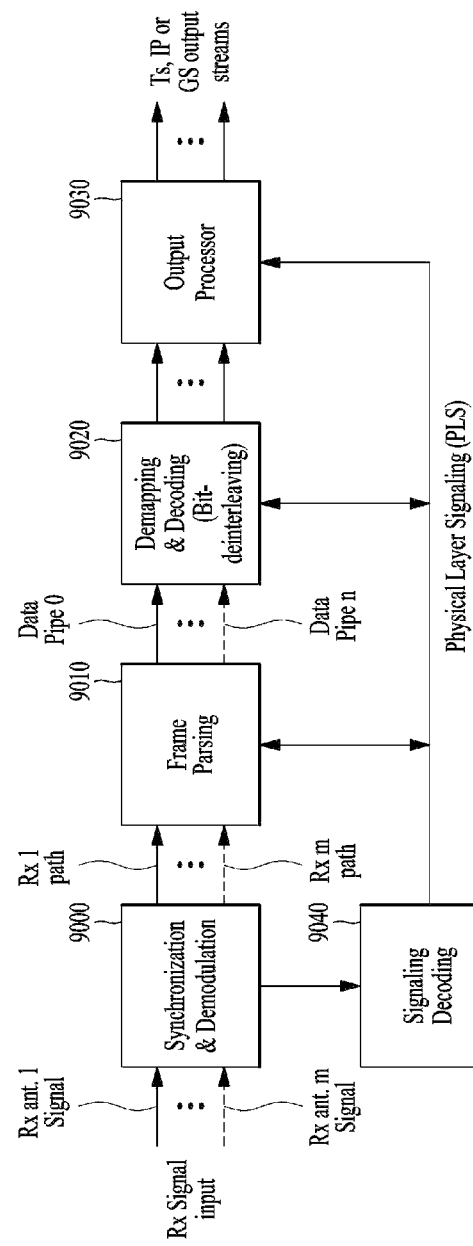
FIG. 9 illustrates a structure of an apparatus for receiving broadcast signals for future broadcast services according to an embodiment of the present invention.

FIG. 9 illustrates a structure of an apparatus for receiving broadcast signals for future broadcast services according to an embodiment of the present invention.

The apparatus for receiving broadcast signals for future broadcast services according to an embodiment of the present invention can correspond to the apparatus for transmitting broadcast signals for future broadcast services, described with reference to FIG. 1.

The apparatus for receiving broadcast signals for future broadcast services according to an embodiment of the present invention can include a synchronization & demodulation module 9000, a frame parsing module 9010, a demapping & decoding module 9020, an output processor 9030 and a signaling decoding module 9040. A description will be given of operation of each module of the apparatus for receiving broadcast signals.

The synchronization & demodulation module 9000 can receive input signals through m Rx antennas, perform signal detection and synchronization with respect to a system corresponding to the apparatus for receiving broadcast signals and carry out demodulation corresponding to a reverse procedure of the procedure performed by the apparatus for transmitting broadcast signals.

The frame parsing module 9100 can parse input signal frames and extract data through which a service selected by a user is transmitted. If the apparatus for transmitting broadcast signals performs interleaving, the frame parsing module 9100 can carry out deinterleaving corresponding to a reverse procedure of interleaving. In this case, the positions of a signal and data that need to be extracted can be obtained by decoding data output from the signaling decoding module 9400 to restore scheduling information generated by the apparatus for transmitting broadcast signals.

The demapping & decoding module 9200 can convert the input signals into bit domain data and then deinterleave the same as necessary. The demapping & decoding module 9200 can perform demapping for mapping applied for transmission efficiency and correct an error generated on a transmission channel through decoding. In this case, the demapping & decoding module 9200 can obtain transmission parameters necessary for demapping and decoding by decoding the data output from the signaling decoding module 9400.

The output processor 9300 can perform reverse procedures of various compression/signal processing procedures which are applied by the apparatus for transmitting broadcast signals to improve transmission efficiency. In this case, the output processor 9300 can acquire necessary control information from data output from the signaling decoding module 9400. The output of the output processor 8300 corresponds to a signal input to the apparatus for transmitting broadcast signals and may be MPEG-TSs, IP streams (v4 or v6) and generic streams.

The signaling decoding module 9400 can obtain PLS information from the signal demodulated by the synchronization & demodulation module 9000. As described above, the frame parsing module 9100, demapping & decoding module 9200 and output processor 9300 can execute functions thereof using the data output from the signaling decoding module 9400.

Figure 10:
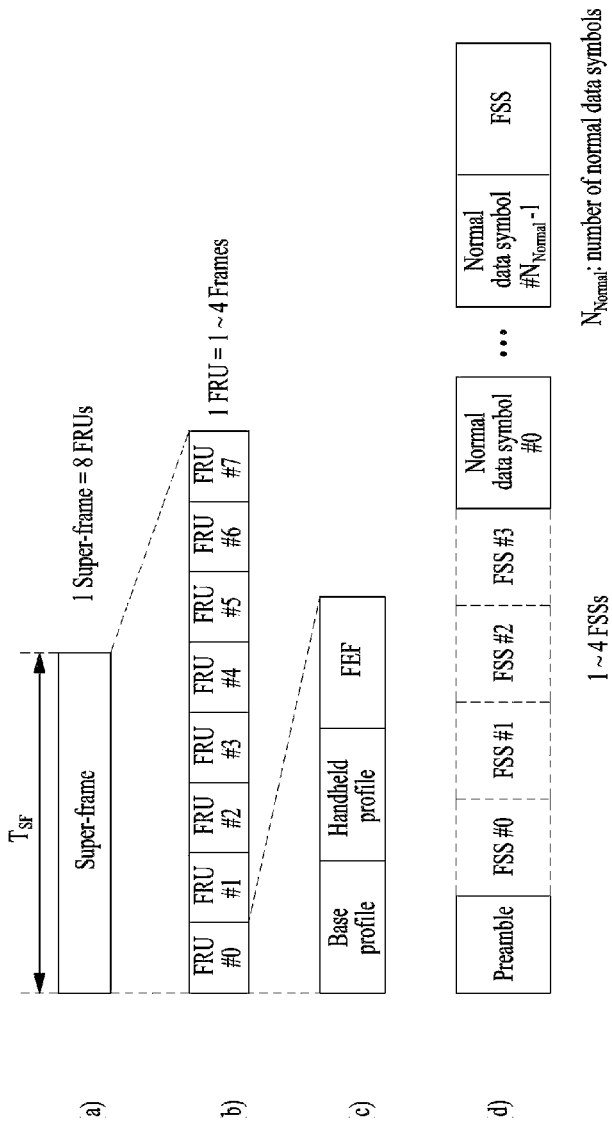
FIG. 10 illustrates a frame structure according to an embodiment of the present invention.

FIG. 10 illustrates a frame structure according to an embodiment of the present invention.

FIG. 10 shows an example configuration of the frame types and FRUs in a super-frame. (a) shows a super frame according to an embodiment of the present invention, (b) shows FRU (Frame Repetition Unit) according to an embodiment of the present invention, (c) shows frames of variable PHY profiles in the FRU and (d) shows a structure of a frame.

A super-frame may be composed of eight FRUs. The FRU is a basic multiplexing unit for TDM of the frames, and is repeated eight times in a super-frame.

Each frame in the FRU belongs to one of the PHY profiles, (base, handheld, advanced) or FEF. The maximum allowed number of the frames in the FRU is four and a given PHY profile can appear any number of times from zero times to four times in the FRU (e.g., base, base, handheld, advanced). PHY profile definitions can be extended using reserved values of the PHY_PROFILE in the preamble, if required.

The FEF part is inserted at the end of the FRU, if included. When the FEF is included in the FRU, the minimum number of FEFs is 8 in a super-frame. It is not recommended that FEF parts be adjacent to each other.

One frame is further divided into a number of OFDM symbols and a preamble. As shown in (d), the frame comprises a preamble, one or more frame signaling symbols (FSS), normal data symbols and a frame edge symbol (FES).

The preamble is a special symbol that enables fast Futurecast UTB system signal detection and provides a set of basic transmission parameters for efficient transmission and reception of the signal. The detailed description of the preamble will be will be described later.

The main purpose of the FSS(s) is to carry the PLS data. For fast synchronization and channel estimation, and hence fast decoding of PLS data, the FSS has more dense pilot pattern than the normal data symbol. The FES has exactly the same pilots as the FSS, which enables frequency-only interpolation within the FES and temporal interpolation, without extrapolation, for symbols immediately preceding the FES.

Figures 11, 12:
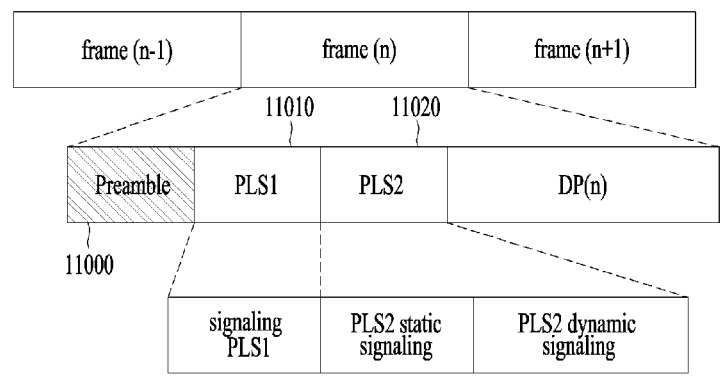
FIG. 11 illustrates a signaling hierarchy structure of the frame according to an embodiment of the present invention.
FIG. 12 illustrates preamble signaling data according to an embodiment of the present invention.

FIG. 11 illustrates a signaling hierarchy structure of the frame according to an embodiment of the present invention.

FIG. 11 illustrates the signaling hierarchy structure, which is split into three main parts: the preamble signaling data 11000, the PLS1 data 11010 and the PLS2 data 11020. The purpose of the preamble, which is carried by the preamble symbol in every frame, is to indicate the transmission type and basic transmission parameters of that frame. The PLS1 enables the receiver to access and decode the PLS2 data, which contains the parameters to access the DP of interest. The PLS2 is carried in every frame and split into two main parts: PLS2-STAT data and PLS2-DYN data. The static and dynamic portion of PLS2 data is followed by padding, if necessary.

FIG. 12 illustrates preamble signaling data according to an embodiment of the present invention.

Preamble signaling data carries 21 bits of information that are needed to enable the receiver to access PLS data and trace DPs within the frame structure. Details of the preamble signaling data are as follows:

PHY_PROFILE: This 3-bit field indicates the PHY profile type of the current frame. The mapping of different PHY profile types is given in below table 5.

TABLE 5

| Value | PHY profile |
| --- | --- |
| 000 | Base profile |
| 001 | Handheld profile |
| 010 | Advanced profiled |
| 011~110 | Reserved |
| 111 | FEF |

FFT_SIZE: This 2 bit field indicates the FFT size of the current frame within a frame-group, as described in below table 6.

TABLE 6

| Value | FFT size |
| --- | --- |
| 00 | 8K FFT |
| 01 | 16K FFT |
| 10 | 32K FFT |
| 11 | Reserved |

GI_FRACTION: This 3 bit field indicates the guard interval fraction value in the current super-frame, as described in below table 7.

TABLE 7

| Value | GI_FRACTION |
| --- | --- |
| 000 | 1/5 |
| 001 | 1/10 |
| 010 | 1/20 |
| 011 | 1/40 |
| 100 | 1/80 |
| 101 | 1/160 |
| 110~111 | Reserved |

EAC_FLAG: This 1 bit field indicates whether the EAC is provided in the current frame. If this field is set to '1', emergency alert service (EAS) is provided in the current frame. If this field set to '0', EAS is not carried in the current frame. This field can be switched dynamically within a super-frame.

PILOT_MODE: This 1-bit field indicates whether the pilot mode is mobile mode or fixed mode for the current frame in the current frame-group. If this field is set to '0', mobile pilot mode is used. If the field is set to '1', the fixed pilot mode is used.

PAPR_FLAG: This 1-bit field indicates whether PAPR reduction is used for the current frame in the current frame-group. If this field is set to value '1', tone reservation is used for PAPR reduction. If this field is set to '0', PAPR reduction is not used.

FRU_CONFIGURE: This 3-bit field indicates the PHY profile type configurations of the frame repetition units (FRU) that are present in the current super-frame. All profile types conveyed in the current super-frame are identified in this field in all preambles in the current super-frame. The 3-bit field has a different definition for each profile, as show in below table 8.

TABLE 8

| | Current PHY_PROFILE = '000' (base) | Current PHY_PROFILE = '001' (handheld) | Current PHY_PROFILE = '010' (advanced) | Current PHY_PROFILE = '111' (FEF) |
| --- | --- | --- | --- | --- |
| FRU_CONFIGURE = 000 | Only base profile present | Only handheld profile present | Only advanced profile present | Only FEF present |
| FRU_CONFIGURE = 1XX | Handheld profile present | Base profile present | Base profile present | Base profile present |
| FRU_CONFIGURE = X1X | Advanced profile present | Advanced profile present | Handheld profile present | Handheld profile present |
| FRU_CONFIGURE = XX1 | FEF present | FEF present | FEF present | Advanced profile present |

RESERVED: This 7-bit field is reserved for future use.

FIG. 13 illustrates PLS1 data according to an embodiment of the present invention.

PLS1 data provides basic transmission parameters including parameters required to enable the reception and decoding of the PLS2. As above mentioned, the PLS1 data remain unchanged for the entire duration of one frame-group. The detailed definition of the signaling fields of the PLS1 data are as follows:

PREAMBLE_DATA: This 20-bit field is a copy of the preamble signaling data excluding the EAC_FLAG.

NUM_FRAME_FRU: This 2-bit field indicates the number of the frames per FRU.

PAYLOAD_TYPE: This 3-bit field indicates the format of the payload data carried in the frame-group. PAYLOAD_TYPE is signaled as shown in table 9.

TABLE 9

| value | Payload type |
| --- | --- |
| 1XX | TS stream is transmitted |
| X1X | IP stream is transmitted |
| XX1 | GS stream is transmitted |

NUM_FSS: This 2-bit field indicates the number of FSS symbols in the current frame.

SYSTEM_VERSION: This 8-bit field indicates the version of the transmitted signal format. The SYSTEM_VERSION is divided into two 4-bit fields, which are a major version and a minor version.

Major version: The MSB four bits of SYSTEM_VERSION field indicate major version information. A change in the major version field indicates a non-backward-compatible change. The default value is '0000'. For the version described in this standard, the value is set to '0000'.

Minor version: The LSB four bits of SYSTEM_VERSION field indicate minor version information. A change in the minor version field is backward-compatible.

CELL_ID: This is a 16-bit field which uniquely identifies a geographic cell in an ATSC network. An ATSC cell coverage area may consist of one or more frequencies, depending on the number of frequencies used per Futurecast UTB system. If the value of the CELL_ID is not known or unspecified, this field is set to '0'.

NETWORK_ID: This is a 16-bit field which uniquely identifies the current ATSC network.

SYSTEM_ID: This 16-bit field uniquely identifies the Futurecast UTB system within the ATSC network. The Futurecast UTB system is the terrestrial broadcast system whose input is one or more input streams (TS, IP, GS) and whose output is an RF signal. The Futurecast UTB system carries one or more PHY profiles and FEF, if any. The same Futurecast UTB system may carry different input streams and use different RF frequencies in different geographical areas, allowing local service insertion. The frame structure and scheduling is controlled in one place and is identical for all transmissions within a Futurecast UTB system. One or more Futurecast UTB systems may have the same SYSTEM_ID meaning that they all have the same physical layer structure and configuration.

The following loop consists of FRU_PHY_PROFILE, FRU_FRAME_LENGTH, FRU_GI_FRACTION, and RESERVED which are used to indicate the FRU configuration and the length of each frame type. The loop size is fixed so that four PHY profiles (including a FEF) are signaled within the FRU. If NUM_FRAME_FRU is less than 4, the unused fields are filled with zeros.

FRU_PHY_PROFILE: This 3-bit field indicates the PHY profile type of the (i+1)th (i is the loop index) frame of the associated FRU. This field uses the same signaling format as shown in the table 8.

FRU_FRAME_LENGTH: This 2-bit field indicates the length of the (i+1)th frame of the associated FRU. Using FRU_FRAME_LENGTH together with FRU_GI_FRACTION, the exact value of the frame duration can be obtained.

FRU_GI_FRACTION: This 3-bit field indicates the guard interval fraction value of the (i+1)th frame of the associated FRU. FRU_GI_FRACTION is signaled according to the table 7.

RESERVED: This 4-bit field is reserved for future use.

The following fields provide parameters for decoding the PLS2 data.

PLS2_FEC_TYPE: This 2-bit field indicates the FEC type used by the PLS2 protection. The FEC type is signaled according to table 10. The details of the LDPC codes will be described later.

TABLE 10

| Content | PLS2 FEC type |
| --- | --- |
| 00 | 4K-1/4 and 7K-3/10 LDPC codes |
| 01~11 | Reserved |

PLS2_MOD: This 3-bit field indicates the modulation type used by the PLS2. The modulation type is signaled according to table 11.

TABLE 11

| Value | PLS2_MODE |
| --- | --- |
| 000 | BPSK |
| 001 | QPSK |
| 010 | QAM-16 |
| 011 | NUQ-64 |
| 100~111 | Reserved |

PLS2_SIZE_CELL: This 15-bit field indicates $C_{total\_partial\_block}$, the size (specified as the number of QAM cells) of the collection of full coded blocks for PLS2 that is carried in the current frame-group. This value is constant during the entire duration of the current frame-group.

PLS2_STAT_SIZE_BIT: This 14-bit field indicates the size, in bits, of the PLS2-STAT for the current frame-group. This value is constant during the entire duration of the current frame-group.

PLS2_DYN_SIZE_BIT: This 14-bit field indicates the size, in bits, of the PLS2-DYN for the current frame-group. This value is constant during the entire duration of the current frame-group.

PLS2_REP_FLAG: This 1-bit flag indicates whether the PLS2 repetition mode is used in the current frame-group. When this field is set to value '1', the PLS2 repetition mode is activated. When this field is set to value '0', the PLS2 repetition mode is deactivated.

PLS2_REP_SIZE_CELL: This 15-bit field indicates $C_{total\_partial\_block}$, the size (specified as the number of QAM cells) of the collection of partial coded blocks for PLS2 carried in every frame of the current frame-group, when PLS2 repetition is used. If repetition is not used, the value of this field is equal to 0. This value is constant during the entire duration of the current frame-group.

PLS2_NEXT_FEC_TYPE: This 2-bit field indicates the FEC type used for PLS2 that is carried in every frame of the next frame-group. The FEC type is signaled according to the table 10.

PLS2_NEXT_MOD: This 3-bit field indicates the modulation type used for PLS2 that is carried in every frame of the next frame-group. The modulation type is signaled according to the table 11.

PLS2_NEXT_REP_FLAG: This 1-bit flag indicates whether the PLS2 repetition mode is used in the next frame-group. When this field is set to value '1', the PLS2 repetition mode is activated. When this field is set to value '0', the PLS2 repetition mode is deactivated.

PLS2_NEXT_REP_SIZE_CELL: This 15-bit field indicates $C_{total\_full\_block}$, The size (specified as the number of QAM cells) of the collection of full coded blocks for PLS2 that is carried in every frame of the next frame-group, when PLS2 repetition is used. If repetition is not used in the next frame-group, the value of this field is equal to 0. This value is constant during the entire duration of the current frame-group.

PLS2_NEXT_REP_STAT_SIZE_BIT: This 14-bit field indicates the size, in bits, of the PLS2-STAT for the next frame-group. This value is constant in the current frame-group.

PLS2_NEXT_REP_DYN_SIZE_BIT: This 14-bit field indicates the size, in bits, of the PLS2-DYN for the next frame-group. This value is constant in the current frame-group.

PLS2_AP_MODE: This 2-bit field indicates whether additional parity is provided for PLS2 in the current frame-group. This value is constant during the entire duration of the current frame-group. The below table 12 gives the values of this field. When this field is set to '00', additional parity is not used for the PLS2 in the current frame-group.

TABLE 12

| Value | PLS2-AP mode |
| --- | --- |
| 00 | AP is not provided |
| 01 | AP1 mode |
| 10~11 | Reserved |

PLS2_AP_SIZE_CELL: This 15-bit field indicates the size (specified as the number of QAM cells) of the additional parity bits of the PLS2. This value is constant during the entire duration of the current frame-group.

PLS2_NEXT_AP_MODE: This 2-bit field indicates whether additional parity is provided for PLS2 signaling in every frame of next frame-group. This value is constant during the entire duration of the current frame-group. The table 12 defines the values of this field PLS2_NEXT_AP_SIZE_CELL: This 15-bit field indicates the size (specified as the number of QAM cells) of the additional parity bits of the PLS2 in every frame of the next frame-group. This value is constant during the entire duration of the current frame-group.

RESERVED: This 32-bit field is reserved for future use.

CRC_32: A 32-bit error detection code, which is applied to the entire PLS1 signaling.

FIG. 14 illustrates PLS2 data according to an embodiment of the present invention.

FIG. 14 illustrates PLS2-STAT data of the PLS2 data. The PLS2-STAT data are the same within a frame-group, while the PLS2-DYN data provide information that is specific for the current frame.

The details of fields of the PLS2-STAT data are as follows:

FIC_FLAG: This 1-bit field indicates whether the FIC is used in the current frame-group. If this field is set to '1', the FIC is provided in the current frame. If this field set to '0', the FIC is not carried in the current frame. This value is constant during the entire duration of the current frame-group.

AUX_FLAG: This 1-bit field indicates whether the auxiliary stream(s) is used in the current frame-group. If this field is set to '1', the auxiliary stream is provided in the current frame. If this field set to the auxiliary stream is not carried in the current frame. This value is constant during the entire duration of current frame-group.

NUM_DP: This 6-bit field indicates the number of DPs carried within the current frame. The value of this field ranges from 1 to 64, and the number of DPs is NUM_DP+1.

DP_ID: This 6-bit field identifies uniquely a DP within a PHY profile.

DP_TYPE: This 3-bit field indicates the type of the DP. This is signaled according to the below table 13.

TABLE 13

| Value | DP Type |
|---|---|
| 000 | DP Type 1 |
| 001 | DP Type 2 |
| 010~111 | reserved |

DP_GROUP_ID: This 8-bit field identifies the DP group with which the current DP is associated. This can be used by a receiver to access the DPs of the service components associated with a particular service, which will have the same DP_GROUP_ID.

BASE_DP_ID: This 6-bit field indicates the DP carrying service signaling data (such as PSI/SI) used in the Management layer. The DP indicated by BASE_DP_ID may be either a normal DP carrying the service signaling data along with the service data or a dedicated DP carrying only the service signaling data DP_FEC_TYPE: This 2-bit field indicates the FEC type used by the associated DP. The FEC type is signaled according to the below table 14.

TABLE 14

| Value | FEC_TYPE |
|---|---|
| 00 | 16K LDPC |
| 01 | 64K LDPC |
| 10~11 | Reserved |

DP_COD: This 4-bit field indicates the code rate used by the associated DP. The code rate is signaled according to the below table 15.

TABLE 15

| Value | Code rate |
|---|---|
| 0000 | 5/15 |
| 0001 | 6/15 |
| 0010 | 7/15 |
| 0011 | 8/15 |
| 0100 | 9/15 |
| 0101 | 10/15 |
| 0110 | 11/15 |
| 0111 | 12/15 |
| 1000 | 13/15 |
| 1001~1111 | Reserved |

DP_COD: This 4-bit field indicates the modulation used by the associated DP. The modulation is signaled according to the below table 16.

TABLE 16

| Value | Modulation |
|---|---|
| 0000 | QPSK |
| 0001 | QAM-16 |
| 0010 | NUQ-64 |
| 0011 | NUQ-256 |
| 0100 | NUQ-1024 |
| 0101 | NUC-16 |
| 0110 | NUC-64 |
| 0111 | NUC-256 |
| 1000 | NUC-1024 |
| 1001~1111 | reserved |

DP_SSD_FLAG: This 1-bit field indicates whether the SSD mode is used in the associated DP. If this field is set to value '1', SSD is used. If this field is set to value '0', SSD is not used.

The following field appears only if PHY_PROFILE is equal to '010', which indicates the advanced profile:

DP_MIMO: This 3-bit field indicates which type of MIMO encoding process is applied to the associated DP. The type of MIMO encoding process is signaled according to the table 17.

TABLE 17

| Value | MIMO encoding |
|---|---|
| 000 | FR-SM |
| 001 | FRFD-SM |
| 010~111 | reserved |

DP_TI_TYPE: This 1-bit field indicates the type of time-interleaving. A value of '0' indicates that one TI group corresponds to one frame and contains one or more TI-blocks. A value of '1' indicates that one TI group is carried in more than one frame and contains only one TI-block.

DP_TI_LENGTH: The use of this 2-bit field (the allowed values are only 1, 2, 4, 8) is determined by the values set within the DP_TI_TYPE field as follows:

If the DP_TI_TYPE is set to the value '1', this field indicates PI, the number of the frames to which each TI group is mapped, and there is one TI-block per TI group (NTI=1). The allowed PI values with 2-bit field are defined in the below table 18.

If the DP_TI_TYPE is set to the value '0', this field indicates the number of TI-blocks NTI per TI group, and there is one TI group per frame (PI=1). The allowed PI values with 2-bit field are defined in the below table 18.

TABLE 18

| 2-bit field | $P_I$ | $N_{TI}$ |
|---|---|---|
| 00 | 1 | 1 |
| 01 | 2 | 2 |
| 10 | 4 | 3 |
| 11 | 8 | 4 |

DP_FRAME_INTERVAL: This 2-bit field indicates the frame interval (Imp) within the frame-group for the associated DP and the allowed values are 1, 2, 4, 8 (the corresponding 2-bit field is '00', '01', '10', or '11', respectively). For DPs that do not appear every frame of the frame-group, the value of this field is equal to the interval between successive frames. For example, if a DP appears on the frames 1, 5, 9, 13, etc., this field is set to '4'. For DPs that appear in every frame, this field is set to '1'.

DP_TI_BYPASS: This 1-bit field determines the availability of time interleaver 5050. If time interleaving is not used for a DP, it is set to '1'. Whereas if time interleaving is used it is set to '0'.

DP_FIRST_FRAME_IDX: This 5-bit field indicates the index of the first frame of the super-frame in which the current DP occurs. The value of DP_FIRST_FRAME_IDX ranges from 0 to 31

DPNUM_BLOCK_MAX: This 10-bit field indicates the maximum value of DP_NUM_BLOCKS for this DP. The value of this field has the same range as DP_NUM_BLOCKS.

DP_PAYLOAD_TYPE: This 2-bit field indicates the type of the payload data carried by the given DP. DP_PAYLOAD_TYPE is signaled according to the below table 19.

TABLE 19

| Value | Payload Type |
|---|---|
| 00 | TS. |
| 01 | IP |
| 10 | GS |
| 11 | reserved |

DP_INBAND_MODE: This 2-bit field indicates whether the current DP carries in-band signaling information. The in-band signaling type is signaled according to the below table 20.

TABLE 20

| Value | In-band mode |
|---|---|
| 00 | In-band signaling is not carried. |
| 01 | INBAND-PLS is carried only |
| 10 | INBAND-ISSY is carried only |
| 11 | INBAND-PLS and INBAND-ISSY are carried |

DP_PROTOCOL_TYPE: This 2-bit field indicates the protocol type of the payload carried by the given DP. It is signaled according to the below table 21 when input payload types are selected.

TABLE 21

| Value | If DP_PAYLOAD_TYPE Is TS | If DP_PAYLOAD_TYPE Is IP | If DP_PAYLOAD_TYPE Is GS |
|---|---|---|---|
| 00 | MPEG2-TS | IPv4 | (Note) |
| 01 | Reserved | IPv6 | Reserved |
| 10 | Reserved | Reserved | Reserved |
| 11 | Reserved | Reserved | Reserved |

DP_CRC_MODE: This 2-bit field indicates whether CRC encoding is used in the Input Formatting block. The CRC mode is signaled according to the below table 22.

TABLE 22

| Value | CRC mode |
|---|---|
| 00 | Not used |
| 01 | CRC-8 |
| 10 | CRC-16 |
| 11 | CRC-32 |

DNP_MODE: This 2-bit field indicates the null-packet deletion mode used by the associated DP when DP_PAYLOAD_TYPE is set to TS ('00'). DNP_MODE is signaled according to the below table 23. If DP_PAYLOAD_TYPE is not TS ('00'), DNP_MODE is set to the value '00'.

TABLE 23

| Value | Null-packet deletion mode |
|---|---|
| 00 | Not used |
| 01 | DNP-NORMAL |
| 10 | DNP-OFFSET |
| 11 | reserved |

ISSY_MODE: This 2-bit field indicates the ISSY mode used by the associated DP when DP_PAYLOAD_TYPE is set to TS ('00'). The ISSY_MODE is signaled according to the below table 24 If DP_PAYLOAD_TYPE is not TS ('00'), ISSY_MODE is set to the value '00'.

TABLE 24

| Value | ISSY mode |
|---|---|
| 00 | Not used |
| 01 | ISSY-UP |
| 10 | ISSY-BBF |
| 11 | reserved |

HC_MODE_TS: This 2-bit field indicates the TS header compression mode used by the associated DP when DP_PAYLOAD_TYPE is set to TS ('00'). The HC_MODE_TS is signaled according to the below table 25.

TABLE 25

| Value | Header compression mode |
|---|---|
| 00 | HC_MODE_TS 1 |
| 01 | HC_MODE_TS 2 |
| 10 | HC_MODE_TS 3 |
| 11 | HC_MODE_TS 4 |

HC_MODE_IP: This 2-bit field indicates the IP header compression mode when DP_PAYLOAD_TYPE is set to IP ('01'). The HC_MODE_IP is signaled according to the below table 26.

TABLE 26

| Value | Header compression mode |
|---|---|
| 00 | No compression |
| 01 | HC_MODE_IP 1 |
| 10~11 | reserved |

PID: This 13-bit field indicates the PID number for TS header compression when DP_PAYLOAD_TYPE is set to TS ('00') and HC_MODE_TS is set to '01' or '10'.

RESERVED: This 8-bit field is reserved for future use.

The following field appears only if FIC_FLAG is equal to '1':

FIC_VERSION: This 8-bit field indicates the version number of the FIC.

FIC_LENGTH_BYTE: This 13-bit field indicates the length, in bytes, of the FIC.

RESERVED: This 8-bit field is reserved for future use.

The following field appears only if AUX_FLAG is equal to

NUM_AUX: This 4-bit field indicates the number of auxiliary streams. Zero means no auxiliary streams are used.

AUX_CONFIG_RFU: This 8-bit field is reserved for future use.

AUX_STREAM_TYPE: This 4-bit is reserved for future use for indicating the type of the current auxiliary stream.

AUX_PRIVATE_CONFIG: This 28-bit field is reserved for future use for signaling auxiliary streams.

Figures 15, 16:
FIG. 15 illustrates PLS2 data according to another embodiment of the present invention.
FIG. 16 illustrates a logical structure of a frame according to an embodiment of the present invention.

FIG. 15 illustrates PLS2 data according to another embodiment of the present invention.

FIG. 15 illustrates PLS2-DYN data of the PLS2 data. The values of the PLS2-DYN data may change during the duration of one frame-group, while the size of fields remains constant.

The details of fields of the PLS2-DYN data are as follows:

FRAME INDEX: This 5-bit field indicates the frame index of the current frame within the super-frame. The index of the first frame of the super-frame is set to '0'.

PLS_CHANGE_COUNTER: This 4-bit field indicates the number of super-frames ahead where the configuration will change. The next super-frame with changes in the configuration is indicated by the value signaled within this field. If this field is set to the value '0000', it means that no scheduled change is foreseen: e.g., value '1' indicates that there is a change in the next super-frame.

FIC_CHANGE_COUNTER: This 4-bit field indicates the number of super-frames ahead where the configuration (i.e., the contents of the FIC) will change. The next super-frame with changes in the configuration is indicated by the value signaled within this field. If this field is set to the value '0000', it means that no scheduled change is foreseen: e.g. value '0001' indicates that there is a change in the next super-frame.

RESERVED: This 16-bit field is reserved for future use.

The following fields appear in the loop over NUM_DP, which describe the parameters associated with the DP carried in the current frame.

DP_ID: This 6-bit field indicates uniquely the DP within a PHY profile.

DP_START: This 15-bit (or 13-bit) field indicates the start position of the first of the DPs using the DPU addressing scheme. The DP_START field has differing length according to the PHY profile and FFT size as shown in the below table 27.

TABLE 27

| | DP_START field size | |
|---|---|---|
| PHY profile | 64K | 16K |
| Base | 13 bit | 15 bit |
| Handheld | — | 13 bit |
| Advanced | 13 bit | 15 bit |

DP_NUM_BLOCK: This 10-bit field indicates the number of FEC blocks in the current TI group for the current DP. The value of DP_NUM_BLOCK ranges from 0 to 1023

RESERVED: This 8-bit field is reserved for future use.

The following fields indicate the FIC parameters associated with the EAC.

EAC_FLAG: This 1-bit field indicates the existence of the EAC in the current frame. This bit is the same value as the EAC_FLAG in the preamble.

EAS_WAKE_UP_VERSION_NUM: This 8-bit field indicates the version number of a wake-up indication.

If the EAC_FLAG field is equal to '1', the following 12 bits are allocated for EAC_LENGTH_BYTE field. If the EAC_FLAG field is equal to '0', the following 12 bits are allocated for EAC_COUNTER.

EAC_LENGTH_BYTE: This 12-bit field indicates the length, in byte, of the EAC.

EAC_COUNTER: This 12-bit field indicates the number of the frames before the frame where the EAC arrives.

The following field appears only if the AUX_FLAG field is equal to '1':

AUX_PRIVATE_DYN: This 48-bit field is reserved for future use for signaling auxiliary streams. The meaning of this field depends on the value of AUX_STREAM_TYPE in the configurable PLS2-STAT.

CRC_32: A 32-bit error detection code, which is applied to the entire PLS2.

FIG. 16 illustrates a logical structure of a frame according to an embodiment of the present invention.

As above mentioned, the PLS, EAC, FIC, DPs, auxiliary streams and dummy cells are mapped into the active carriers of the OFDM symbols in the frame. The PLS1 and PLS2 are first mapped into one or more FSS(s). After that, EAC cells, if any, are mapped immediately following the PLS field, followed next by FIC cells, if any. The DPs are mapped next after the PLS or EAC, FIC, if any. Type 1 DPs follows first, and Type 2 DPs next. The details of a type of the DP will be described later. In some case, DPs may carry some special data for EAS or service signaling data. The auxiliary stream or streams, if any, follow the DPs, which in turn are followed by dummy cells. Mapping them all together in the above mentioned order, i.e. PLS, EAC, FIC, DPs, auxiliary streams and dummy data cells exactly fill the cell capacity in the frame.

Figure 17:
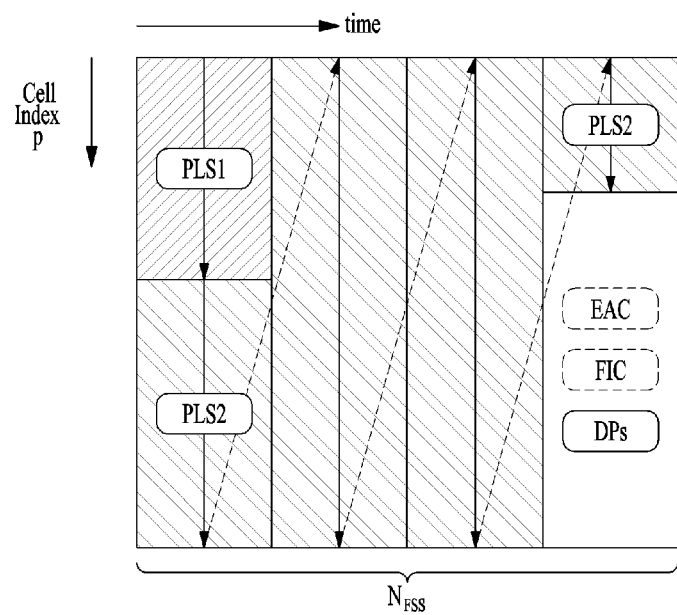
FIG. 17 illustrates PLS mapping according to an embodiment of the present invention.

FIG. 17 illustrates PLS mapping according to an embodiment of the present invention.

PLS cells are mapped to the active carriers of FSS(s). Depending on the number of cells occupied by PLS, one or more symbols are designated as FSS(s), and the number of FSS(s) $N_{FSS}$ is signaled by NUM_FSS in PLS1. The FSS is a special symbol for carrying PLS cells. Since robustness and latency are critical issues in the PLS, the FSS(s) has higher density of pilots allowing fast synchronization and frequency-only interpolation within the FSS.

PLS cells are mapped to active carriers of the $N_{FSS}$ FSS(s) in a top-down manner as shown in an example in FIG. 17. The PLS1 cells are mapped first from the first cell of the first FSS in an increasing order of the cell index. The PLS2 cells follow immediately after the last cell of the PLS1 and mapping continues downward until the last cell index of the first FSS. If the total number of required PLS cells exceeds the number of active carriers of one FSS, mapping proceeds to the next FSS and continues in exactly the same manner as the first FSS.

After PLS mapping is completed, DPs are carried next. If EAC, FIC or both are present in the current frame, they are placed between PLS and "normal" DPs.

Figure 18:
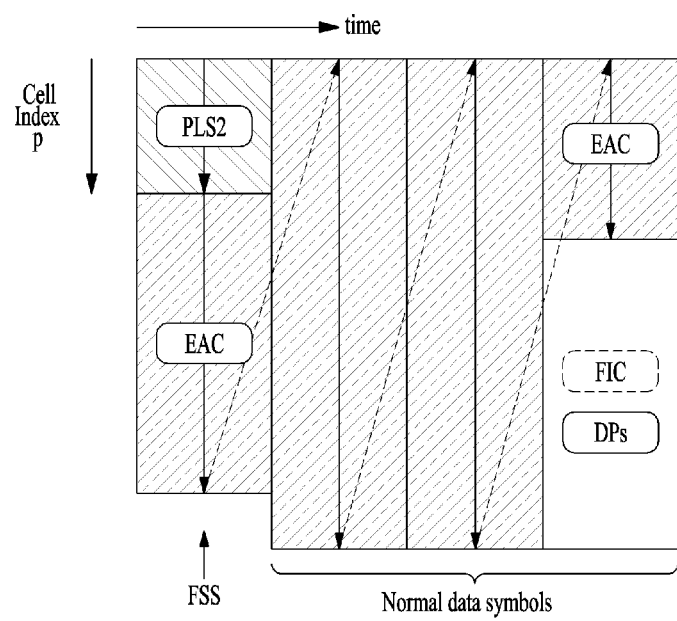
FIG. 18 illustrates EAC mapping according to an embodiment of the present invention.

FIG. 18 illustrates EAC mapping according to an embodiment of the present invention.

EAC is a dedicated channel for carrying EAS messages and links to the DPs for EAS. EAS support is provided but EAC itself may or may not be present in every frame. EAC, if any, is mapped immediately after the PLS2 cells. EAC is not preceded by any of the FIC, DPs, auxiliary streams or dummy cells other than the PLS cells. The procedure of mapping the EAC cells is exactly the same as that of the PLS.

The EAC cells are mapped from the next cell of the PLS2 in increasing order of the cell index as shown in the example in FIG. 18. Depending on the EAS message size, EAC cells may occupy a few symbols, as shown in FIG. 18.

EAC cells follow immediately after the last cell of the PLS2, and mapping continues downward until the last cell index of the last FSS. If the total number of required EAC cells exceeds the number of remaining active carriers of the last FSS mapping proceeds to the next symbol and continues in exactly the same manner as FSS(s). The next symbol for mapping in this case is the normal data symbol, which has more active carriers than a FSS.

After EAC mapping is completed, the FIC is carried next, if any exists. If FIC is not transmitted (as signaled in the PLS2 field), DPs follow immediately after the last cell of the EAC.

Figure 19:
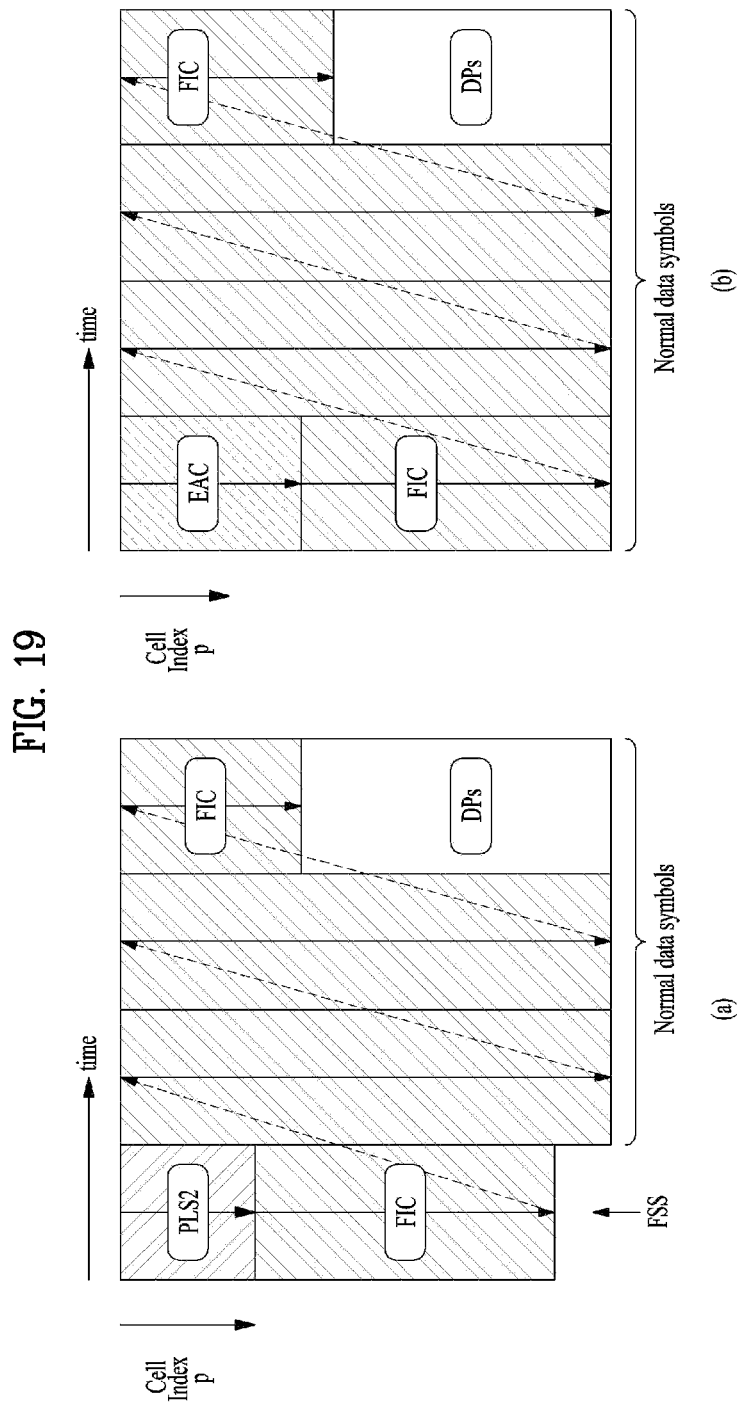
FIG. 19 illustrates FIC mapping according to an embodiment of the present invention.

FIG. 19 illustrates FIC mapping according to an embodiment of the present invention.

shows an example mapping of FIC cell without EAC and (b) shows an example mapping of FIC cell with EAC.

FIC is a dedicated channel for carrying cross-layer information to enable fast service acquisition and channel scanning. This information primarily includes channel binding information between DPs and the services of each broadcaster. For fast scan, a receiver can decode FIC and obtain information such as broadcaster ID, number of services, and BASE_DP_ID. For fast service acquisition, in addition to FIC, base DP can be decoded using BASE_DP_ID. Other than the content it carries, a base DP is encoded and mapped to a frame in exactly the same way as a normal DP. Therefore, no additional description is required for a base DP. The FIC data is generated and consumed in the Management Layer. The content of FIC data is as described in the Management Layer specification.

The FIC data is optional and the use of FIC is signaled by the FIC_FLAG parameter in the static part of the PLS2. If FIC is used, FIC_FLAG is set to '1' and the signaling field for FIC is defined in the static part of PLS2. Signaled in this field are FIC_VERSION, and FIC_LENGTH_BYTE. FIC uses the same modulation, coding and time interleaving parameters as PLS2. FIC shares the same signaling parameters such as PLS2_MOD and PLS2_FEC. FIC data, if any, is mapped immediately after PLS2 or EAC if any. FIC is not preceded by any normal DPs, auxiliary streams or dummy cells. The method of mapping FIC cells is exactly the same as that of EAC which is again the same as PLS.

Without EAC after PLS, FIC cells are mapped from the next cell of the PLS2 in an increasing order of the cell index as shown in an example in (a). Depending on the FIC data size, FIC cells may be mapped over a few symbols, as shown in (b).

FIC cells follow immediately after the last cell of the PLS2, and mapping continues downward until the last cell index of the last FSS. If the total number of required FIC cells exceeds the number of remaining active carriers of the last FSS, mapping proceeds to the next symbol and continues in exactly the same manner as FSS(s). The next symbol for mapping in this case is the normal data symbol which has more active carriers than a FSS.

If EAS messages are transmitted in the current frame, EAC precedes FIC, and FIC cells are mapped from the next cell of the EAC in an increasing order of the cell index as shown in (b).

After FIC mapping is completed, one or more DPs are mapped, followed by auxiliary streams, if any, and dummy cells.

Figure 20:
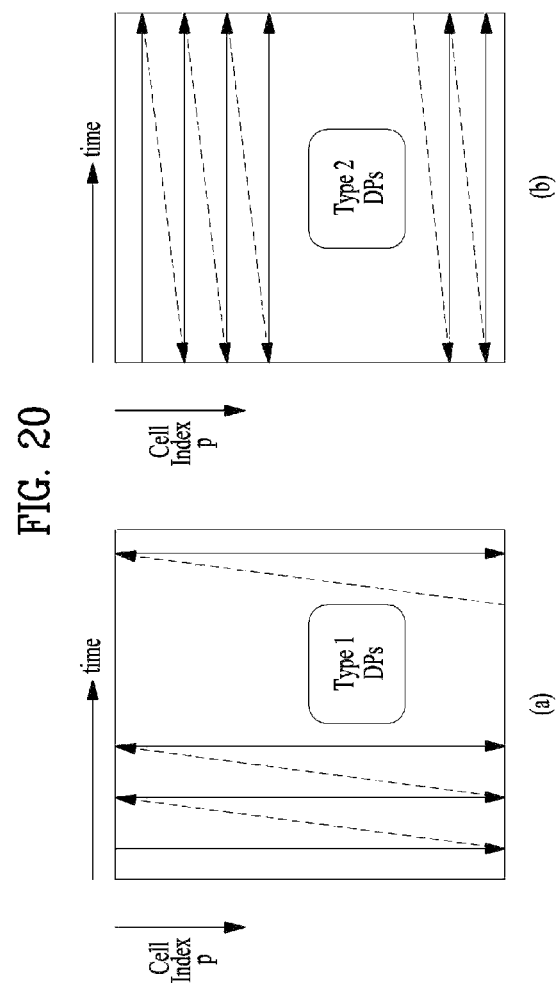
FIG. 20 illustrates a type of DP according to an embodiment of the present invention.

FIG. 20 illustrates a type of DP according to an embodiment of the present invention.

FIG. 20 shows type 1 DP and (b) shows type 2 DP.

After the preceding channels, i.e., PLS, EAC and FIC, are mapped, cells of the DPs are mapped. A DP is categorized into one of two types according to mapping method:

Type 1 DP: DP is mapped by TDM
Type 2 DP: DP is mapped by FDM

The type of DP is indicated by DP_TYPE field in the static part of PLS2. FIG. 20 illustrates the mapping orders of Type 1 DPs and Type 2 DPs. Type 1 DPs are first mapped in the increasing order of cell index, and then after reaching the last cell index, the symbol index is increased by one. Within the next symbol, the DP continues to be mapped in the increasing order of cell index starting from $\rho=0$. With a number of DPs mapped together in one frame, each of the Type 1 DPs are grouped in time, similar to TDM multiplexing of DPs.

Type 2 DPs are first mapped in the increasing order of symbol index, and then after reaching the last OFDM symbol of the frame, the cell index increases by one and the symbol index rolls back to the first available symbol and then increases from that symbol index. After mapping a number of DPs together in one frame, each of the Type 2 DPs are grouped in frequency together, similar to FDM multiplexing of DPs.

Type 1 DPs and Type 2 DPs can coexist in a frame if needed with one restriction; Type 1 DPs always precede Type 2 DPs. The total number of OFDM cells carrying Type 1 and Type 2 DPs cannot exceed the total number of OFDM cells available for transmission of DPs:

$$D_{DP1}+D_{DP2} \leq D_{DP} \quad \text{[Math Figure 2]}$$

where $D_{DP1}$ is the number of OFDM cells occupied by Type 1 DPs, $D_{DP2}$ is the number of cells occupied by Type 2 DPs. Since PLS, EAC, FIC are all mapped in the same way as Type 1 DP, they all follow "Type 1 mapping rule". Hence, overall, Type 1 mapping always precedes Type 2 mapping.

Figure 21:
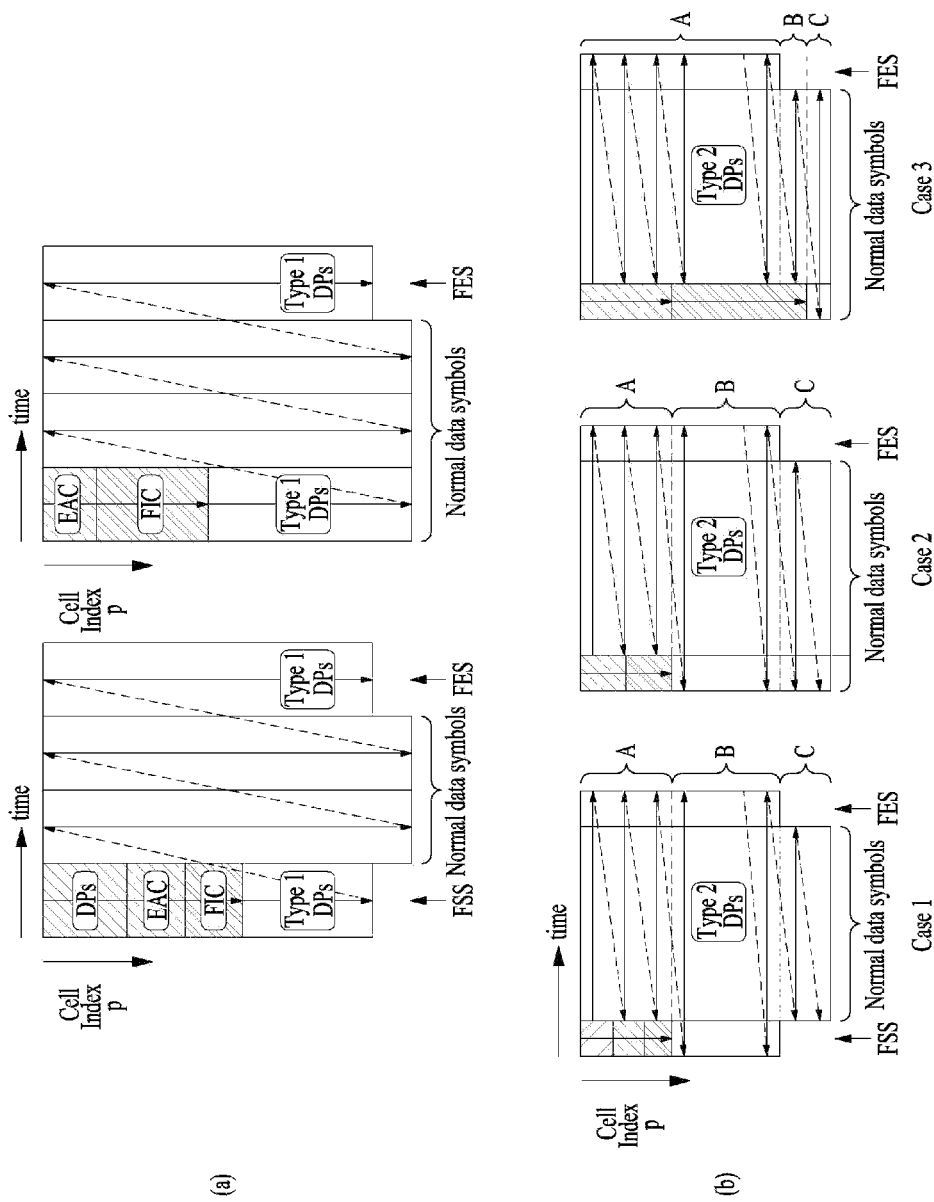
FIG. 21 illustrates DP mapping according to an embodiment of the present invention.

FIG. 21 illustrates DP mapping according to an embodiment of the present invention.

(a) shows an addressing of OFDM cells for mapping type 1 DPs and (b) shows an addressing of OFDM cells for mapping for type 2 DPs.

Addressing of OFDM cells for mapping Type 1 DPs $(0, \ldots, D_{DP1}-1)$ is defined for the active data cells of Type 1 DPs. The addressing scheme defines the order in which the cells from the TIs for each of the Type 1 DPs are allocated to the active data cells. It is also used to signal the locations of the DPs in the dynamic part of the PLS2.

Without EAC and FIC, address 0 refers to the cell immediately following the last cell carrying PLS in the last FSS. If EAC is transmitted and FIC is not in the corresponding frame, address 0 refers to the cell immediately following the last cell carrying EAC. If FIC is transmitted in the corresponding frame, address 0 refers to the cell immediately following the last cell carrying FIC. Address 0 for Type 1 DPs can be calculated considering two different cases as shown in (a). In the example in (a), PLS, EAC and FIC are assumed to be all transmitted. Extension to the cases where either or both of EAC and FIC are omitted is straightforward. If there are remaining cells in the FSS after mapping all the cells up to FIC as shown on the left side of (a).

Addressing of OFDM cells for mapping Type 2 DPs $(0, \ldots, D_{DP2}-1)$ is defined for the active data cells of Type 2 DPs. The addressing scheme defines the order in which the cells from the TIs for each of the Type 2 DPs are allocated to the active data cells. It is also used to signal the locations of the DPs in the dynamic part of the PLS2.

Three slightly different cases are possible as shown in (b). For the first case shown on the left side of (b), cells in the last FSS are available for Type 2 DP mapping. For the second case shown in the middle, FIC occupies cells of a normal symbol, but the number of FIC cells on that symbol is not larger than $C_{FSS}$. The third case, shown on the right side in (b), is the same as the second case except that the number of FIC cells mapped on that symbol exceeds $C_{FSS}$.

The extension to the case where Type 1 DP(s) precede Type 2 DP(s) is straightforward since PLS, EAC and FIC follow the same "Type 1 mapping rule" as the Type 1 DP(s).

A data pipe unit (DPU) is a basic unit for allocating data cells to a DP in a frame.

A DPU is defined as a signaling unit for locating DPs in a frame. A cell Mapper 7010 may map the cells produced by the TIs for each of the DPs. A Time interleaver 5050 outputs a series of TI-blocks and each TI-block comprises a variable number of XFECBLOCKs which is in turn composed of a set of cells. The number of cells in an XFECBLOCK, $N_{cells}$, is dependent on the FECBLOCK size, $N_{ldpc}$, and the number of transmitted bits per constellation symbol. A DPU is defined as the greatest common divisor of all possible values of the number of cells in a XFECBLOCK, $N_{cells}$, supported in a given PHY profile. The length of a DPU in cells is defined as $L_{DPU}$. Since each PHY profile supports different combinations of FECBLOCK size and a different number of bits per constellation symbol, $L_{DPU}$ is defined on a PHY profile basis.

Figure 22:
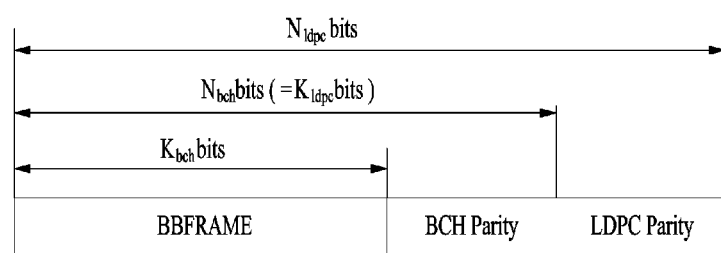
FIG. 22 illustrates an FEC structure according to an embodiment of the present invention.

FIG. 22 illustrates an FEC structure according to an embodiment of the present invention.

FIG. 22 illustrates an FEC structure according to an embodiment of the present invention before bit interleaving. As above mentioned, Data FEC encoder may perform the FEC encoding on the input BBF to generate FECBLOCK procedure using outer coding (BCH), and inner coding (LDPC). The illustrated FEC structure corresponds to the FECBLOCK. Also, the FECBLOCK and the FEC structure have same value corresponding to a length of LDPC codeword.

The BCH encoding is applied to each BBF ($K_{bch}$ bits), and then LDPC encoding is applied to BCH-encoded BBF ($K_{ldpc}$ bits=$N_{bch}$ bits) as illustrated in FIG. 22.

The value of $N_{ldpc}$ is either 64800 bits (long FECBLOCK) or 16200 bits (short FECBLOCK).

The below table 28 and table 29 show FEC encoding parameters for a long FECBLOCK and a short FECBLOCK, respectively.

TABLE 28

| LDPC Rate | $N_{ldpc}$ | $K_{ldpc}$ | $K_{bch}$ | BCH error correction capability | $N_{bch} - K_{bch}$ |
|---|---|---|---|---|---|
| 5/15 | 64800 | 21600 | 21408 | 12 | 192 |
| 6/15 | | 25920 | 25728 | | |
| 7/15 | | 30240 | 30048 | | |
| 8/15 | | 34560 | 34368 | | |
| 9/15 | | 38880 | 38688 | | |
| 10/15 | | 43200 | 43008 | | |
| 11/15 | | 47520 | 47328 | | |
| 12/15 | | 51840 | 51648 | | |
| 13/15 | | 56160 | 55968 | | |

TABLE 29

| LDPC Rate | $N_{ldpc}$ | $K_{ldpc}$ | $K_{bch}$ | BCH error correction capability | $N_{bch} - K_{bch}$ |
|---|---|---|---|---|---|
| 5/15 | 16200 | 5400 | 5232 | 12 | 168 |
| 6/15 | | 6480 | 6312 | | |
| 7/15 | | 7560 | 7392 | | |
| 8/15 | | 8640 | 8472 | | |
| 9/15 | | 9720 | 9552 | | |
| 10/15 | | 10800 | 10632 | | |
| 11/15 | | 11880 | 11712 | | |
| 12/15 | | 12960 | 12792 | | |
| 13/15 | | 14040 | 13872 | | |

The details of operations of the BCH encoding and LDPC encoding are as follows:

A 12-error correcting BCH code is used for outer encoding of the BBF. The BCH generator polynomial for short FECBLOCK and long FECBLOCK are obtained by multiplying together all polynomials.

LDPC code is used to encode the output of the outer BCH encoding. To generate a completed $B_{ldpc}$ (FECBLOCK), $P_{ldpc}$ (parity bits) is encoded systematically from each $I_{ldpc}$ (BCH-encoded BBF), and appended to $I_{ldpc}$. The completed $B_{ldpc}$ (FECBLOCK) are expressed as follow Math figure.

$$B_{ldpc}=[I_{ldpc}P_{ldpc}]=[i_0,i_1,\ldots,i_{K_{ldpc}-1},p_0,p_1,\ldots,p_{N_{ldpc}-K_{ldpc}-1}]$$ [Math Figure 3]

The parameters for long FECBLOCK and short FECBLOCK are given in the above table 28 and 29, respectively.

The detailed procedure to calculate $N_{ldpc}-K_{ldpc}$ parity bits for long FECBLOCK, is as follows:

1) Initialize the parity bits, $$p_0=p_1=p_2=\ldots=p_{N_{ldpc}-K_{ldpc}-1}=0$$ [Math Figure 4]

2) Accumulate the first information bit—i0, at parity bit addresses specified in the first row of an addresses of parity check matrix. The details of addresses of parity check matrix will be described later. For example, for rate 13/15:

$$p_{983} = p_{983} \oplus i_0 \quad p_{2815} = p_{2815} \oplus i_0$$ [Math Figure 5]

$$p_{4837} = p_{4837} \oplus i_0 \quad p_{4989} = p_{4989} \oplus i_0$$

$$p_{6138} = p_{6138} \oplus i_0 \quad p_{6458} = p_{6458} \oplus i_0$$

$$p_{6921} = p_{6921} \oplus i_0 \quad p_{6974} = p_{6974} \oplus i_0$$

$$p_{7572} = p_{7572} \oplus i_0 \quad p_{8260} = p_{8260} \oplus i_0$$

$$p_{8496} = p_{8496} \oplus i_0$$

3) For the next 359 information bits, is, s=1, 2, . . . , 359 accumulate is at parity bit addresses using following Math figure.

$$\{x+(s \bmod 360) \times Q_{ldpc}\} \bmod(N_{ldpc}-K_{ldpc}) \quad \text{[Math Figure 6]}$$

where x denotes the address of the parity bit accumulator corresponding to the first bit i0, and $Q_{ldpc}$ is a code rate dependent constant specified in the addresses of parity check matrix. Continuing with the example, $Q_{ldpc}$=24 for rate 13/15, so for information bit i1, the following operations are performed:

$$p_{1007} = p_{1007} \oplus i_1 \quad p_{2839} = p_{2839} \oplus i_1 \quad \text{[Math Figure 7]}$$
$$p_{4861} = p_{4861} \oplus i_1 \quad p_{5013} = p_{5013} \oplus i_1$$
$$p_{6162} = p_{6162} \oplus i_1 \quad p_{6482} = p_{6482} \oplus i_1$$
$$p_{6945} = p_{6945} \oplus i_1 \quad p_{6998} = p_{6998} \oplus i_1$$
$$p_{7596} = p_{7596} \oplus i_1 \quad p_{8284} = p_{8284} \oplus i_1$$
$$p_{8520} = p_{8520} \oplus i_1$$

4) For the 361st information bit $i_{360}$, the addresses of the parity bit accumulators are given in the second row of the addresses of parity check matrix. In a similar manner the addresses of the parity bit accumulators for the following 359 information bits is, s=361, 362, . . . , 719 are obtained using the Math Figure 6, where x denotes the address of the parity bit accumulator corresponding to the information bit $i_{360}$, i.e., the entries in the second row of the addresses of parity check matrix.

5) In a similar manner, for every group of 360 new information bits, a new row from addresses of parity check matrixes used to find the addresses of the parity bit accumulators.

After all of the information bits are exhausted, the final parity bits are obtained as follows:

6) Sequentially perform the following operations starting with i=1

$$p_i = p_i \oplus p_{i-1}, i=1,2, \ldots, N_{ldpc}-K_{ldpc}-1 \quad \text{[Math Figure 8]}$$

where final content of pi, i=0, 1, . . . $N_{ldpc}$, $-K_{ldpc}-1$ is equal to the parity bit $p_i$.

TABLE 30

| Code Rate | $Q_{ldpc}$ |
|---|---|
| 5/15 | 120 |
| 6/15 | 108 |
| 7/15 | 96 |
| 8/15 | 84 |
| 9/15 | 72 |
| 10/15 | 60 |
| 11/15 | 48 |
| 12/15 | 36 |
| 13/15 | 24 |

This LDPC encoding procedure for a short FECBLOCK is in accordance with t LDPC encoding procedure for the long FECBLOCK, except replacing the table 30 with table 31, and replacing the addresses of parity check matrix for the long FECBLOCK with the addresses of parity check matrix for the short FECBLOCK.

TABLE 31

| Code Rate | $Q_{ldpc}$ |
|---|---|
| 5/15 | 30 |
| 6/15 | 27 |
| 7/15 | 24 |
| 8/15 | 21 |
| 9/15 | 18 |
| 10/15 | 15 |
| 11/15 | 12 |
| 12/15 | 9 |
| 13/15 | 6 |

Figure 23:
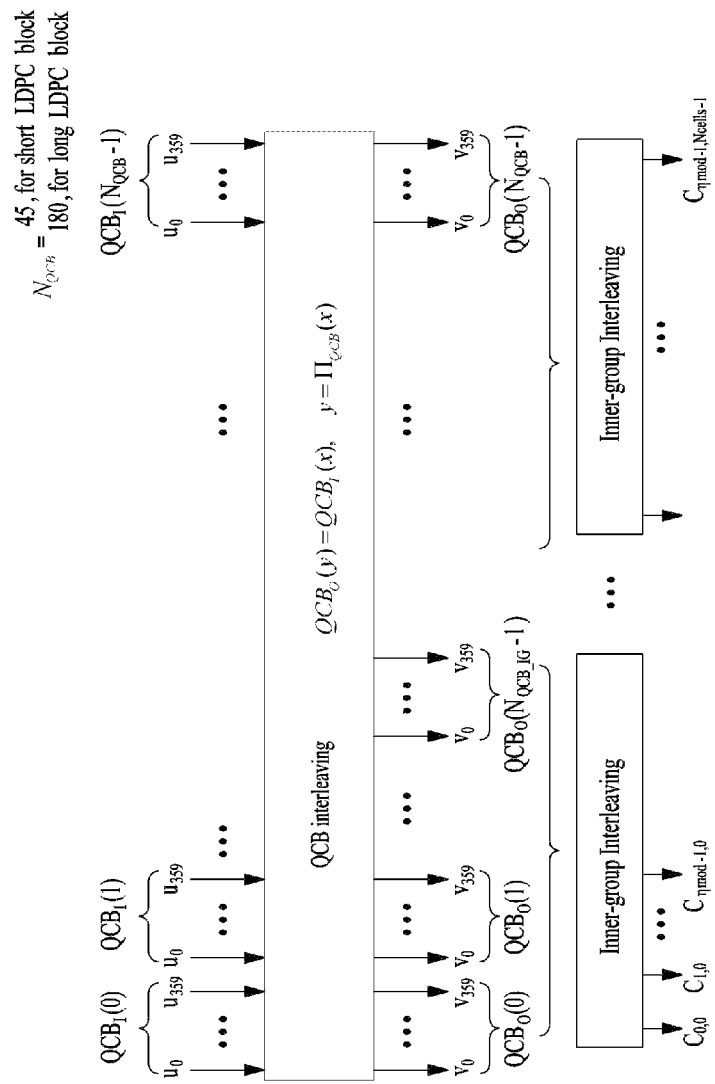
FIG. 23 illustrates a bit interleaving according to an embodiment of the present invention.

FIG. 23 illustrates a bit interleaving according to an embodiment of the present invention.

The outputs of the LDPC encoder are bit-interleaved, which consists of parity interleaving followed by Quasi-Cyclic Block (QCB) interleaving and inner-group interleaving.

shows Quasi-Cyclic Block (QCB) interleaving and (b) shows inner-group interleaving.

The FECBLOCK may be parity interleaved. At the output of the parity interleaving, the LDPC codeword consists of 180 adjacent QC blocks in a long FECBLOCK and 45 adjacent QC blocks in a short FECBLOCK. Each QC block in either a long or short FECBLOCK consists of 360 bits. The parity interleaved LDPC codeword is interleaved by QCB interleaving. The unit of QCB interleaving is a QC block. The QC blocks at the output of parity interleaving are permutated by QCB interleaving as illustrated in FIG. 23, where $N_{cells}$=64800/η mod or 16200/η mod according to the FECBLOCK length. The QCB interleaving pattern is unique to each combination of modulation type and LDPC code rate.

After QCB interleaving, inner-group interleaving is performed according to modulation type and order (η mod) which is defined in the below table 32. The number of QC blocks for one inner-group, $N_{QCB\_IG}$, is also defined.

TABLE 32

| Modulation type | $η_{mod}$ | $N_{QCB\_IG}$ |
|---|---|---|
| QAM-16 | 4 | 2 |
| NUC-16 | 4 | 4 |
| NUQ-64 | 6 | 3 |
| NUC-64 | 6 | 6 |
| NUQ-256 | 8 | 4 |
| NUC-256 | 8 | 8 |
| NUQ-1024 | 10 | 5 |
| NUC-1024 | 10 | 10 |

The inner-group interleaving process is performed with $N_{QCB\_IG}$ QC blocks of the QCB interleaving output. Inner-group interleaving has a process of writing and reading the bits of the inner-group using 360 columns and $N_{QCB\_IG}$ rows. In the write operation, the bits from the QCB interleaving output are written row-wise. The read operation is performed column-wise to read out m bits from each row, where m is equal to 1 for NUC and 2 for NUQ.

Figure 24:
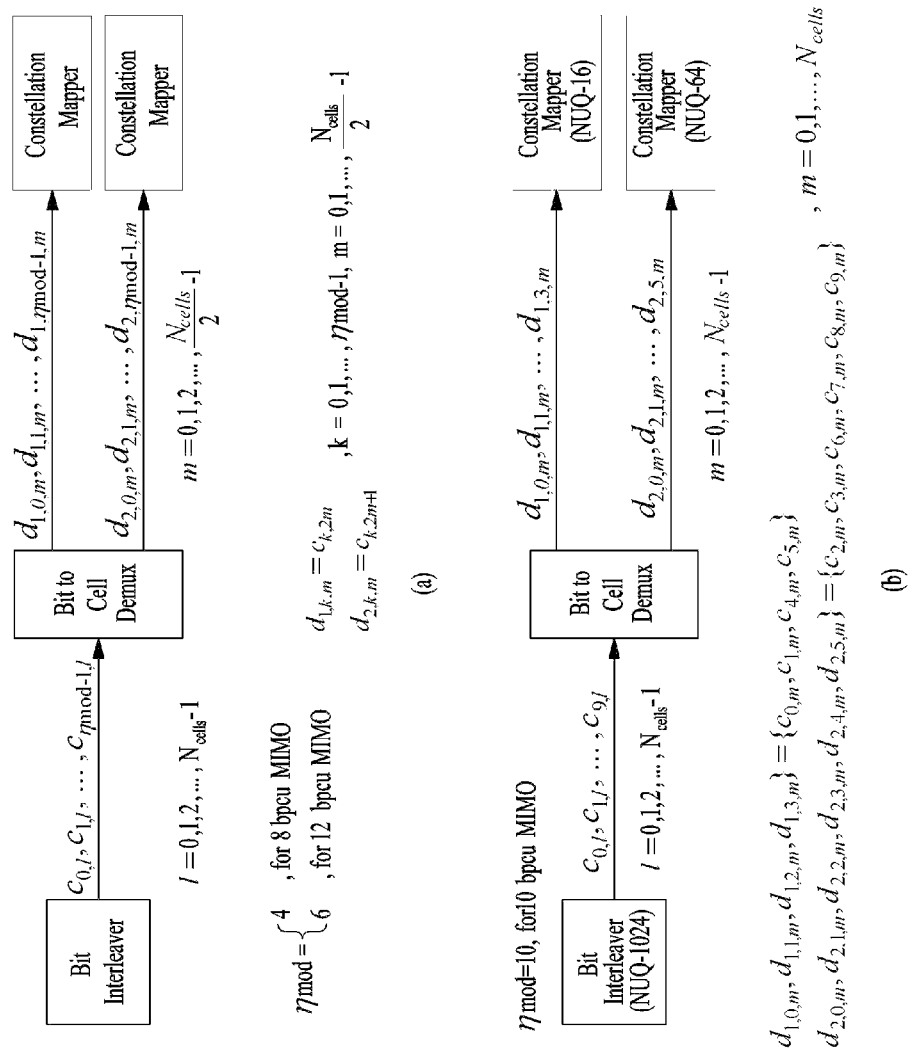
FIG. 24 illustrates a cell-word demultiplexing according to an embodiment of the present invention.

FIG. 24 illustrates a cell-word demultiplexing according to an embodiment of the present invention.

(a) shows a cell-word demultiplexing for 8 and 12 bpcu MIMO and (b) shows a cell-word demultiplexing for 10 bpcu MIMO.

Each cell word (c0,1, c1,1, . . . , c η mod mod−1,1) of the bit interleaving output is demultiplexed into (d1,0,m, d1,1, m . . . , d1, η mod mod−1,m) and (d2,0,m, d2,1,m . . . , d2, η mod mod−1,m) as shown in (a), which describes the cell-word demultiplexing process for one XFECBLOCK.

For the 10 bpcu MIMO case using different types of NUQ for MIMO encoding, the Bit Interleaver for NUQ-1024 is re-used. Each cell word (c0,1, c1,1, . . . , c9,1) of the Bit Interleaver output is demultiplexed into (d1,0,m, d1,1, m . . . , d1,3,m) and (d2,0,m, d2,1,m . . . , d2,5,m), as shown in (b).

Figure 25:
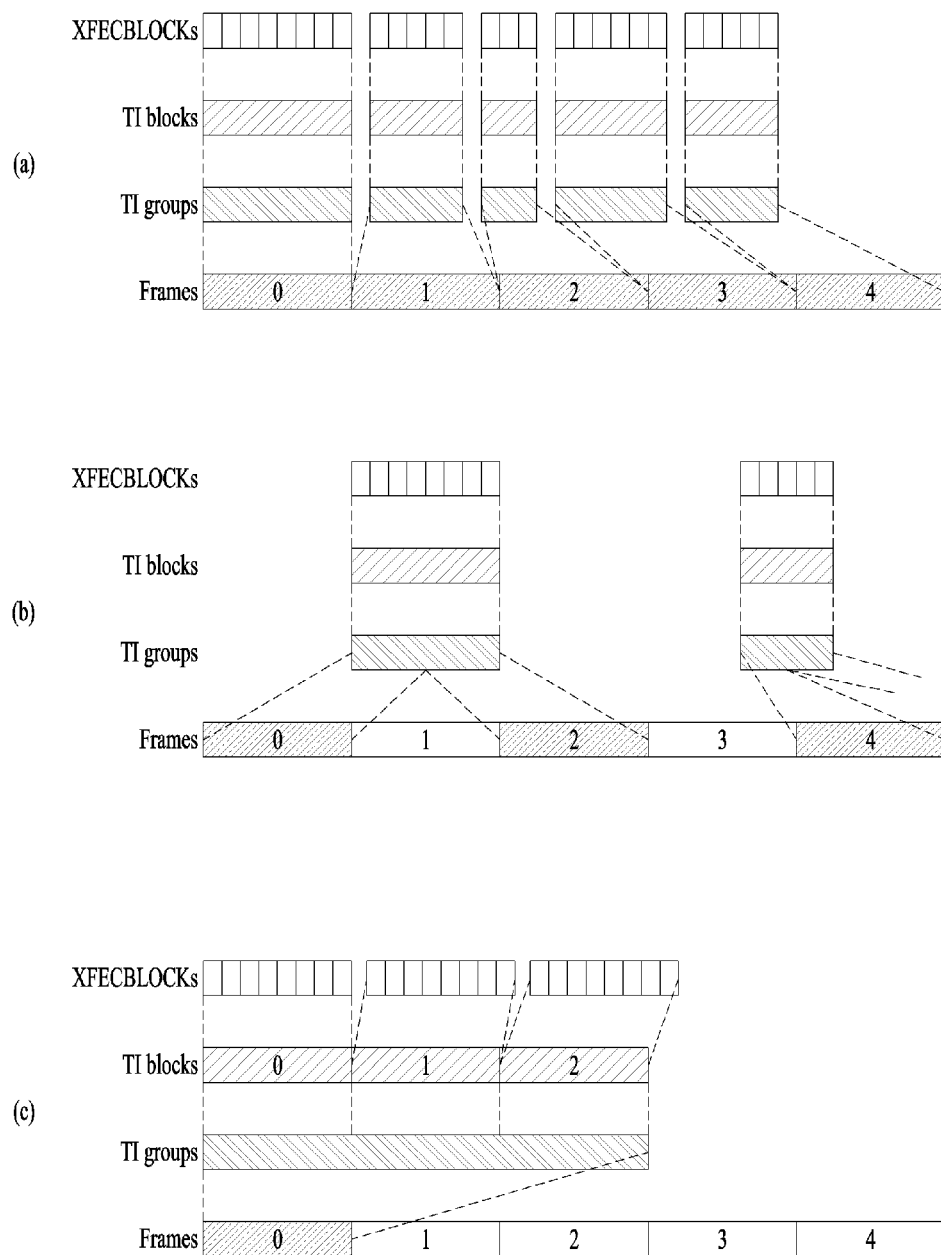
FIG. 25 illustrates a time interleaving according to an embodiment of the present invention.

FIG. 25 illustrates a time interleaving according to an embodiment of the present invention.

to (c) show examples of TI mode.

The time interleaver operates at the DP level. The parameters of time interleaving (TI) may be set differently for each DP.

The following parameters, which appear in part of the PLS2-STAT data, configure the TI:

DP_TI_TYPE (allowed values: 0 or 1): Represents the TI mode; '0' indicates the mode with multiple TI blocks (more than one TI block) per TI group. In this case, one TI group is directly mapped to one frame (no inter-frame interleaving). '1' indicates the mode with only one TI block per TI group. In this case, the TI block may be spread over more than one frame (inter-frame interleaving).

DP_TI_LENGTH: If DP_TI_TYPE='0', this parameter is the number of TI blocks NTI per TI group. For DP_TI_TYPE='1', this parameter is the number of frames PI spread from one TI group.

DP_NUM_BLOCK_MAX (allowed values: 0 to 1023): Represents the maximum number of XFECBLOCKs per TI group.

DP_FRAME_INTERVAL (allowed values: 1, 2, 4, 8): Represents the number of the frames IJUMP between two successive frames carrying the same DP of a given PHY profile.

DP_TI_BYPASS (allowed values: 0 or 1): If time interleaving is not used for a DP, this parameter is set to '1'. It is set to '0' if time interleaving is used.

Additionally, the parameter DP_NUM_BLOCK from the PLS2-DYN data is used to represent the number of XFECBLOCKs carried by one TI group of the DP.

When time interleaving is not used for a DP, the following TI group, time interleaving operation, and TI mode are not considered. However, the Delay Compensation block for the dynamic configuration information from the scheduler will still be required. In each DP, the XFECBLOCKs received from the SSD/MIMO encoding are grouped into TI groups. That is, each TI group is a set of an integer number of XFECBLOCKs and will contain a dynamically variable number of XFECBLOCKs. The number of XFECBLOCKs in the TI group of index n is denoted by $N_{xBLOCK\_Group}(n)$ and is signaled as DP_NUM_BLOCK in the PLS2-DYN data. Note that $N_{xBLOCK\_Group}(n)$ may vary from the minimum value of 0 to the maximum value $N_{xBLOCK\_Group\_MAX}$ (corresponding to DP_NUM_BLOCK_MAX) of which the largest value is 1023.

Each TI group is either mapped directly onto one frame or spread over PI frames. Each TI group is also divided into more than one TI blocks(NTI), where each TI block corresponds to one usage of time interleaver memory. The TI blocks within the TI group may contain slightly different numbers of XFECBLOCKs. If the TI group is divided into multiple TI blocks, it is directly mapped to only one frame. There are three options for time interleaving (except the extra option of skipping the time interleaving) as shown in the below table 33.

TABLE 33

| Modes | Descriptions |
| --- | --- |
| Option-1 | Each TI group contains one TI block and is mapped directly to one frame as shown in (a). This option is signaled in the PLS2-STAT by DP_TI_TYPE = '0' and DP_TI_LENGTH = '1'($N_{TI}$ = 1). |
| Option-2 | Each TI group contains one TI block and is mapped to more than one frame. (b) shows an example, where one TI group is mapped to two frames, i.e., DP_TI_LENGTH = '2' ($P_t$ = 2) and DP_FRAME_INTERVAL ($I_{JUMP}$ = 2). This provides greater time diversity for low data-rate services. This option is signaled in the PLS2-STAT by DP_TI_TYPE = '1'. |
| Option-3 | Each TI group is divided into multiple TI blocks and is mapped directly to one frame as shown in (c). Each TI block may use full TI memory, so as to provide the maximum bit-rate for a DP. This option is signaled in the PLS2-STAT signaling by DP_TI_TYPE = '0' and DP_TI_LENGTH = $N_{TI}$, while $P_1$ = 1. |

In each DP, the TI memory stores the input XFECBLOCKs (output XFECBLOCKs from the SSD/MIMO encoding block). Assume that input XFECBLOCKs are defined as $$(d_{n,s,0,0}, d_{n,s,0,1}, \ldots, d_{n,s,0,N_{cells}-1}, d_{n,s,1,0}, \ldots, d_{n,s,1,N_{cells}-1},$$
$$\ldots, d_{n,s,N_{xBLOCK\_TI}(n,s)-1,0}, \ldots, d_{n,s,N_{xBLOCK\_TI}(n,s)-1,N_{cells}-1}),$$

where $d_{n,s,r,q}$ is the $q_{th}$ cell of the $r^{th}$ XFECBLOCK in the $s^{th}$ TI block of the $n^{th}$ TI group and represents the outputs of SSD and MIMO encodings as follows $$d_{n,s,r,q} = \begin{cases} f_{n,s,r,q} & \text{, the output of } SSD \ldots \text{ encoding} \\ g_{n,s,r,q} & \text{, the output of } MMO \text{ encoding} \end{cases}$$

In addition, assume that output XFECBLOCKs from the time interleaver 5050 are defined as $$(h_{n,s,0}, h_{n,s,1}, \ldots, h_{n,s,i}, \ldots, h_{n,s,N_{xBLOCK\_TI}(n,s) \times N_{cells}-1})$$

where $h_{n,s,i}$ is the $i^{th}$ output cell (for i=0, . . . , $N_{xBOCK\_TI}$ (n,s)×$N_{cells}$−1) in the $s^{th}$ TI block of the $n^{th}$ TI group.

Typically, the time interleaver will also act as a buffer for DP data prior to the process of frame building. This is achieved by means of two memory banks for each DP. The first TI-block is written to the first bank. The second TI-block is written to the second bank while the first bank is being read from and so on.

The TI is a twisted row-column block interleaver. For the $s^{th}$ TI block of the $n^{th}$ TI group, the number of rows $N_r$ of a TI memory is equal to the number of cells $N_{cell}$, i.e., $N_r=N_{cell}$ while the number of columns $N_c$ is equal to the number $N_{xBLOCK\_TI}$ (n,s).

Figure 26:
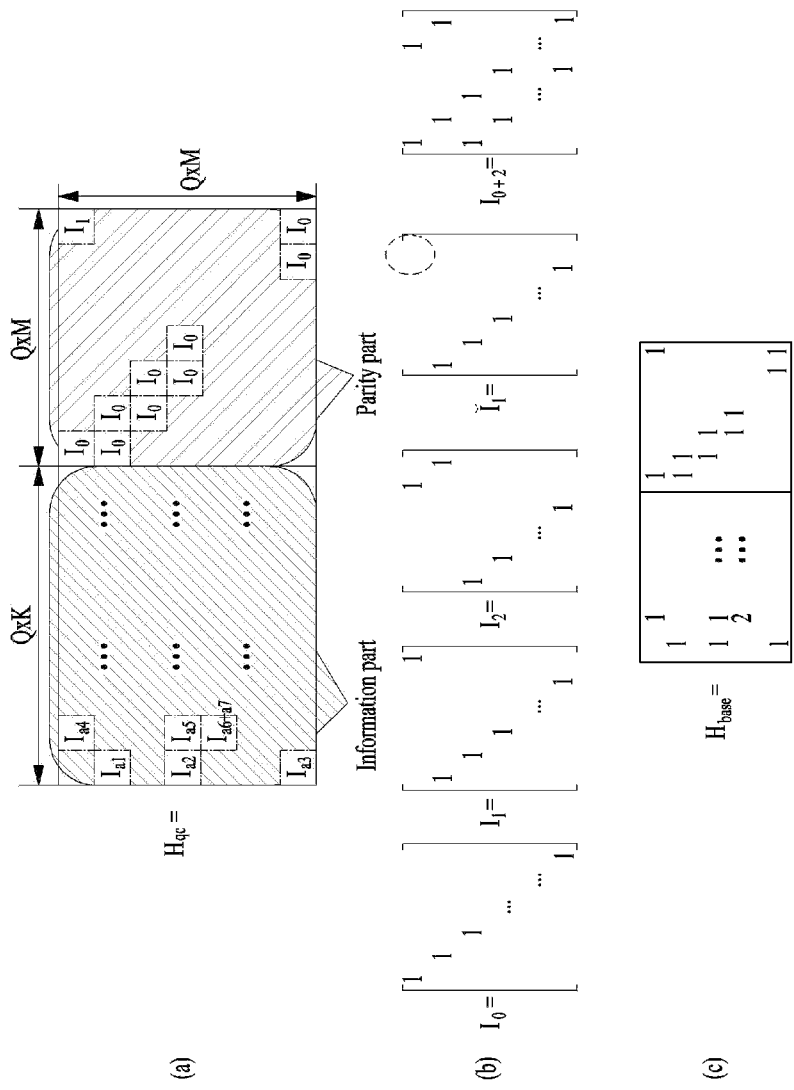
FIG. 26 shows a parity check matrix of a QC-IRA (quasi-cyclic irregular repeat accumulate) LDPC code.

FIG. 26 shows a parity check matrix of a QC-IRA (quasi-cyclic irregular repeat accumulate) LDPC code.

The above-described LDPC encoder may encode a parity of an LDPC encoding block using the parity check matrix.

The parity check matrix according to the present invention is a parity check matrix of the QC-IRA LDPC code and may have the form of a quasi-cyclic matrix called an H matrix and be represented as Hqc.

(a) shows a parity check matrix according to an embodiment of the present invention. As shown in (a), the parity check matrix is a matrix having a horizontal size of Q×(K+M) and a vertical size of Q×M and may include an information part and a parity part. The information part may include a matrix having a horizontal size of Q×K and a vertical size of Q×M and the parity part may include a matrix having a horizontal size of Q×M and a vertical size of Q×M. In this case, an LDPC code rate corresponds to K/(K+M).

The parity check matrix according to an embodiment of the present invention may include randomly distributed 1s and 0s and 1 may be referred to as an "edge". The position of 1 in the parity check matrix, that is, the position of each edge may be represented in the form of a circulant shifted identity matrix per submatrix having a horizontal size of Q and a vertical size of Q. That is, a submatrix can be represented as a Q×Q circulant-shifted identity matrix including only 1 and 0. Specifically, the submatrix according to an embodiment of the present invention is represented as identity matrices Ix including I0, I1, I2, ˜I1 . . . , which have different positions of 1s according to the number of circulant shifts. The number of submatrices according to an embodiment of the present invention may be (K+M)×M.

(b) shows the circulant-shifted identity matrices Ix which represent submatrices according to an embodiment of the present invention.

The subscript x of Ix indicates the number of circulant shifts of columns of a circulant-shifted identity matrix. That is, I1 represents an identify matrix in which columns are circulant-shifted once and I2 represents an identity matrix in which columns are circulant-shifted twice. IQ which is an identity matrix circulant-shifted Q times corresponding to the total number of columns, Q, may be the same matrix as I0 due to circulant characteristic thereof.

I0+2 represents a submatrix corresponding to a combination of two circulant-shifted identity matrices. In this case, the submatrix corresponds to a combination of the identity matrix I0 and an identity matrix circulant-shifted twice.

˜I1 represents a circulant-shifted identity matrix in which the edge of the last column of the corresponding submatrix, that is, 1 has been removed while corresponding to the submatrix I1.

The parity part of the parity check matrix of the QC-IRA LDPC code may include only submatrices I0 and ˜I1 and the position of submatrices I0 may be fixed. As shown in (a), submatrices I0 may be distributed in a diagonal direction in the parity part.

An edge in the parity check matrix represents that the corresponding row (checksum node) and the corresponding column (variable node) are physically connected. In this case, the number of 1s included in each column (variable node) may be referred to as a degree and columns may have the same degree or different degrees. Accordingly, the number, positions and value x of identity matrices Ix that represent edges grouped per submatrix are important factors in determining QC-IRA LDPC encoding performance and unique values may be determined per code rate.

(c) shows a base matrix of the parity check matrix according to an embodiment of the present invention. The base matrix represents only the number and positions of identity matrices Ix as specific numbers, ignoring the value x of Ix. As shown in (c), a base matrix may have a horizontal size of K+M and a vertical size of M and be represented as Hbase. When Ix is not a matrix corresponding to a combination of submatrices, the position of the corresponding submatrix may be represented as 1. When a submatrix is represented as I0+2, this submatrix is a matrix corresponding to a combination of two circulant-shifted identity matrices and thus the submatrix needs to be discriminated from a submatrix represented as one circulant-shifted identity matrix. In this case, the position of the submatrix may be represented as 2 which is the number of the combined circulant-shifted identity matrices. In the same manner, the position of a submatrix corresponding to a combination of N circulant-shifted identity matrices can be represented as N.

Figure 27:
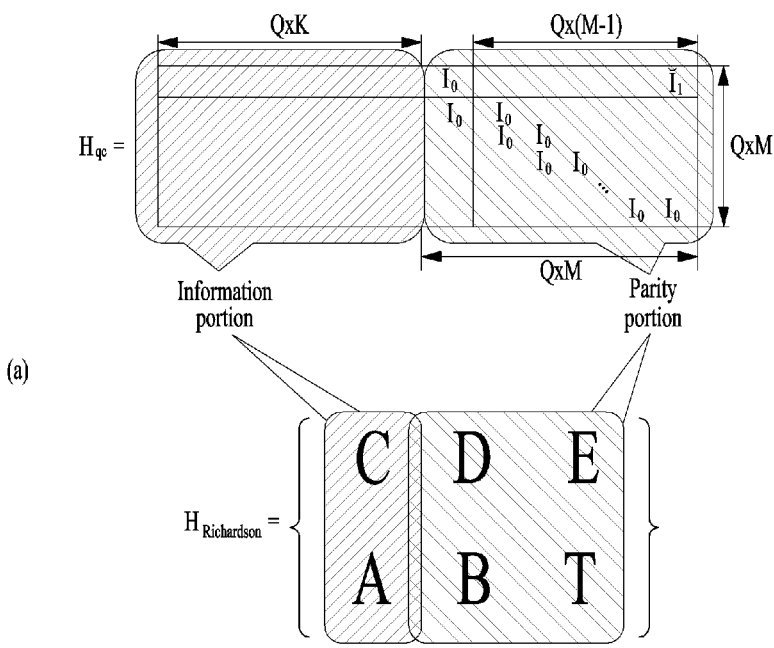
FIG. 27 shows a process of encoding the QC-IRA LDPC code according to an embodiment of the present invention.

FIG. 27 shows a process of encoding the QC-IRA LDPC code according to an embodiment of the present invention.

The QC-IRA LDPC code may be encoded per submatrix, distinguished from conventional sequential encoding, to reduce processing complexity.

(a) shows arrangement of a QC-IRA parity check matrix in a QC form. The QC-IRA parity check matrix may be divided into 6 regions A, B, C, D, E and T when arranged in the QC form. When a Q×K information vector s, a parity vector p1 having a length of Q and a parity vector p2 having a length of Q×(M−1) are used, a codeword x can be represented as x={s, p1, p2}.

When the efficient encoding math figure of Richardson is used, the codeword x can be obtained by directly acquiring p1 and p2 from the parity check matrix arranged in the QC form. The efficient encoding math figure of Richardson is as follows.

$$\phi = -ET^{-1}B+D$$

$$p_1^T = -\phi^{-1}(-ET^{-1}A+C)s^T$$

$$p_2^T = -T^{-1}(As^T + Bp_1^T) \quad \text{[Math Figure 9]}$$

(b) shows matrices $\varphi$ and $\varphi^{-1}$ derived according to the efficient encoding math figure.

As shown in (b), $\varphi^{-1}$ can be represented as a left low triangular (sub) matrix. The parity vector p2 can be obtained by calculating s and p1 according to the above-described math figure. When the QC-IRA parity check matrix is encoded according to the efficient encoding math figure of Richardson, at least Q parity nodes can be simultaneously processed in parallel according to characteristics of a Q×Q submatrix.

FIGS. 28 to 31 illustrate a process of sequentially encoding the QC-IRA LDPC code according to an embodiment of the present invention. This sequentially encoding may correspond to the above mentioned LDPC encoding.

Figure 28:
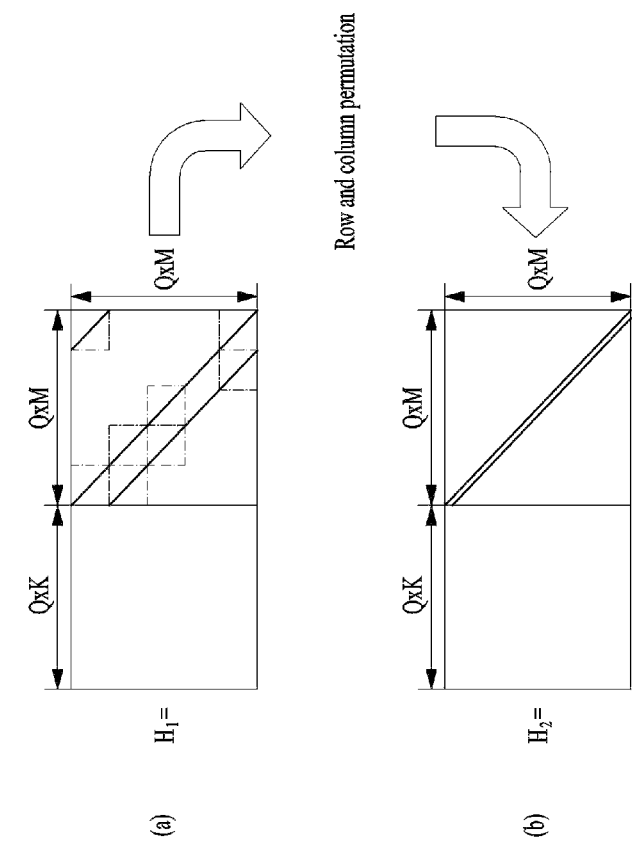
FIG. 28 illustrates a parity check matrix permutation process according to an embodiment of the present invention.

FIG. 28 illustrates a parity check matrix permutation process according to an embodiment of the present invention.

(a) shows a QC-IRA LDPC parity check matrix H1 arranged in QC form. As shown in (a), a parity part of the matrix H1 may include submatrices distributed in a stepped form, which corresponds to the above-described QC-IRA LDPC parity check matrix. To easily perform sequential encoding, rows and columns of the matrix H1 are moved such that the matrix H1 is modified into a matrix H2 according to an embodiment of the present invention.

(b) shows the modified matrix H2. As shown in (b), a parity part of the matrix H2 may include a dual diagonal matrix. In this case, an applied row and column permutation math figure is as follows.

$$r_y = (r_x \bmod Q)M + \lfloor r_x/Q \rfloor \text{ where } r_x = 0,1,2,\ldots,QM-1$$

$$c_y = \{((c_x-QK) \bmod Q\}M + \lfloor (c_x-QK)/Q \rfloor + QK \text{ where }$$
$$c_x = QK, QK+1, \ldots, Q(K+M)-1 \quad \text{[Math Figure 10]}$$

According to the above permutation math figure, the rx-th row of the matrix H1 can be moved to the ry-th row of the matrix H2 and the cx-th column of the matrix H1 can be moved to the cy-th column of the matrix H2. In this case, column permutation can be applied only to a parity processing period (QK≤cx≤Q(K+M)−1) and LDPC code characteristics can be maintained even if permutation is applied.

Figure 29:
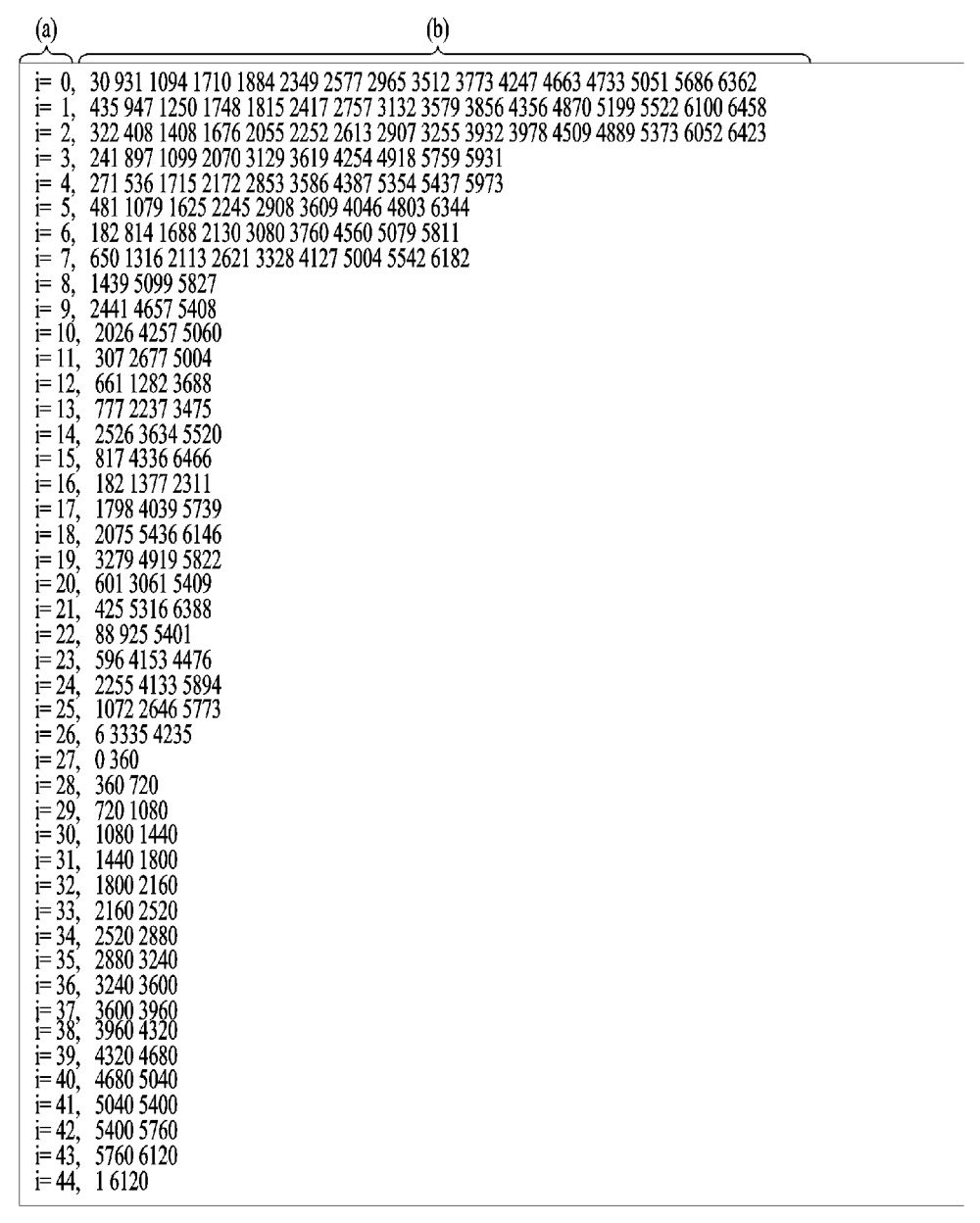

FIG. 29 is a table showing addresses of parity check matrix according to an embodiment of the present invention.

*536 The table shown in FIG. 29 represents a parity check matrix (or matrix H) having a codeword length of 16200 and a code rate of 9/15. The table represents addresses of 1 in the parity check matrix. In this case, the table according to an embodiment of the present invention can be referred to as addresses of a parity check matrix.

In the table of (a), i indicates the blocks generated when the length of the matrix H or codeword by the length of a submatrix. A submatrix according to an embodiment of the present invention is a 360×360 matrix having a codeword length of 16200, and thus the number of blocks can be 45 obtained by dividing 16200 by 360. The each block can be sequentially indicated from 0. Accordingly, i can have a value in the range of 0 to 44. Also, i can indicate information bit corresponding to first column in each block.

(b) shows the positions (or addresses) of 1s (or edges) in the first column in each block.

The matrix H can be represented as H(r,c) using all rows and columns thereof. The following math FIG. 11 is used to derive H(r,c).

$$r = \lfloor x(i, j)/Q \rfloor + (x(i, j) + m) \bmod Q,$$
$$c = i \times Q + m$$
$$H(r, c) = \begin{cases} 0, & \text{if } r = 0 \text{ and } c = 16199 \\ 1, & \text{else} \end{cases}$$
$\lfloor x \rfloor$, the largest integer less than or equal to $x$
$j = 0, \ldots,$ length of $x(i)$
$m = 0, \ldots, Q-1$
$Q = 360$

[Math Figure 11]

In the math figure, X(i,j) represents the j-th value of the i-th line in the table. Specifically, x(0,0)=1, x(0,1)=158 and x(1,0)=1, which correspond to the positions of rows having 1 (or addresses of 1) corresponding to i-th line of the matrix H. In this case, maximum values of r and c can be 9719 and 16199, respectively.

The performance of the LDPC code may depend on distribution of degrees of nodes of the parity check matrix, the girth according to the positions of 1s or edges of the parity check matrix, cycle characteristic, connection between check nodes and variable nodes, etc. The matrix H shown optimizes node degree distribution in the case of the codeword of 16200, Q=360 and code rate=6/15 and optimizes the positions of 1s or edges under the condition of optimized degree distribution, Q and code rate.

The matrix H configured according to the table has the above-described QC-IRA LDPC structure. Hqc can be obtained using H(r,c) derived using the math figure and a base matrix Hbase can be derived from Hqc.

In addition, the matrix H according to an embodiment of the present invention may include a matrix H in a different from, which has the same degree distribution as the lengths of x(i) (or degrees of corresponding variable nodes) of the table shown in FIG. 4. Furthermore, when a transmitter performs encoding using the corresponding matrix H, the above-described efficient encoding for QC-IRA LDPC can be employed.

Accordingly, a transmitting side can implement an encoder having high encoding performance, low complexity and high throughput and a receiving side can perform parallel decoding up to 360 level using Q and effectively design a receiver with high throughput using the proposed matrix H.

Embodiments are directed to a FEC(LDPC) encoder of a transmitter and a FEC(LDPC) decoder of a receiver using the proposed matrix H, and provides high performance of the encoder and the decoder.

The following table 34 shows degree distribution.

TABLE 34

|  | Variable node degree | | | | |
| --- | --- | --- | --- | --- | --- |
|  | 16 | 10 | 9 | 3 | 2 |
| (# of variable node)/Q | 3 | 2 | 3 | 19 | 18 |

When i is 0 to 2, the numbers of 1s in the 0-th block to 2nd block are all 16. Accordingly, when the variable node degree is 16, the number of blocks having the same degree is represented as 3. When i corresponds to 27 to 44, the numbers of 1s in the twenty-seventh block to forty-fourth block are 2. Accordingly, when the variable node degree is 2, the number of blocks having the same degree is 18. As described above, since the parity part of the matrix H includes only submatrices represented as I0 diagonally distributed in a stepped form, the variable node degree is always 2. Hence, blocks having a variable node degree of 2 can be regarded as blocks corresponding to the parity part. The number of actual variable nodes corresponding to each variable node degree can be obtained by multiplying the number of blocks shown in the table by Q of the submatrix.

Figure 30:
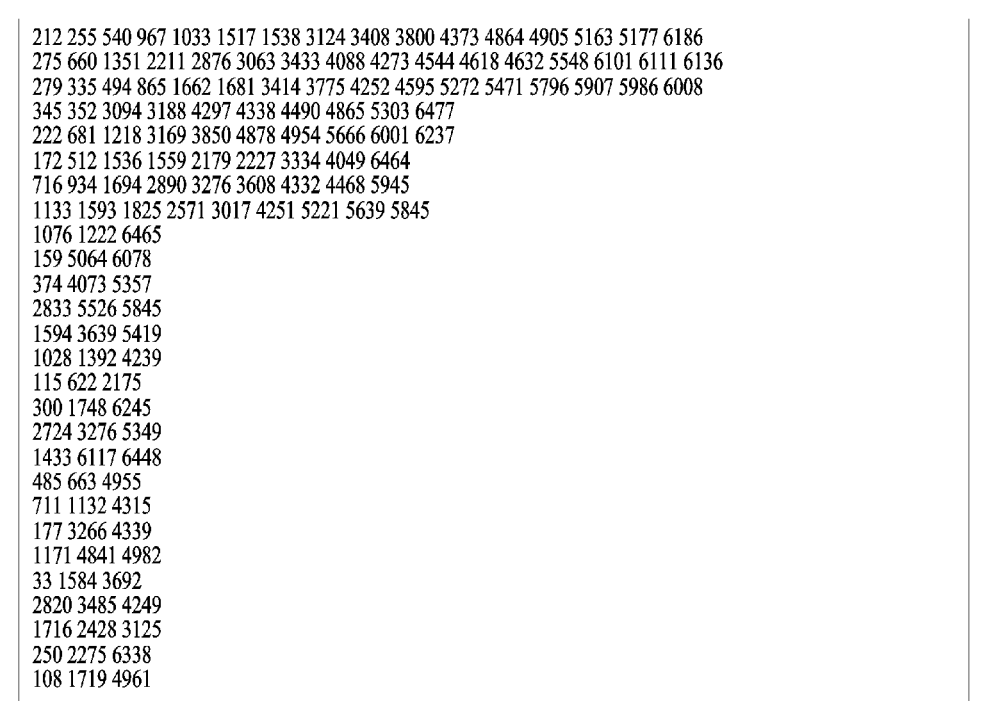

FIG. 30 is a table showing addresses of parity check matrix according to another embodiment of the present invention.

The table shown in FIG. 30 shows the matrix H2 obtained by modifying the matrix H1.

In sequential encoding, edges used in a parity processing period are typically represented by an math figure and thus the edges can be omitted from the table. That is, 27 blocks having a degree of 2 corresponding to the parity part are not represented in the table.

Since the property of the matrix is maintained even if the matrix is modified, as described above, node degree characteristic, cycle, girth, connection between check nodes and variable nodes, etc. are maintained. Accordingly, the equal encoding performance can be obtained and sequential encoding can be performed using the matrix H2 according to the table.

Figure 31:
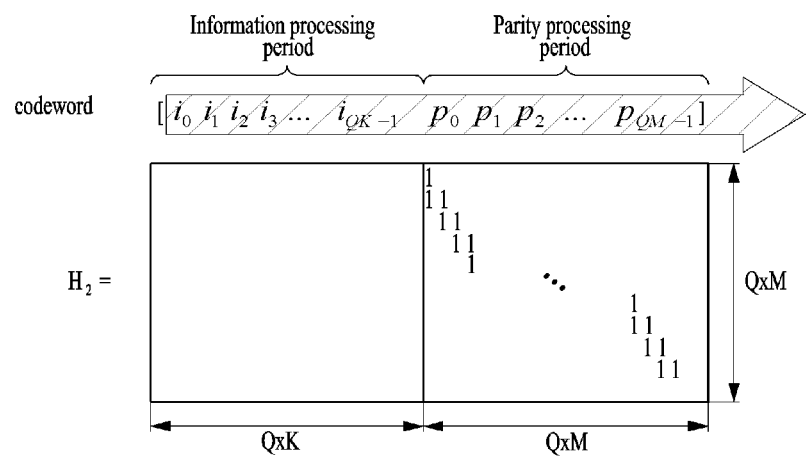
FIG. 31 illustrates a method for sequentially encoding the QC-IRA LDPC code according to an embodiment of the present invention.

FIG. 31 illustrates a method for sequentially encoding the QC-IRA LDPC code according to an embodiment of the present invention.

When the parity check matrix is modified into the matrix H2 through the above-described permutation process, sequential encoding can be performed through updating of each parity checksum using information bits of a codeword and checksum updating between parity checksums.

As shown in FIG. 31, the codeword can be represented using QK information bits and QM parity checksums. The information bits can be represented as $i_z$ according to iz position and parity checksums can be represented as $p_s$.

A parity checksum update process through the information bits can be represented by the following math FIG. 12.

[Math Figure 12]

$$p_w = p_w \oplus i_z \quad (1)$$

$$w = \{v + (z \bmod Q)M\} \bmod(QM) \quad (2)$$

where z=0, 1, 2, ..., QK−1

Here, iz represents a z-th information bit and pw denotes a parity checksum that needs to be updated using iz. Math figure (1) represents that parity checksum pw corresponding to the w-th row is updated through an XOR operation performed on the z-th information and parity checksum pw. According to math figure (2), the position of w is calculated using the above-described table representing the matrix H2. Here, v denotes a number corresponding to each row in the table representing the matrix H2. As described above, a row in the table representing the matrix H2 corresponds to the position of a block generated when the length of the matrix H or codeword is divided by the submatrix length. Accordingly, the information processing period shown in FIG. 6 is divided by the submatrix length Q and then the numbers of rows corresponding to every Q-th iz are read. Upon completion of checksum update using the information bits of the information processing period, checksum update of the parity processing period can be performed. Checksum update of the parity processing period may be represented by the following math FIG. 13.

$$p_s = p_s \oplus p_{s-1} \text{ where } s=1,2,\ldots,QM-1 \quad \text{[Math Figure 13]}$$

When S is 0, parity checksum corresponds to parity p0 and parity values from p1 to pQM−1 can be sequentially derived through XOR operations performed on the parity values and parity values immediately prior thereto.

Figure 32:
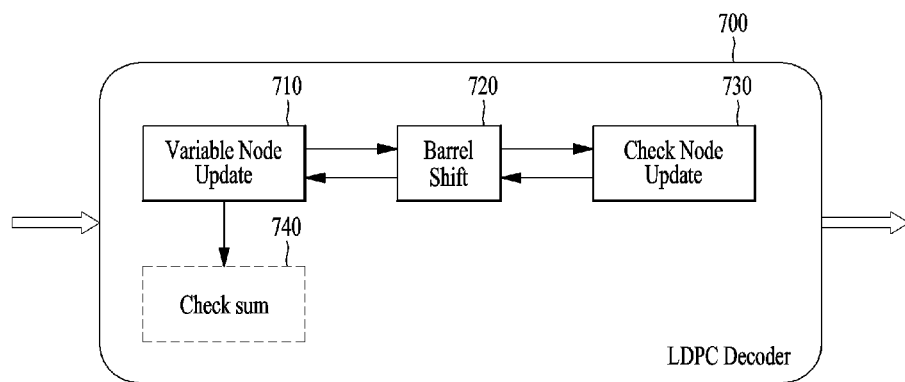
FIG. 32 illustrates an LDPC decoder according to an embodiment of the present invention.

FIG. 32 illustrates an LDPC decoder according to an embodiment of the present invention.

The LDPC decoder 700 according to an embodiment of the present invention may include a variable node update block 710, a check node update block 720, a barrel shift block 730 and a check sum block 740. Each block will now be described.

The variable node block 710 may update each variable node of the matrix H using an input of the LDPC decoder and a message delivered through edges from the check node block.

The check node block 720 may update a check node of the matrix H using a message transmitted through edges from a variable node. A node update algorithm according to an embodiment of the present invention may include sum product algorithm, belief-propagation algorithm, min-sum algorithm, modified min-sum algorithm, etc. and may be changed according to designer. In addition, since connection between variable nodes and check nodes is represented in the form of a Q×Q circulant identity matrix due to characteristics of QC-IRA LDPC, Q messages between variable nodes and the check node block can be simultaneously processed in parallel. The barrel shift block 730 may control circulant connection.

The check sum block 740 is an optional block which hard-decides a decoding message for each variable node update and performs parity checksum operation to reduce the number of decoding iterations necessary for error correction. In this case, the LDPC decoder 700 according to an embodiment of the present invention can output a final LDPC decoding output through soft decision even if the check sum block 740 hard-decides the decoding message.

Figure 33:
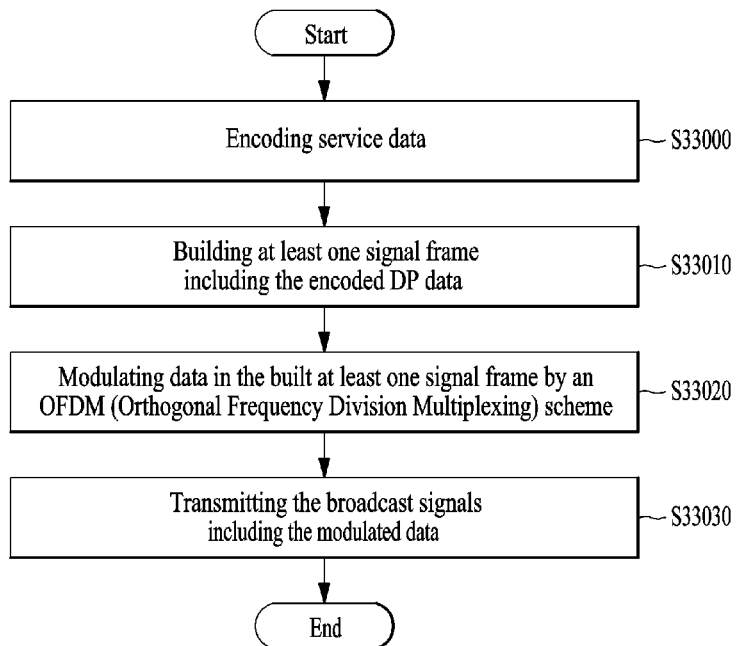
FIG. 33 is a flowchart illustrating a method for transmitting broadcast signals according to an embodiment of the present invention.

FIG. 33 is a flowchart illustrating a method for transmitting broadcast signals according to an embodiment of the present invention.

The apparatus for transmitting broadcast signals according to an embodiment of the present invention can encode service data (S33000). As described above, service data is transmitted through a data pipe which is a logical channel in the physical layer that carries service data or related metadata, which may carry one or multiple service(s) or service component(s). Data carried on a data pipe can be referred to as the DP data or the service data. The detailed process of step S33000 is as described in FIGS. 1, 5, 22 to 26, 32.

As described in FIG. 26 to 32, the apparatus for transmitting broadcast signals according to an embodiment of the present invention may encode a parity of an LDPC encoding block using the parity check matrix. Also, the FEC structure according to an embodiment of the present invention before bit interleaving by using the FEC encoding parameters for a long FECBLOCK and a short FECBLOCK.

The apparatus for transmitting broadcast signals according to an embodiment of the present invention can build at least one signal frame including the encoded service data (S33010). The detailed process of step S33010 is as described in FIGS. 7, 10 to 11, 16 to 21.

Then, the apparatus for transmitting broadcast signals according to an embodiment of the present invention can modulate data in the built at least one signal frame by an OFDM (Orthogonal Frequency Division Multiplexing) scheme (S33020). The detailed process of this step is as described in FIG. 1 and FIG. 8.

Subsequently, the apparatus for transmitting broadcast signals according to an embodiment of the present invention can transmit the broadcast signals including the modulated at least one signal frame (S33030). The detailed process of this step is as described in FIG. 1 and FIG. 8.

Figure 34:
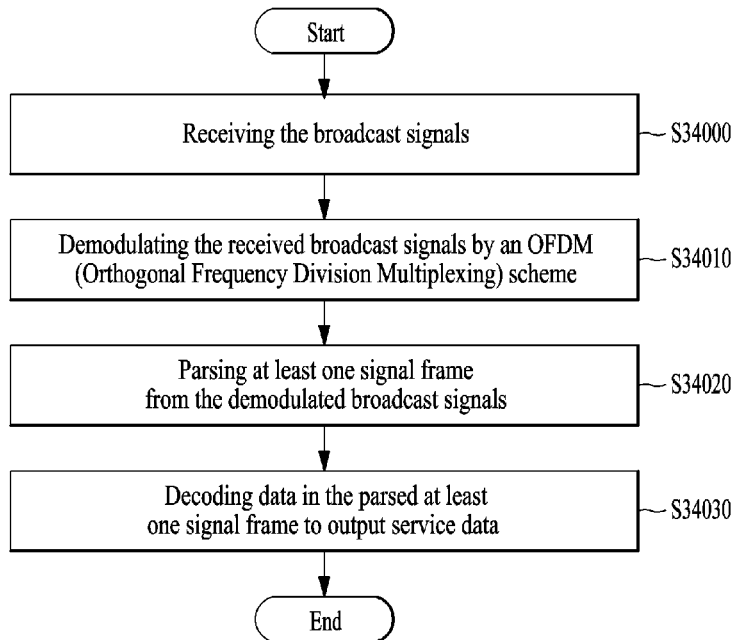
FIG. 34 is a flowchart illustrating a method for receiving broadcast signals according to an embodiment of the present invention.

FIG. 34 is a flowchart illustrating a method for receiving broadcast signals according to an embodiment of the present invention.

The flowchart shown in FIG. 34 corresponds to a reverse process of the broadcast signal transmission method according to an embodiment of the present invention, described with reference to FIG. 33.

The apparatus for receiving broadcast signals according to an embodiment of the present invention can receive the broadcast signals (S34000).

The apparatus for receiving broadcast signals according to an embodiment of the present invention can demodulate received broadcast signals using an OFDM (Orthogonal Frequency Division Multiplexing) scheme (S34010). The detailed process of this step is as described in FIG. 9.

The apparatus for receiving broadcast signals according to an embodiment of the present invention can parse at least one signal frame from the demodulated broadcast signals (S34020). Details are as described in FIG. 9. Also, the signal frame according to an embodiment of the present invention have a structure described in FIGS. 11 to 21.

Subsequently, the apparatus for receiving broadcast signals according to an embodiment of the present invention can decode service data in the parsed at least one signal frame (S34030). Details are as described in FIG. 9. As described above, service data is transmitted through a data pipe which is a logical channel in the physical layer that carries service data or related metadata, which may carry one or multiple service(s) or service component(s). Data carried on a data pipe can be referred to as the DP data or the service data.

Figure 35:
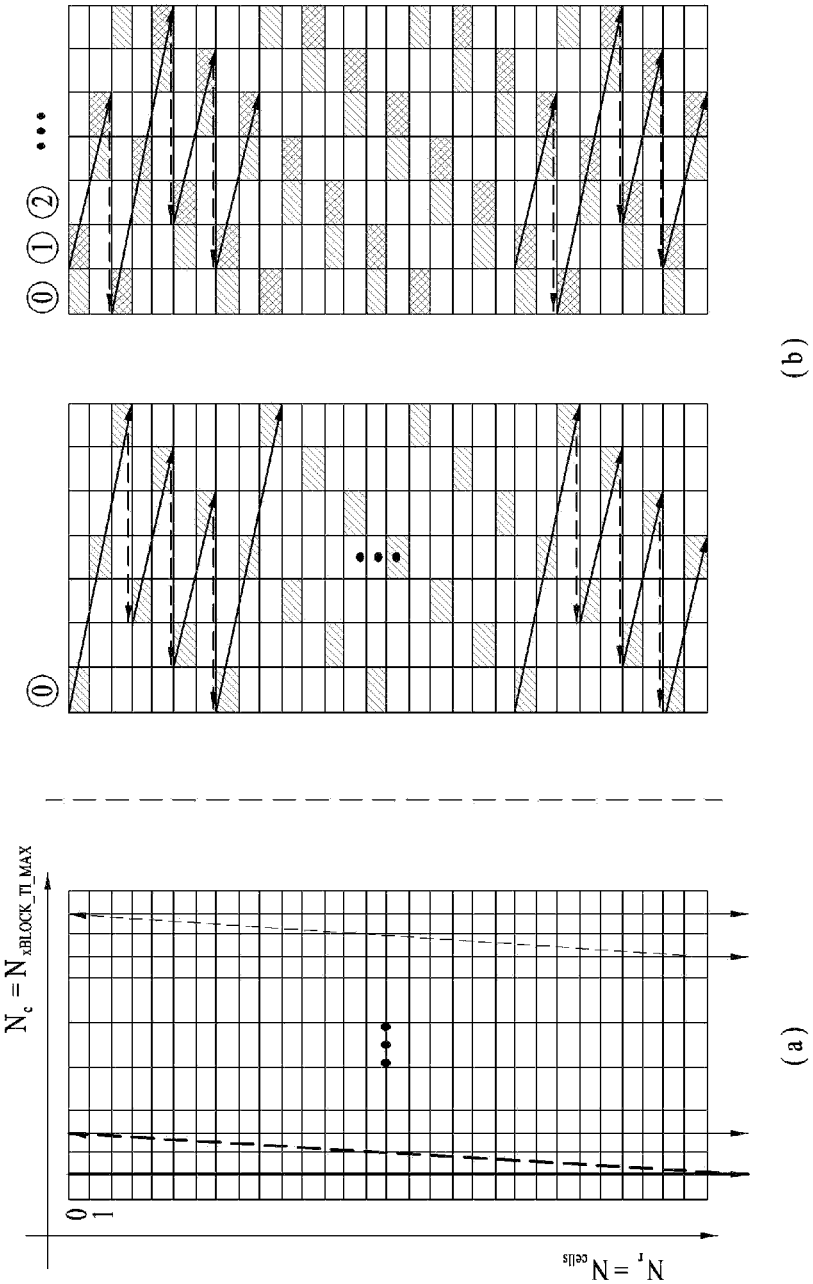
FIG. 35 illustrates the basic operation of a twisted row-column block interleaver according to an embodiment of the present invention.

FIG. 35 illustrates the basic operation of a twisted row-column block interleaver according to an embodiment of the present invention.

shows a writing operation in the time interleaver and (b) shows a reading operation in the time interleaver The first XFECBLOCK is written column-wise into the first column of the TI memory, and the second XFECBLOCK is written into the next column, and so on as shown in (a). Then, in the interleaving array, cells are read out diagonal-wise. During diagonal-wise reading from the first row (rightwards along the row beginning with the left-most column) to the last row, cells are read out as shown in (b). In detail, assuming $Z_{n,s,i}$ (i=0, , , , , $N_r,N_c$) as the TI memory cell position to be read sequentially, the reading process in such an interleaving array is performed by calculating the row index $R_{n,s,i}$, the column index $C_{n,s,i}$, and the associated twisting parameter $T_{n,s,i}$ as follows math figure.

$$\text{GENERATE } (R_{n,s,i}, C_{n,s,i}) = \left\{ R_{n,s,i} = \mod(i, N_r), \right. \quad \text{[Math Figure 14]}$$

$$T_{n,s,i} = \mod(S_{shift} \times R_{n,s,i}, N_c),$$

$$\left. C_{n,s,i} = \mod\left(T_{n,s,i} + \left\lfloor \frac{i}{N_r} \right\rfloor, N_c\right)\right\}$$

where $S_{shift}$ is a common shift value for the diagonal-wise reading process regardless of $N_{xBLOCK\_TI}$ (n,s), and it is determined by $N_{xBLOCK\_TI\_MAx}$ given in the PLS2-STAT as follows math figure.

$$\text{for } \begin{cases} N'_{xBLOCK\_TI\_MAX} = N_{xBLOCK\_TI\_MAX} + 1, & \text{if } N_{xBLOCK\_TI\_MAX} \mod 2 = 0 \\ N'_{xBLOCK\_TI\_MAX} = N_{xBLOCK\_TI\_MAX}, & \text{if } N_{xBLOCK\_TI\_MAX} \mod 2 = 1 \end{cases}, \quad \text{[Math Figure 15]}$$

$$S_{shift} = \frac{N'_{xBLOCK\_TI\_MAX} - 1}{2}$$

As a result, the cell positions to be read are calculated by a coordinate as $Z_{n,s,i} = N_r C_{n,s,i} + R_{n,s,i}$.

Figure 36:
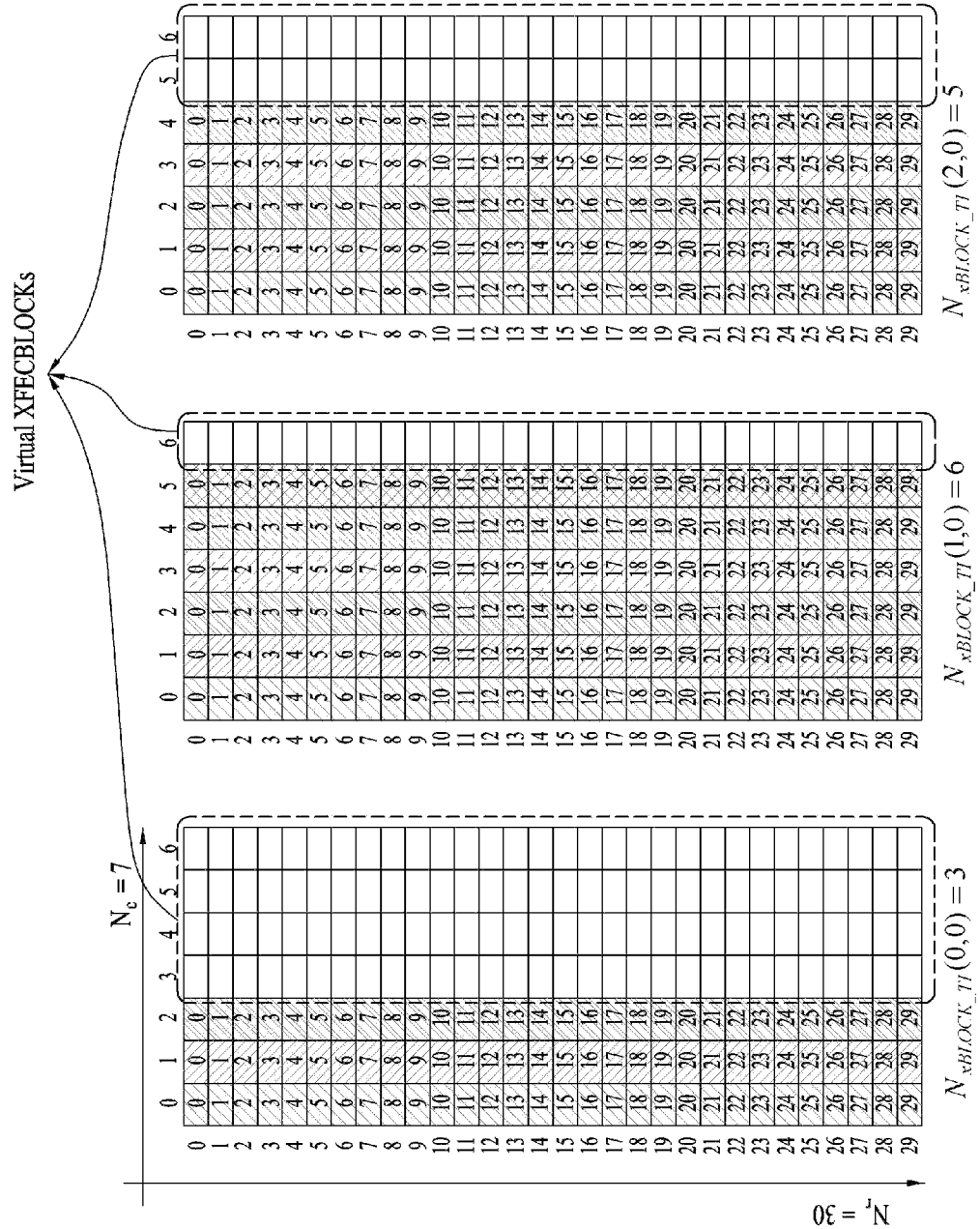
FIG. 36 illustrates an operation of a twisted row-column block interleaver according to another embodiment of the present invention.

FIG. 36 illustrates an operation of a twisted row-column block interleaver according to another embodiment of the present invention.

More specifically, FIG. 36 illustrates the interleaving array in the TI memory for each TI group, including virtual XFECBLOCKs when $N_{xBLOCK\_TI}$ (0,0)=3, $N_{xBLOCK\_TI}$ (1,0)= 6, $N_{xBLOCK\_TI}$ (2,0)=5.

The variable number $N_{xBLOCK\_TI}$ (n,s)=$N_r$, will be less than or equal to $N_{xBLOCK\_TI\_MAx}$. Thus, in order to achieve a single-memory deinterleaving at the receiver side, regardless of $N_{xBLOCK\_TI}$ (n,s), the interleaving array for use in a twisted row-column block interleaver is set to the size of $N_r \times N_c = N_{cells} \times N_{xBLOCK\_TI\_MAx}$ by inserting the virtual XFECBLOCKs into the TI memory and the reading process is accomplished as follow math figure.

$$p = 0; \quad \text{[Math Figure 16]}$$

$$\text{for } i = 0; i < N_{cells} N'_{xBLOCK\_TI\_MAX}; i = i + 1$$

$$\{\text{GENERATE } (R_{n,s,j}, C_{n,s,j}); V_i = N_r C_{n,s,j} +$$

$$R_{n,s,j} \text{ if } V_i < N_{cells} N_{xBLOCK\_TI}(n, s)\{Z_{n,s,p} = V_{ti}; p = p+1;\}\}$$

The number of TI groups is set to 3. The option of time interleaver is signaled in the PLS2-STAT data by DP_TI_TYPE='0', DP_FRAME_INTERVAL='1', and DP_TI_LENGTH='1', i.e., $N_{TI}$=1, $I_{JUMP}$=1, and $P_1$=1. The number of XFECBLOCKs, each of which has $N_{cells}$=30, per TI group is signaled in the PLS2-DYN data by $N_{xBLOCK\_TI}$ (0,0)=3, $N_{xBLOCK\_TI}$ (1,0)=6, $N_{xBLOCK\_TI}$ (2,0)=5, respectively. The maximum number of XFECBLOCK is signaled in the PLS2-STAT data by $N_{xBLOCK\_Groyp\_MAx}$, which leads to $$\lfloor N_{xBLOCK\_Group\_MAX}/N_{TI} \rfloor = N_{xBLOCK\_TI\_MAX} = 6.$$

Figure 37:
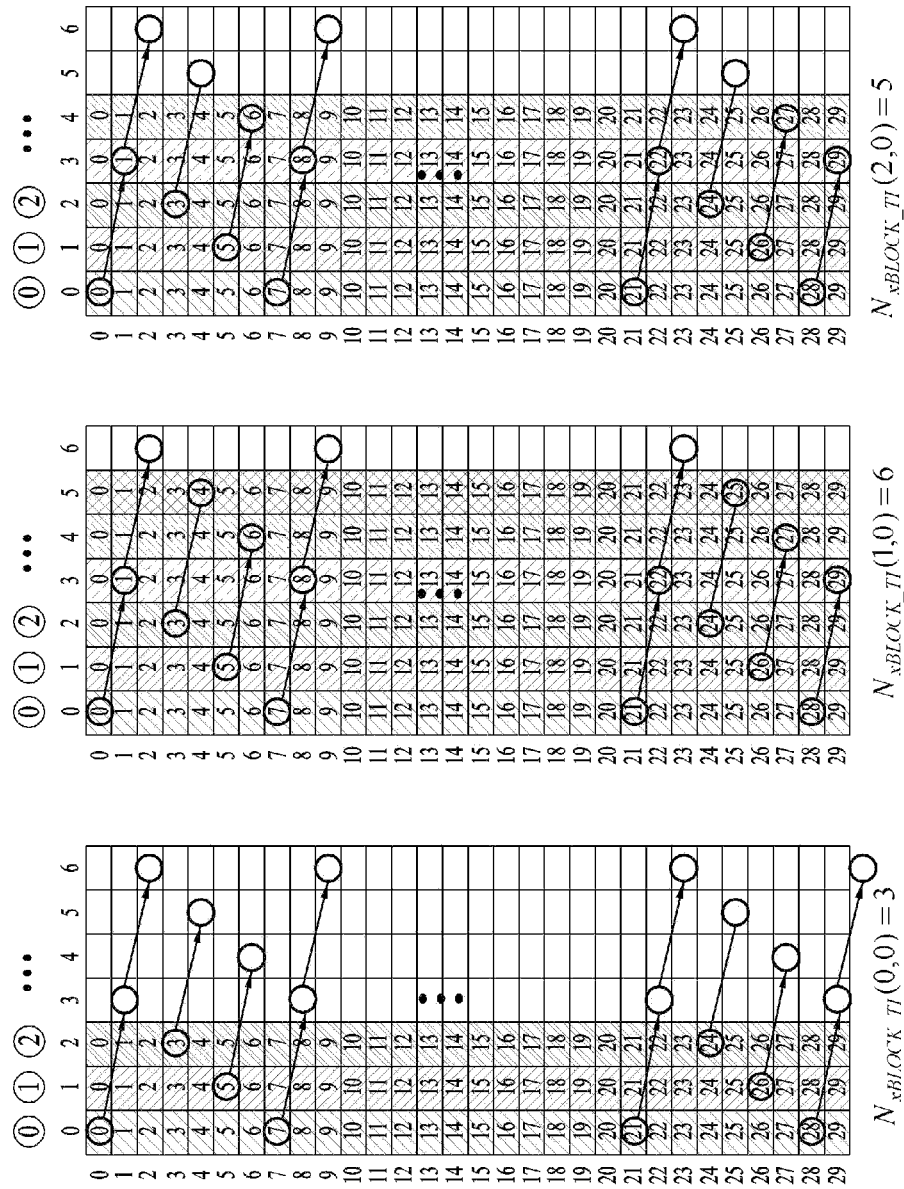
FIG. 37 illustrates a diagonal-wise reading pattern of a twisted row-column block interleaver according to an embodiment of the present invention.

FIG. 37 illustrates a diagonal-wise reading pattern of a twisted row-column block interleaver according to an embodiment of the present invention.

More specifically FIG. 37 shows a diagonal-wise reading pattern from each interleaving array with parameters of $N_{xBLOCK\_TI\_MAX}$=7 and $S_{shift}$=(7−1)/2=3. Note that in the reading process shown as pseudocode above, if $V_i \geq N_{cells} N_{xBLOCK\_TI}$ (n,s), the value of $V_i$ is skipped and the next calculated value of $V_i$ is used.

Figure 38:
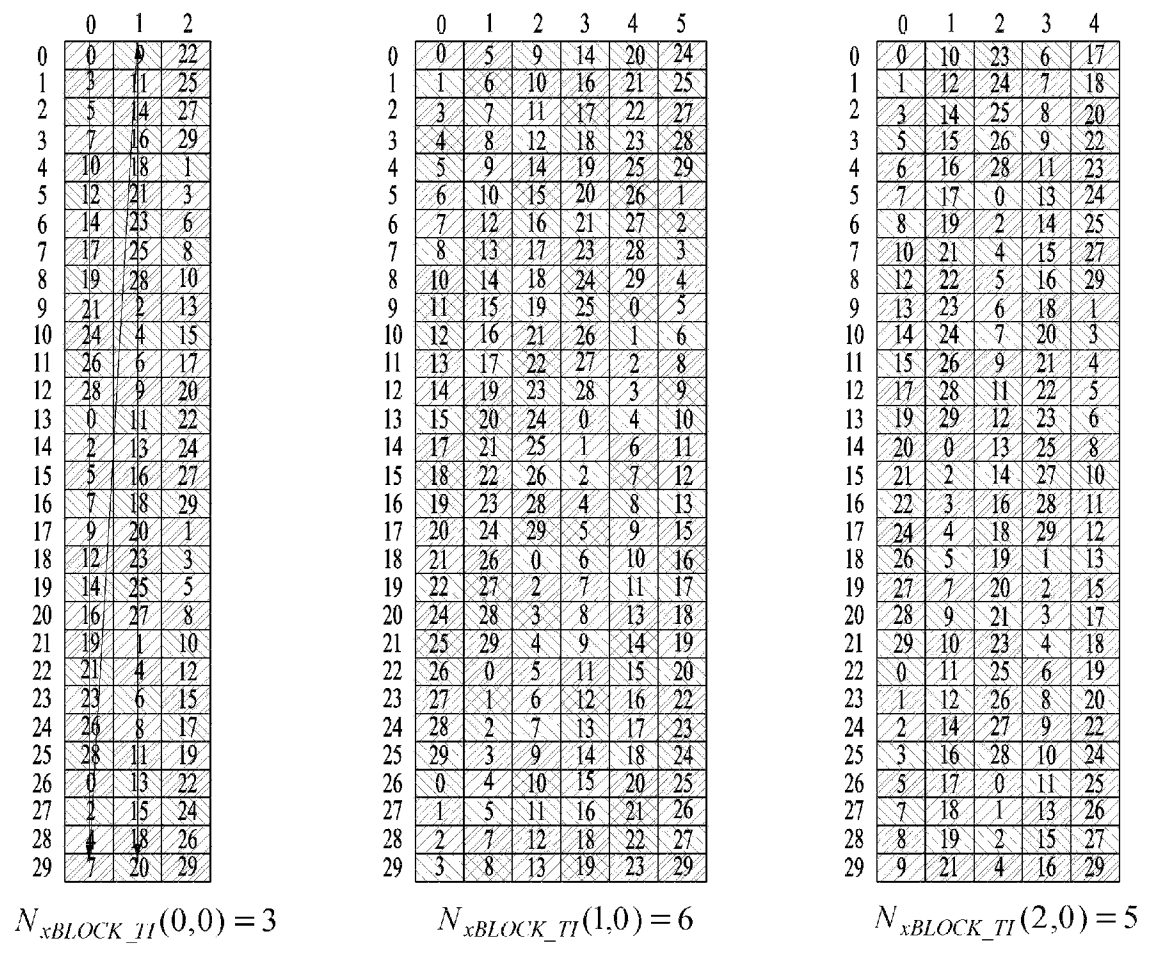

FIG. 38 illustrates interlaved XFECBLOCKs from each interleaving array according to an embodiment of the present invention.

FIG. 38 illustrates the interleaved XFECBLOCKs from each interleaving array with parameters of $N_{xBLOCK\_TI\_MAX}$=7 and $S_{shift}$=3.

Figure 39:
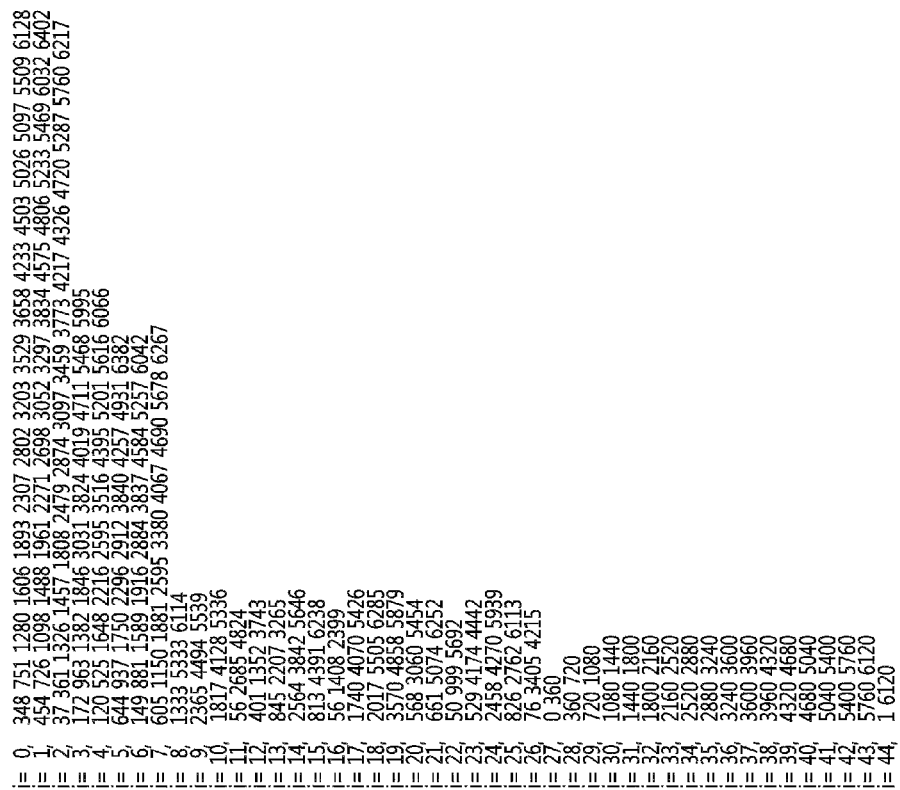
FIG. 39 is a table showing addresses of parity check matrix according to another embodiment of the present invention.

FIG. 39 is a table showing addresses of parity check matrix according to another embodiment of the present invention.

The table shown in FIG. 39 represents a parity check matrix (or matrix H) having a codeword length of 16200 and a code rate of 8/15. The details of the table are equal to the details described in FIG. 29. The following table shows degree distribution.

TABLE 35

| | Variable node degree | | | | |
|---|---|---|---|---|---|
| | 16 | 10 | 9 | 3 | 2 |
| (# of variable node)/Q | 3 | 5 | 13 | 19 | 18 |

When i is 0 to 2, the numbers of 1s in the 0-th block to 2-nd block are all 16. Accordingly, when the variable node degree is 16, the number of blocks having the same degree is represented as 3. When i corresponds to 3 to 7, the numbers of 1s in the third block to seventh block are 10. Accordingly, when the variable node degree is 10, the number of blocks having the same degree is 5. As described above, since the parity part of the matrix H includes only submatrices represented as I0 diagonally distributed in a stepped form, the variable node degree is always 2. Hence, blocks having a variable node degree of 2 can be regarded as blocks corresponding to the parity part. The number of actual variable nodes corresponding to each variable node degree can be obtained by multiplying the number of blocks shown in the table by Q of the submatrix.

Figure 40:
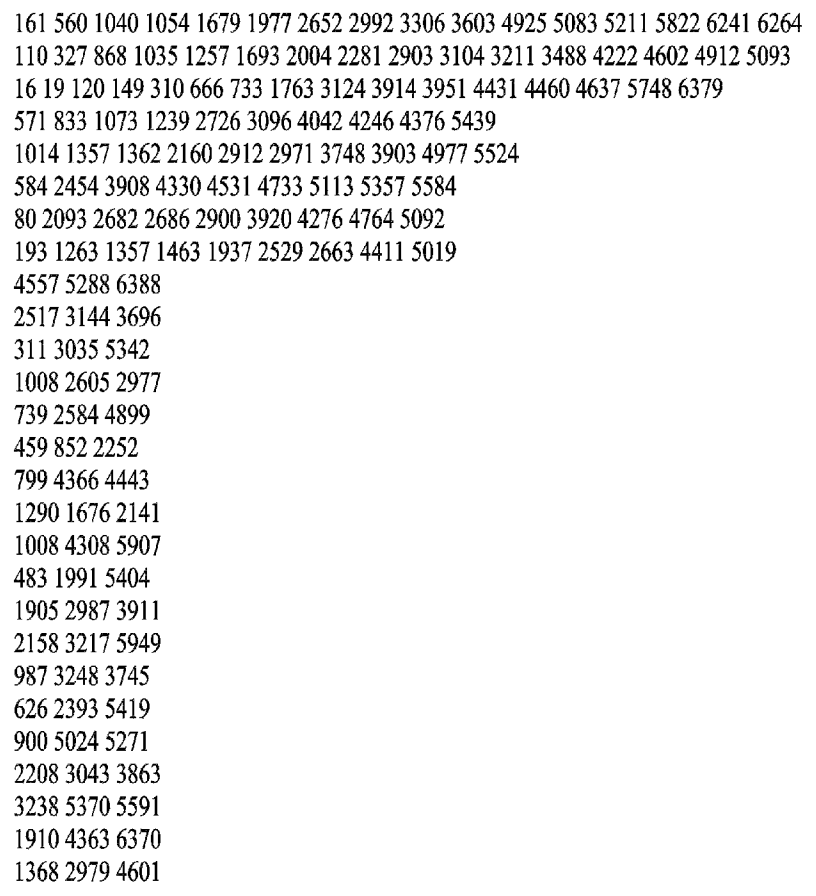

FIG. 40 is a table showing addresses of parity check matrix according to another embodiment of the present invention.

The table shown in FIG. 40 shows the matrix H2 obtained by modifying the matrix H1.

In sequential encoding, edges used in a parity processing period are typically represented by an equation and thus the edges can be omitted from the table. That is, 18 blocks having a degree of 2 corresponding to the parity part are not represented in the table.

Since the property of the matrix is maintained even if the matrix is modified, as described above, node degree characteristic, cycle, girth, connection between check nodes and variable nodes, etc. are maintained. Accordingly, the equal encoding performance can be obtained and sequential encoding can be performed using the matrix H2 according to the table.

Two-dimensional enhanced SFN (2D-eSFN) processing:

The system supports the SFN network, where distributed MISO scheme is optionally used to support very robust transmission mode. The 2D-eSFN is a distributed MISO scheme that uses multiple TX antennas, each of which is located in the different transmitter site in the SFN network.

In the SFN configuration, the 2D-eSFN processing independently distorts the phase of the signals transmitted from multiple transmitters, in order to create both time and frequency diversity. Hence, burst errors due to low flat fading or deep-fading for a long time can be mitigated. The time-frequency dimensional phase-distorted signals are given by $$r_{m,l,k} = q_{m,l,k} \Psi(l,k)$$

wherein $q_{m,l,k}$ and $r_{m,l,k}$ are the input and output signals of 2D-esfn processing, respectively.

$\Psi(l,k)$ denotes a phase-distortion value for the kth carrier of the lth symbol and is defined as $\Psi(l,k) = e^{j\theta_t(l)} \times e^{j\theta_f(k)}$, where $\theta_t(l)$ and $\theta_f(k)$ indicate the time- and frequency-dimensional phase terms, respectively.

The time-dimensional phase term $\theta_t(l)$ for the lth symbol carrier (for) is calculated as following math figure.

$$\theta_t(l) = \theta_{base} + \frac{1}{2}\theta_{var}\left(1 - \cos\left(\frac{2\pi l}{N_R} + \varepsilon_{offset}\right)\right) \quad \text{[Math Figure 17]}$$

where is $\theta_{base} \in [0, 2\pi)$ is a base phase [radian], $\theta_{var} \in [0, 2\pi)$ is the amount of phase variation, and $N_R$ determines a resolution value of the sinusoidal wave. $\varepsilon_{offset} \in [0, 2\pi)$ denotes a phase offset for different transmitter.

The frequency-dimensional phase term $\theta_f(k)$ for the kth carrier (for $K_{min} \leq k \leq K_{max}$) is calculated as following math figure.

$$m = \left\lfloor \frac{k}{b} \right\rfloor, \; p = \left\lfloor \frac{k + b/2}{b} \right\rfloor, \quad \text{[Math Figure 18]}$$

$$q = b \cdot m + b/2,$$

$$k' = k - (q - a),$$

$$\theta_f(k) = \begin{cases} \varphi(p) + \dfrac{\varphi(p+1) - \varphi(p)}{2a}(k' \bmod(2a)), & \text{if } (q-a) \leq k \leq (q+a) \\ \varphi(p) & \text{else} \end{cases}$$

where the parameters a and b are set to a=128 and b=512, respectively. The phase term $\varphi(p)$ (p=0, . . . , L−1) is recursively defined as $$\varphi(p) = \begin{cases} TxID_0(0) \cdot 2\pi/3, & \text{if } p = 0 \\ \varphi(p-1) + TxID_0(p) \cdot \pi/4, & \text{else} \end{cases}$$

where the values $TxID_0(p) \in \{-1, 0, 1\}$ of the basic TxID identify each transmitter within the network and are defined within one frame. Note that the exchange of TxID every frame also causes a time-dimensional phase variation. The exchange of TxID in each frame will be performed by applying the left circular shift or right circular shift method to $TxID_0(p)$:

$$TxID_m(p) = \begin{cases} TxID_0((p + mJ) \bmod L) & : \text{left circular shift} \\ TxID_0((p - mJ) \bmod L) & : \text{right circular shift} \end{cases}$$

where the index m denotes the mth frame and J. is an integer factor controlling the shifting value mJ. Note that if only one transmitter identification sequence in the network is used, it consists of zeros, i.e, $TxID_0 = \{0, \ldots, 0\}$.

Figures 41, 42:
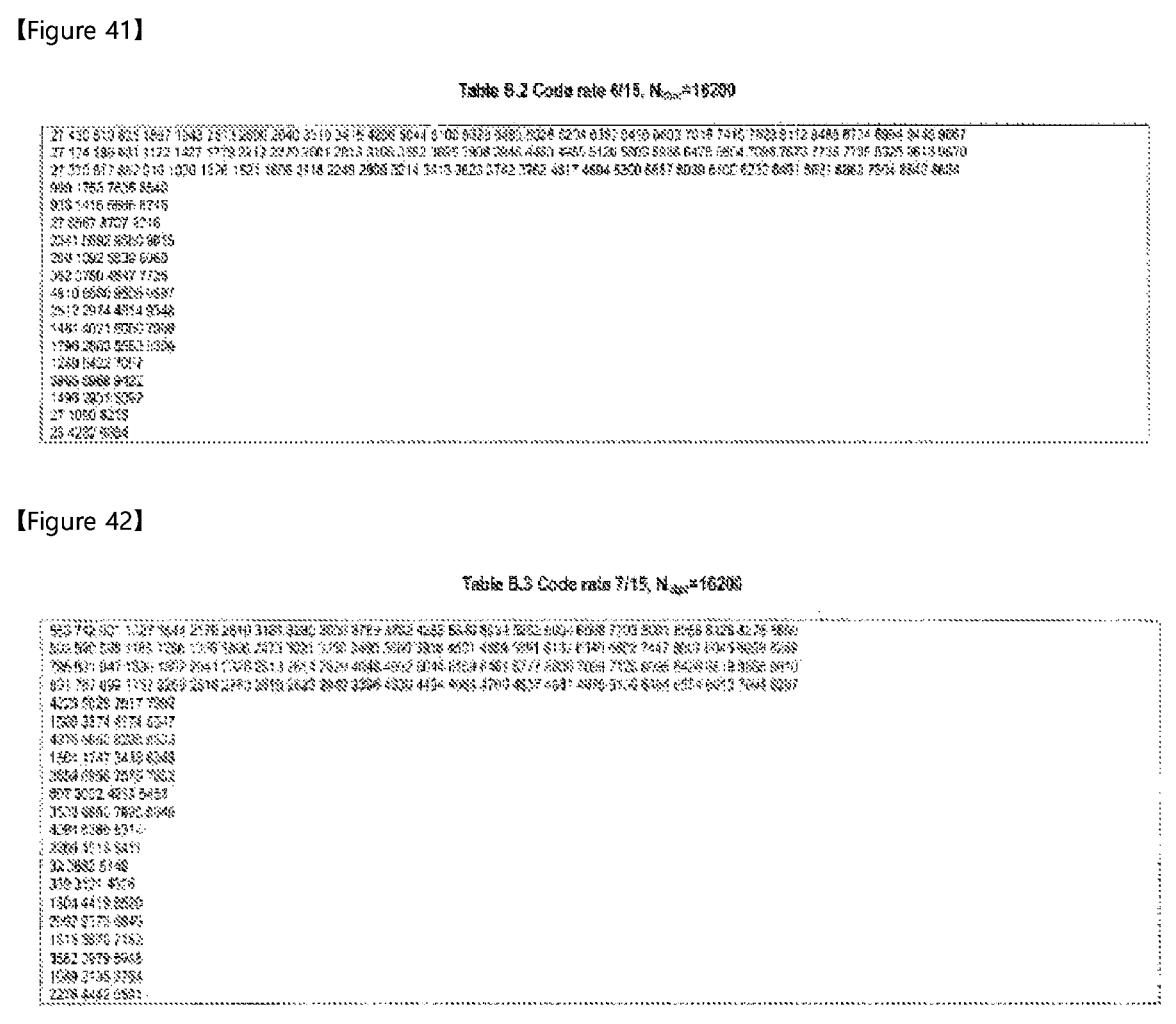

FIG. 41 is a table showing addresses of parity check matrix according to another embodiment of the present invention.

The table shown in FIG. 41 represents a parity check matrix (or matrix H) having a length of the codeword is 16200 bits and a code rate of the codeword is 6/15, The details of the table are equal to the details described in FIG. 29.

FIG. 42 is a table showing addresses of parity check matrix according to another embodiment of the present invention.

The table shown in FIG. 42 represents a parity check matrix (or matrix H) having a length of the codeword is 16200 bits and a code rate of the codeword is 7/15, The details of the table are equal to the details described in FIG. 29.

FIG. 43 is a table showing addresses of parity check matrix according to another embodiment of the present invention.

The table shown in FIG. 43 represents a parity check matrix (or matrix H) having a length of the codeword is 16200 bits and a code rate of the codeword is 9/15, The details of the table are equal to the details described in FIG. 29.

FIG. 44 is a table showing addresses of parity check matrix according to another embodiment of the present invention.

The table shown in FIG. 44 represents a parity check matrix (or matrix H) having a length of the codeword is 16200 bits and a code rate of the codeword is 11/15, The details of the table are equal to the details described in FIG. 29.

Figure 45:
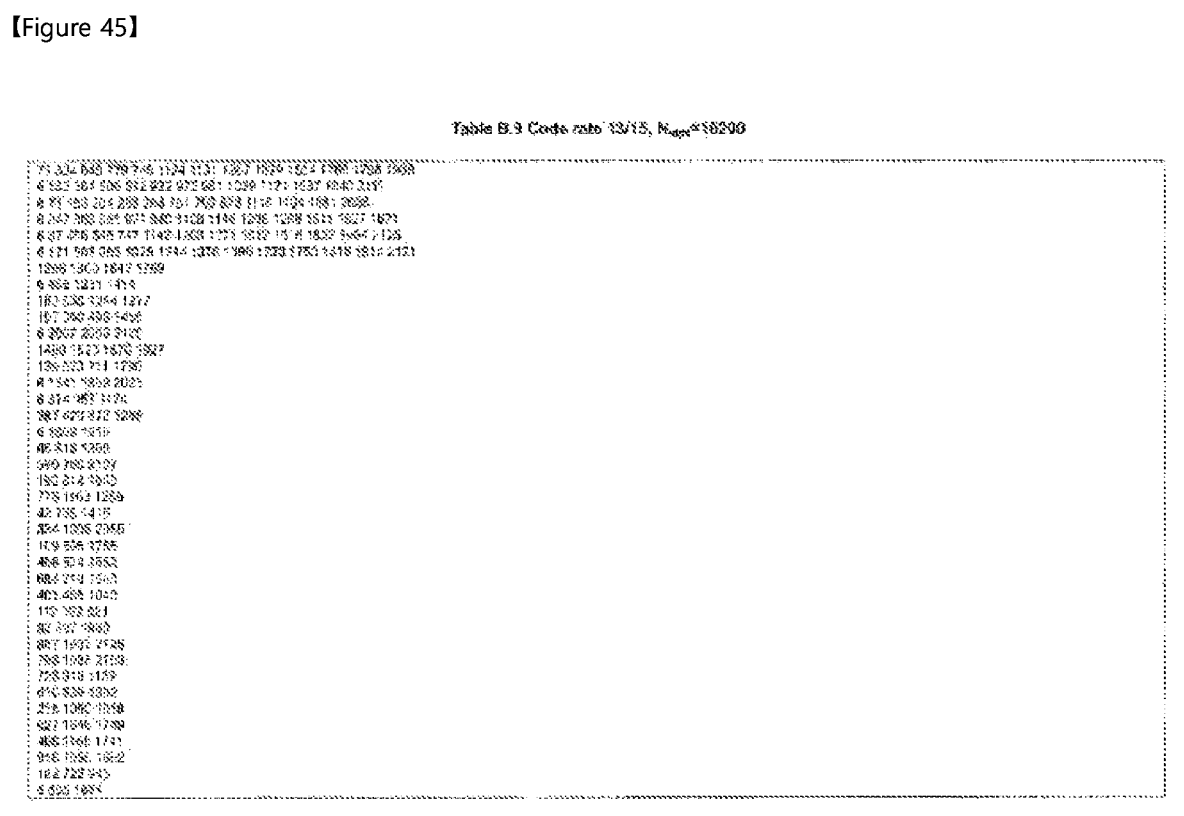

FIG. 45 is a table showing addresses of parity check matrix according to another embodiment of the present invention.

The table shown in FIG. 45 represents a parity check matrix (or matrix H) having a length of the codeword is 16200 bits and a code rate of the codeword is 13/15, The details of the table are equal to the details described in FIG. 29.

Figure 46:
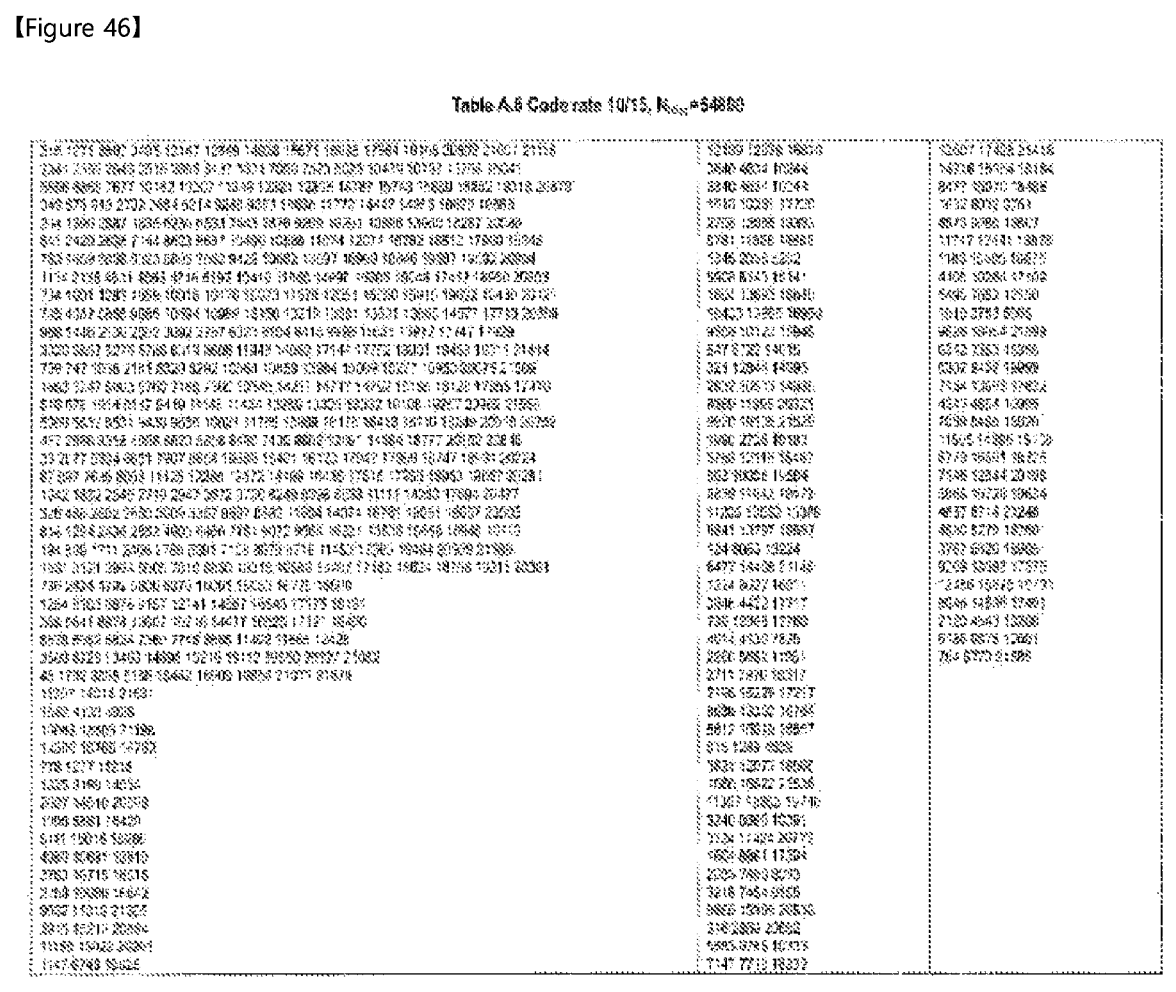

FIG. 46 is a table showing addresses of parity check matrix according to another embodiment of the present invention.

The table shown in FIG. 46 represents a parity check matrix (or matrix H) having a length of the codeword is 64800 bits and a code rate of the codeword is 10/15, The details of the table are equal to the details described in FIG. 29.

FIG. 47 is a block diagram of the demapping and decoding of the receiver according to another embodiments of the present invention.

A FEC decoder (LDPC/BCH) corrects an error generated on a transmission channel by performing LDPC decoding and BCH decoding. This block may be omitted or replaced by a block having a similar or equal function.

FIG. 48 is a waveform generation block according to another embodiments of the present invention.

An inverse waveform transform block transforms an input signal in consideration of transmission channel characteristics and system architecture such that transmission such that transmission efficiency and flexibility are improved. In the case of OFDM system, a frequency domain signal may be transformed into a time domain signal using inverse FFT operation. The inverse waveform transform block may not be used in a single carrier system, for example. This block may be omitted or replaced by a block having a similar or equal function.

It will be appreciated by those skilled in the art that various modifications and variations can be made in the present invention without departing from the spirit or scope of the inventions. Thus, it is intended that the present invention covers the modifications and variations of this invention provided they come within the scope of the appended claims and their equivalents.

Both apparatus and method inventions are mentioned in this specification and descriptions of both of the apparatus and method inventions may be complementarily applicable to each other.

MODE FOR INVENTION

Various embodiments have been described in the best mode for carrying out the invention.

INDUSTRIAL APPLICABILITY

The present invention is available in a series of broadcast signal provision fields.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

The invention claimed is:

1. An apparatus for receiving broadcast signals, the apparatus including:
  a receiver configured to receive the broadcast signals;
  a demodulator configured to demodulate the received broadcast signals including service data by an Orthogonal Frequency Division Multiplexing (OFDM) scheme; and
  a Low-Density Parity Check (LDPC) decoder configured to LDPC decode service data encoded based on a matrix,
  wherein the service data is a codeword having information bits and parity bits,
  when a length of the codeword is 64800 bits and a code rate of the codeword is 10/15,
  the matrix is based on following values:

```
316 1271 3682 9498 12147 12649 14928 16671 18938 17364 19168 20502 21097 21115    12139 12939 13570    12807 17428 21418
2341 2559 2643 2816 2865 5137 5351 7000 7523 8023 10439 10797 13208 15041          3346 4634 10244      14216 18954 18164
5556 5558 7677 10162 10207 11349 12321 12348 14787 15743 15859 15952 19313 20879  3840 4634 10244      8477 15070 38488
349 573 910 3702 364 6214 9286 9053 10638 11772 14447 14953 16626 13888            1318 10231 17723     1632 8032 9781
204 1390 2887 3835 6230 8533 7448 7876 9299 10291 10896 13968 18287 20086          2708 13055 13393     4573 9080 13607
541 2420 2838 7144 3523 8037 10490 10535 11074 12074 15702 18812 17900 18548       5781 11588 18888     11747 12441 13876
733 1659 3838 5323 5805 7882 9429 10682 13697 16909 12848 19587 19592 20904        1345 2038 5252       1183 15805 16675
1134 2135 4631 4663 4718 5197 10410 11660 14996 15385 16048 17487 18980 20303      5908 8143 15141      4405 16284 17109
734 1001 1283 4950 10918 10178 10973 11578 12051 15550 15915 19022 19430 20521     1004 13093 18640     5490 7682 12180
745 4067 5855 9885 10895 10989 13156 13210 13351 13631 13685 14577 17713 20386     10433 13955 16950    1010 3763 5955
968 1446 2130 2582 3093 3787 5325 8104 8418 9998 11681 13972 17747 17929           9508 10122 15945     9528 18054 21599
3620 3857 5275 5786 8318 8608 11943 14062 17144 17762 18001 18453 19211 21414      547 8722 14015       8342 7353 15358
709 747 1038 2181 5320 8292 10684 10859 13964 16009 15277 16953 20678 21509        321 12844 14095      8362 9462 19999
1663 3247 5303 5789 7168 7366 10346 14211 14717 14792 15155 16128 17365 17970      2532 10513 14936     7984 13693 17622
516578 1914 6147 9419 11148 11434 13280 18328 13332 18106 19257 20962 21656        6306 11995 20321     4343 4554 10995
5009 5532 6531 9430 9886 10621 11765 13969 18178 16413 18110 20218 20759           9920 19136 21529     7099 8466 18520
467 2886 3316 4688 5620 8258 6400 7430 9602 12691 14664 18777 20152 29848          1990 2728 10183      11508 14398 15138
33 2877 5334 5657 7907 8854 10606 15401 16123 17942 17959 18747 19931 30234        5763 12118 15467     8779 18591 18726
87 897 7936 8993 11426 12288 12672 14199 18435 17615 17950 18953 13667 23291       603 10036 19664      7146 12544 20196
1042 1832 2545 2719 2947 3672 3700 6249 9398 9833 11114 14283 17694 29477          9839 11942 19472     5865 18728 19634
326 488 2562 2866 3309 5367 6567 3882 11864 14374 18781 19051 19657 20608          11205 13552 15389    4657 8714 21248
864 1264 2436 2852 4993 6466 7761 9072 9564 10321 13638 15658 16346 19119          8841 13797 19697     4680 5279 15750
194 895 1711 2408 2786 5391 7108 8079 8716 51453 17303 19484 20989 21389           124 6653 18224       3767 5520 19805
1831 3121 3994 5005 7810 8850 10315 10589 13407 17162 15624 18758 19213 20301      6477 14406 21146     9209 13003 17575
736 2424 4792 5600 5370 10061 16053 16776 15600                                    1224 8027 16011      12486 15875 19791
1254 8163 8876 9157 12141 14537 18548 17178 18191                                  3046 4422 7835       8046 14036 17491
398 6641 6974 10607 10716 14477 15825 17191 16400                                  739 12308 17760      2120 4843 13208
5578 6802 6824 7260 7748 8655 51402 11683 12428                                    4014 4130 7635       6185 9875 12601
3603 8729 13463 14698 18210 19312 19550 20727 21062                                2266 5652 11981      784 5770 21585.
48 1732 3805 5158 15442 16909 19854 21071 21879                                    2711 7970 16317
11707 14014 21835                                                                  2196 15229 17217
1642 4173 4925                                                                     8636 13302 16764
13083 13505 21198                                                                  5612 16010 16657
14300 15785 15752                                                                  615 1249 4639
778 1237 11218                                                                     3321 12073 18508
1325 3199 14634                                                                    1066 16522 21536
2007 14510 20599                                                                   11307 18363 21536
1998 5881 36429                                                                    3240 8560 10391
5111 15018 15980                                                                   3124 11424 20779
4889 19881 12810                                                                   1604 8061 17394
3763 18715 18515                                                                   2083 7400 8093
```

-continued

| | |
|---|---|
| 2259 18080 15542 | 3218 7454 9155 |
| 9032 11019 21305 | 9355 15995 20852 |
| 3915 15213 20884 | 316 2850 20852 |
| 11180 15022 20201 | 5583 9768 10333 |
| 1147 8749 19625 | 7147 7746 18338 |

2. An apparatus for receiving broadcast signals, the apparatus including:
a receiver configured to receive the broadcast signals;
a demodulator configured to demodulate the received broadcast signals including service data by an Orthogonal Frequency Division Multiplexing (OFDM) scheme; and
a Low-Density Parity Check (LDPC) decoder configured to LDPC decode service data based on a matrix,
wherein the service data is a codeword having information bits and parity bits,
when a length of the codeword is 64800 bits and a code rate of the codeword is 10/15,
the matrix is determined based on following values:

316 1271 3682 9498 12147 12649 14928 16671 18938 17364 19168 20502 21097 21115
2341 2559 2643 2816 2865 5137 5351 7000 7523 8023 10439 10797 13208 15041
5556 5558 7677 10162 10207 11349 12321 12348 14787 15743 15859 15952 19313 20879
349 573 910 3702 364 6214 9286 9053 10638 11772 14447 14953 16626 13888
204 1390 2887 3835 6230 8533 7448 7876 9299 10291 10896 13968 18287 20086
541 2420 2838 7144 3523 8037 10490 10535 11074 12074 15702 18812 17900 18548
733 1659 3838 5323 5805 7882 9429 10682 13697 16909 12848 19587 19592 20904
1134 2135 4631 4663 4718 5197 10410 11660 14996 15385 16408 17487 18980 20303
734 1001 1283 4950 10918 10178 10973 11578 12051 15550 15915 19022 19430 20521
745 4067 5855 9885 10895 10989 13156 13210 13351 13631 13685 14577 17713 20386
968 1446 2130 2582 3093 3787 5325 8104 8418 9998 11681 13972 17747 17929
3620 3857 5275 5786 8318 8608 11943 14062 17144 17762 18001 18453 19211 21414
709 747 1038 2181 5320 8292 10684 10859 13964 16009 15277 16953 20678 21509
1663 3247 5303 5789 7168 7366 10346 14211 14717 14792 15155 16128 17365 17970
516578 1914 6147 9419 11148 11434 13280 18328 13332 18106 19257 20962 21656
5009 5532 6531 9430 9886 10621 11765 13969 18178 16413 18110 10249 20816 20759
467 2886 3316 4688 5620 8258 6400 7430 9602 12691 14664 18777 20152 29848
33 2877 5334 5657 7907 8854 10606 15401 16123 17942 17959 18747 19931 30234
87 897 7936 8993 11426 12288 12672 14199 18435 17615 17950 18953 13667 23291
1042 1832 2545 2719 2947 3672 3700 6249 9398 9833 11114 14283 17694 29477
326 488 2562 2866 3309 5367 6567 3882 11864 14374 18781 19051 19657 20608
864 1264 2436 2852 4993 6466 7761 9072 9564 10321 13638 15658 16346 19119
194 895 1711 2408 2786 5391 7108 8079 8716 51453 17303 19484 20989 21389
1831 3121 3994 5005 7810 8850 10315 10589 13407 17162 15624 18758 19213 20301
736 2424 4792 5600 5370 10061 16053 16776 15600
1254 8163 8876 9157 12141 14537 18548 17178 18191
398 6641 6974 10607 10716 14477 15825 17191 16400
5578 6802 6824 7260 7748 8655 51402 11683 12428
3603 8729 13463 14698 18210 19312 19550 20727 21062
48 1732 3805 5158 15442 16909 19854 21071 21879
11707 14014 21835
1642 4173 4925
13083 13505 21198
14300 15785 15752
778 1237 11218
1325 3199 14634
2007 14510 20599
1998 5881 36429
5111 15018 15980
4889 19881 12810
3763 18715 18515
2259 18080 15542
9032 11019 21305
3915 15213 20884
11180 15022 20201
1147 8749 19625
12139 12939 13570
3346 4634 10244
3840 4634 10244
1318 10231 17723
2708 13055 13393
5781 11588 18888
1345 2038 5252
5908 8143 15141
1004 13093 18640
10433 13955 16950
9508 10122 15945
547 8722 14015
321 12844 14095
2532 10513 14936
6306 11995 20321
9920 19136 21529
1990 2728 10183
5763 12118 15467
603 10036 19664
9839 11942 19472
11205 13552 15389
8841 13797 19697
124 6653 18224
6477 14406 21146
1224 8027 16011
3046 4422 7835
739 12308 17760
4014 4130 7635
2266 5652 11981
2711 7970 16317
2196 15229 17217
8636 13302 16764
5612 16010 16657
615 1249 4639
3321 12073 18508
1066 16522 21536
11307 18363 21536
3240 8560 10391
3124 11424 20779
1604 8061 17394
2083 7400 8093
3218 7454 9155
9355 15995 20852
316 2850 20852
5583 9768 10333
7147 7746 18338
12807 17428 21418
14216 18954 18164
8477 15070 38488
1632 8032 9781
4573 9080 13607
11747 12441 13876
1183 15805 16675
4405 16284 17109
5490 7682 12180
1010 3763 5955
9528 18054 21599
8342 7353 15358
8362 9462 19999
7984 13693 17622
4343 4554 10995
7099 8466 18520
11508 14398 15138
8779 18591 18726
7146 12544 20196
5865 18728 19634
4657 8714 21248
4680 5279 15750
3767 5520 19805
9209 13003 17575
12486 15875 19791
8046 14036 17491
2120 4843 13208
6185 9875 12601
784 5770 21585.

3. An apparatus for receiving broadcast signals, the apparatus including:
a receiver configured to receive the broadcast signals;
a demodulator configured to demodulate the received broadcast signals including service data by an Orthogonal Frequency Division Multiplexing (OFDM) scheme;
a time deinterleaver configured to time deinterleave the service data; and
a Low-Density Parity Check (LDPC) decoder configured to LDPC decode service data based on a matrix,
wherein the service data is a codeword having information bits and parity bits,
when a length of the codeword is 64800 bits and a code rate of the codeword is 10/15,
the matrix is based on following values:

316 1271 3682 9498 12147 12649 14928 16671 18938 17364 19168 20502 21097 21115
2341 2559 2643 2816 2865 5137 5351 7000 7523 8023 10439 10797 13208 15041
5556 5558 7677 10162 10207 11349 12321 12348 14787 15743 15859 15952 19313 20879
349 573 910 3702 364 6214 9286 9053 10638 11772 14447 14953 16626 13888
204 1390 2887 3835 6230 8533 7448 7876 9299 10291 10896 13968 18287 20086
541 2420 2838 7144 3523 8037 10490 10535 11074 12074 15702 18812 17900 18548
733 1659 3838 5323 5805 7882 9429 10682 13697 16909 12848 19587 19592 20904
1134 2135 4631 4663 4718 5197 10410 11660 14996 15385 16048 17487 18980 20303
734 1001 1283 4950 10918 10178 10973 11578 12051 15550 15915 19022 19430 20521
745 4067 5855 9885 10895 10989 13156 13210 13351 13631 14577 17713 20386
968 1446 2130 2582 3093 3787 5325 8104 8418 9998 11681 13972 17747 17929
3620 3857 5275 5786 8318 8608 11943 14062 17144 17762 18001 18453 19211 21414
709 747 1038 2181 5320 8292 10684 10859 13964 16009 15277 16953 20678 21509
1663 3247 5303 5789 7168 7366 10346 14211 14717 14792 15155 16218 17365 17970
516578 1914 6147 9419 11148 11434 13280 18328 13332 18106 19257 20962 21656
5009 5532 6531 9430 9886 10621 11765 13969 18178 16413 18110 10249 20816 20759
467 2886 3316 4688 5620 8258 6400 7430 9602 12691 14664 18777 20152 29848
33 2877 5334 5657 7907 8854 10606 15401 16123 17942 17959 18747 19931 30234
87 897 7936 8993 11426 12288 12672 14199 18435 17615 17950 18953 13667 23291
1042 1832 2545 2719 2947 3672 3700 6249 9398 9833 11114 14283 17694 29477
326 488 2562 2866 3309 5367 6567 3882 11864 14374 18781 19051 19657 20608
864 1264 2436 2852 4993 6466 7761 9072 9564 10321 13638 15658 16346 19119
194 895 1711 2408 2786 5391 7108 8079 8716 51453 17303 19484 20989 21389
1831 3121 3994 5005 7810 8850 10315 10589 13407 17162 15624 18758 19213 20301
736 2424 4792 5600 5370 10061 16053 16776 15600
1254 8163 8876 9157 12141 14537 18548 17178 18191
398 6641 6974 10607 10716 14477 15825 17191 16400
5578 6802 6824 7260 7748 8655 51402 11683 12428
3603 8729 13463 14698 18210 19312 19550 20727 21062
48 1732 3805 5158 15442 16909 19854 21071 21879
11707 14014 21835
1642 4173 4925
13083 13505 21198
14300 15785 15752
778 1237 11218
1325 3199 14634
2007 14510 20599
1998 5881 36429
5111 15018 15980
4889 19881 12810
3763 18715 18515
2259 18080 15542
9032 11019 21305
3915 15213 20884
11180 15022 20201
1147 8749 19625

12139 12939 13570
3346 4634 10244
3840 4634 10244
1318 10231 17723
2708 13055 13393
5781 11588 18888
1345 2038 5252
5908 8143 15141
1004 13093 18640
10433 13955 16950
9508 10122 15945
547 8722 14015
321 12844 14095
2532 10513 14936
6306 11995 20321
9920 19136 21529
1990 2728 10183
5763 12118 15467
603 10036 19664
9839 11942 19472
11205 13552 15389
8841 13797 19697
124 6653 18224
6477 14406 21146
1224 8027 16011
3046 4422 7835
739 12308 17760
4014 4130 7635
2266 5652 11981
2711 7970 16317
2196 15229 17217
8636 13302 16764
5612 16010 16657
615 1249 4639
3321 12073 18508
1066 16522 21536
11307 18363 21536
3240 8560 10391
3124 11424 20779
1604 8061 17394
2083 7400 8093
3218 7454 9155
9355 15995 20852
316 2850 20852
5583 9768 10333
7147 7746 18338

12807 17428 21418
14216 18954 18164
8477 15070 38488
1632 8032 9781
4573 9080 13607
11747 12441 13876
1183 15805 16675
4405 16284 17109
5490 7682 12180
1010 3763 5955
9528 18054 21599
8342 7353 15358
8362 9462 19999
7984 13693 17622
4343 4554 10995
7099 8466 18520
11508 14398 15138
8779 18591 18726
7146 12544 20196
5865 18728 19634
4657 8714 21248
4680 5279 15750
3767 5520 19805
9209 13003 17575
12486 15875 19791
8046 14036 17491
2120 4843 13208
6185 9875 12601
784 5770 21585.

* * * * *